(12) United States Patent
Momose et al.

(10) Patent No.: US 8,580,481 B2
(45) Date of Patent: *Nov. 12, 2013

(54) RESIST POLYMER AND RESIST COMPOSITION

(75) Inventors: Hikaru Momose, Kanagawa (JP);
Atsushi Ootake, Kanagawa (JP);
Akifumi Ueda, Kanagawa (JP);
Tadayuki Fujiwara, Tokyo (JP);
Masaru Takeshita, Kanagawa (JP);
Ryotaro Hayashi, Kanagawa (JP);
Takeshi Iwai, Kanagawa (JP)

(73) Assignee: Mitsubishi Rayon Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/242,879

(22) Filed: Sep. 23, 2011

(65) Prior Publication Data
US 2012/0034561 A1    Feb. 9, 2012

Related U.S. Application Data

(63) Continuation of application No. 12/496,232, filed on Jul. 1, 2009, now Pat. No. 8,092,979, which is a continuation of application No. 10/543,914, filed as application No. PCT/JP2004/000813 on Jan. 29, 2004, now Pat. No. 7,575,846.

(30) Foreign Application Priority Data

Jan. 31, 2003  (JP) ................................. 2003-024238
May 14, 2003  (JP) ................................. 2003-136303
Oct. 2, 2003   (JP) ................................. 2003-344750
Dec. 1, 2003   (JP) ................................. 2003-401988

(51) Int. Cl.
*G03F 7/039*   (2006.01)
*G03F 7/20*    (2006.01)
*G03F 7/30*    (2006.01)

(52) U.S. Cl.
USPC ........ 430/270.1; 430/910; 430/311; 430/326; 430/942; 526/298; 526/266; 526/270; 526/282; 526/328.5

(58) Field of Classification Search
None
See application file for complete search history.

(56) References Cited

U.S. PATENT DOCUMENTS

| | | | |
|---|---|---|---|
| 8,049,042 B2 | 11/2011 | Momose et al. | |
| 2002/0058202 A1* | 5/2002 | Maemori et al. | 430/270.1 |
| 2002/0102492 A1* | 8/2002 | Iwai et al. | 430/270.1 |
| 2002/0155383 A1 | 10/2002 | Fujimori et al. | |
| 2003/0097008 A1* | 5/2003 | Maeda et al. | 549/302 |
| 2004/0146802 A1* | 7/2004 | Yamamoto et al. | 430/270.1 |
| 2007/0190449 A1 | 8/2007 | Momose et al. | |
| 2011/0144295 A1 | 6/2011 | Momose et al. | |

FOREIGN PATENT DOCUMENTS

JP    2003-122007    *    4/2003

OTHER PUBLICATIONS

Machine-assisted English translation of JP2003-122007 as provided by JPO (2003).*

* cited by examiner

*Primary Examiner* — Sin J. Lee
(74) *Attorney, Agent, or Firm* — Oblon, Spivak, McClelland, Maier & Neustadt, L.L.P.

(57) ABSTRACT

The resist polymer of the present invention comprises a specific constitutional unit having a cyano group, a constitutional unit having an acid-dissociable group, and a specific constitutional unit having a lactone skeleton. When the above polymer is used as a resist resin in DUV excimer laser lithography or electron beam lithography, it exhibits high sensitivity and high resolution, and provides a good resist pattern shape, having a small degree of occurrence of line edge roughness or generation of microgels.

47 Claims, No Drawings

RESIST POLYMER AND RESIST COMPOSITION

CROSS REFERENCE TO RELATED APPLICATION

This application is a continuation application of prior U.S. patent application Ser. No. 12/496,232, files Jul. 1, 2009, the disclosure of which is incorporated herein by reference in its entirety. The parent application is a continuation application of prior U.S. patent application Ser. No. 10/543,914, filed Jul. 29, 2005, which is the National Stage of PCT/JP04/00813, filed Jan. 29, 2004, the disclosures of which are incorporated herein by reference in their entireties. The parent application claims priority to Japanese Application No. 2003-024238, filed Jan. 31, 2003, No. 2003-136303, filed May 14, 2003, No. 2003-344750, filed Oct. 2, 2003, and No. 2003-401988, filed Dec. 1, 2003, the disclosures of which are incorporated herein by reference in their entireties.

TECHNICAL FIELD

The present invention relates to a resist polymer and a resist composition. In particular, the present invention relates to a chemically amplified resist composition, which is preferably used in fine processing using an excimer laser or electron beam.

BACKGROUND ART

In recent years, a minimization has quickly progressed as a result of the development of lithographic techniques in the field of fine processing for production of semiconductor devices or liquid crystal devices. As such means for the minimization, the wavelength of an irradiation light has generally been shortened. Specifically, such an irradiation light has been changed from the conventional ultraviolet ray including g-line (wavelength: 438 nm) and i-line (wavelength: 365 nm) as typical examples, to DUV (deep ultra violet).

Presently, a KrF excimer laser (wavelength: 248 nm) lithographic technique has been introduced into the market, and an ArF excimer laser (wavelength: 193 nm) lithographic technique, which is directed towards the further shortening wavelength of an irradiation light, is being introduced. Moreover, an $F_2$ excimer laser (wavelength: 157 nm) lithographic technique is being studied as a technique for the next generation. Furthermore, an electron beam lithographic technique, which somewhat differs from the above techniques, is also intensively being studied.

As a resist with high resolution for such an irradiation light with a short wavelength or electron beam, a "chemically amplified resist" containing a photoacid generator has been proposed. At present, the improvement and development of this chemically amplified resist have vigorously been progressing.

In accordance with the shortening wavelength of an irradiation light, the structure of a resin used for resists has also changed. For example, in the KrF excimer laser lithography, polyhydroxystyrene having high transparency to an irradiation light with a wavelength of 248 nm or modified resins in which hydroxyl groups in polyhydroxystyrene are protected with an acid-dissociable solubility-inhibiting group are used. However, in the ArF excimer laser lithography, the above resins cannot always be used because their transparency is insufficient to the laser with a wavelength of 193 nm.

Accordingly, as a resist resin used in the ArF excimer laser lithography, an acrylic resin that is transparent to a laser with a wavelength of 193 nm has become a focus of attention. As such an acrylic resin, a copolymer of (meth)acrylic acid ester having an adamantane skeleton at an ester moiety thereof and (meth)acrylic acid ester having a lactone skeleton at an ester moiety thereof is disclosed in Japanese Patent Laid-Open Nos. 10-319595, 10-274852, or the like.

However, when these acrylic resins are used as resist resins, resist patterns to be formed are not necessarily favorable. Thus, the cross section of a resist pattern shape formed by using such an acrylic resin becomes a convex or concave form and therefore, precise lithography onto a substrate to be processed cannot be performed in some cases. Moreover, when the resin contained in a resist composition condenses with time, the insoluble matter called a microgel generates. Thus, voids generate in a resist pattern, and as a result, disconnection or defect may occur in a circuit.

Recently, in the production of semiconductor devices, the diameter of a substrate has grown from 200 mm to 300 mm. However, in the case of using such a large substrate, the size of a resist pattern to be formed is likely to vary.

In the production line of semiconductor elements, baking such as PEB (post exposure baking) is carried out. A difference (approximately several degrees (° C.)) in the heat treatment temperature (PEB temperature) may be generated among baking units (baking devices). As a result, there are some cases where, due to such a difference in the temperature, the size of a resist pattern to be formed is different depending on a baking unit that is used. Accordingly, a resist pattern that does not significantly depend on the PEB temperature has been desired.

On the other hand, a chemically amplified resist composition, which comprises a resin containing a constitutional unit having a cyano group, is disclosed in Japanese Patent Laid-Open Nos. 2002-244295, 2000-258915, 2002-268222, and 2001-264982, for example. Japanese Patent Laid-Open No. 2002-244295 describes a cyano group as a substituent of an alicyclic hydrocarbon group contained in a group that is dissociated by the action of acid contained in a resin (acid-dissociable group). Japanese Patent Laid-Open No. 2000-258915 describes that a cyano group having polymerization unit maintains its adhesiveness to a substrate due to the presence of a cyano group as a polar substituent, thereby contributing to the improvement of the dry etching resistance of a resist. Japanese Patent Laid-Open No. 2002-268222 describes that the use of a resin containing a specific constitutional unit having a cyano group enables the improvement of line edge roughness. Japanese Patent Laid-Open No. 2001-264982 describes that the use of a resin containing a specific constitutional unit having a cyano group enables the improvement of transparency to 157 nm that is an $F_2$ excimer laser wavelength.

However, resist compositions, which comprise the resins containing a constitutional unit having a cyano group described in the aforementioned publications, cannot sufficiently inhibit roughness on the side wall of a resist pattern that is generated as a result of the patterning with an excimer laser and the subsequent processing procedure, that is, the generation of line edge roughness. Accordingly, in order to achieve further line slimming, a circuit width might become uneven or the circuit might be broken down, and there may be a risk of resulting in decrease in a yield during the production process of semiconductors.

As an acrylic monomer that will be a material for a polymer that is useful as an optical material having excellent optical properties, low hygroscopicity, and heat resistance, Japanese Patent Laid-Open No. 1-100145 discloses an ester derivative of a (meth)acrylic acid having an alicyclic skeleton with a cyano group as a substituent. In addition, Japanese Patent Laid-Open No. 1-100145 describes that the above ester derivative of a (meth)acrylic acid can be used singly or in the form of a copolymer of itself and other unsaturated compounds such as (meth)acrylic acid or an ester thereof.

Moreover, Japanese Patent Laid-Open No. 2-193958 discloses a methacrylic acid ester having an alicyclic skeleton with a cyano group as a substituent. Japanese Patent Laid-Open No. 2-189313 discloses a thermoplastic resin formed by polymerization of a monomer composition containing a methacrylic acid ester that includes those described in the aforementioned Japanese Patent Laid-Open No. 2-193958, or a monomer composition containing a methacrylic acid ester and (meth)acrylic acid ester that includes those described in the aforementioned Japanese Patent Laid-Open No. 2-193958. Moreover, Japanese Patent Laid-Open No. 2-189313 describes that the above thermoplastic resin is excellent in terms of heat resistance, transparency and anti-hygroscopicity, and is useful for an adhesive, a paint, a fiber-treating agent, a mold-releasing agent, a resin-modifier, a selectively permeable membrane, etc.

Furthermore, Japanese Patent Laid-Open No. 2-216632 describes that a polymer comprising a constitutional unit having a cyano group is useful for an optical disk substrate. Still further, Japanese Patent Laid-Open No, 2-211401 describes that a polymer comprising a constitutional unit having a cyano group is useful for optical components and optical elements. Still further, Japanese Patent Laid-Open No. 1-92206 describes that a polymer comprising a constitutional unit having a cyano group is useful as a material for an optical disk, plastic lens, or the like.

Still further, U.S. Pat. No. 6,165,678 describes a resist composition, which comprises a (meth)acrylic copolymer comprising a constitutional unit having a group having a polar moiety and a constitutional unit having a group that is dissociated by the action of acid, and a photoacid generator. This publication describes that the above resist composition is excellent in terms of sensitivity and resolution, and thus that it is used in ArF excimer laser (wavelength: 193 nm) lithography or the like. In this publication, examples of a polar moiety (polar group) may include a cyano group and lactone. In addition, the examples section in the aforementioned U.S. Pat. No. 6,165,678 describes a polymer formed by polymerization of pantolactone methacrylate, isobornyl methacrylate, and methacrylic acid (Example 3), a polymer formed by polymerization of 5-(4-)cyano-2-norbornyl methacrylate, 2'-acetoxyethyl methacrylate, 1-butyl methacrylate, and methacrylic acid (Example 4), a polymer formed by polymerization of 5-(4-)cyano-2-norbornyl methacrylate, methacrylonitrile, t-butyl methacrylate, and methacrylic acid (Example 5), and a polymer formed by polymerization of 5-(4-) cyano-2-norbornyl methacrylate, t-butyl methacrylate, and methacrylic acid (Example 6).

However, the aforementioned U.S. Pat. No. 6,165,678 does not describe a resist polymer, which comprises a constitutional unit having a cyano group, a constitutional unit having an acid-dissociable group, and a constitutional unit having a lactone skeleton. With regard to the resist composition described in the example section of the aforementioned U.S. Pat. No. 6,165,678, it cannot necessarily be said that a resist pattern shape to be formed is favorable, and that the occurrence of line edge roughness and generation of microgels are less degree.

Japanese Patent Laid-Open No. 11-352694 discloses a chemically amplified resist material, which comprises: an acid-sensitive polymer, which has a constitutional unit containing an alkali-soluble group protected by a protecting group having a moiety containing at least one nitrile group having self-dissociable ability, wherein the above alkali-soluble group is dissociated due to acid, so as to impart alkali solubility to the above copolymer, a constitutional unit containing an alkali-soluble group protected by a protecting group having alicyclic hydrocarbon, wherein the above alkali-soluble group is dissociated due to acid, so as to impart alkali solubility to the above copolymer, and a constitutional unit containing an alkali-soluble group protected by a protecting group having a lactone structure, wherein the above alkali-soluble group is dissociated due to acid, so as to impart alkali solubility to the above copolymer; and an acid generator. The example section of Japanese Patent Laid-Open No. 11-352694 describes polymers containing 2-methyl-1-propionitrilecyclohexyl methacrylate as a constitutional unit having a cyano group (Examples 4, 5, 6, and 7), and a polymer containing 2-ethyl-1-propionitrilecyclohexyl methacrylate as a constitutional unit having a cyano group (Example 8).

However, the polymers described in the examples in the aforementioned Japanese Patent Laid-Open No. 11-352694 are not necessarily sufficient in terms of the stability of a constitutional unit having a cyano group. Thus, when these polymers are used as resist resins, the physical properties thereof may change in some cases, and it may be difficult to handle such polymers. In addition, the resist composition described in the examples in the aforementioned Japanese Patent Laid-Open No. 11-352694 is not necessarily sufficient in terms of dry etching resistance.

Japanese Patent Laid-Open No. 2003-122007, published on Apr. 25, 2003, discloses a positive-acting resist composition, which comprises a resin containing a constitutional unit having a cyano group, a constitutional unit having an alicyclic lactone structure and a constitutional unit having an alicyclic hydrocarbon group, and a photoacid generator. Japanese Patent Laid-Open No. 2003-122007 describes constitutional units having cyclohexane lactone, norbornane lactone, or adamantane lactone, as constitutional units having an alicyclic lactone structure. More specific examples are given below.

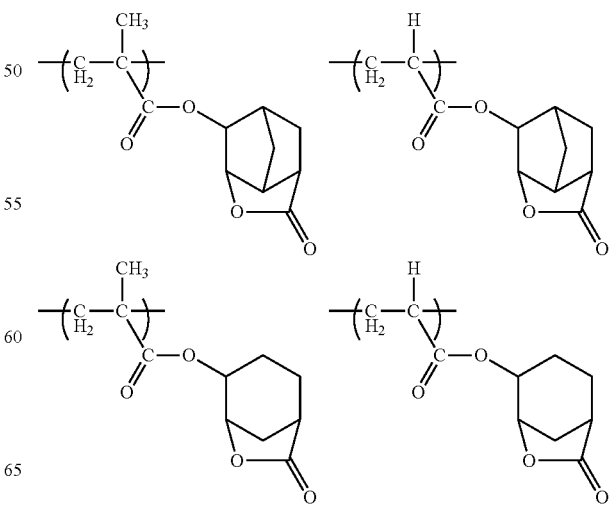

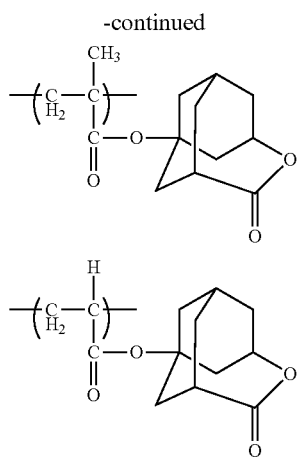

Moreover, the aforementioned Japanese Patent Laid-Open No. 2003-122007 describes that the resin used for the resist composition may also comprise a constitutional unit having a lactone structure. Specific examples of such a constitutional unit having a lactone structure are given below.

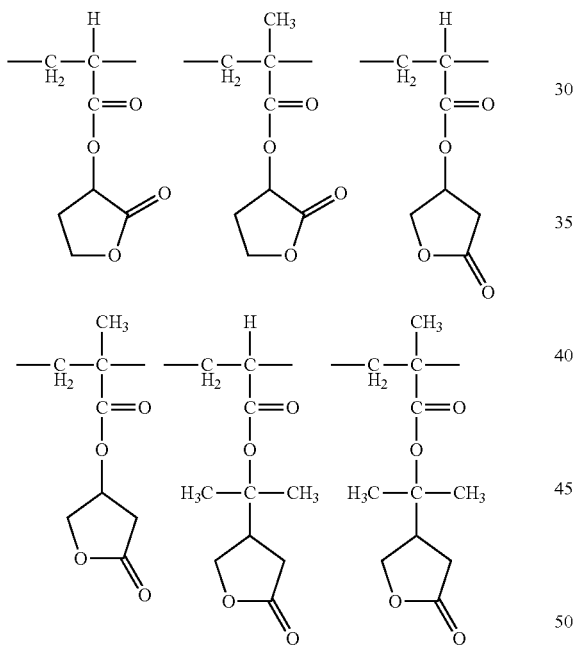

However, the resist composition described in the aforementioned Japanese Patent Laid-Open No. 2003-122007, which comprises a constitutional unit having cyclohexane lactone or norbornane lactone as a constitutional unit having an alicyclic lactone structure, a constitutional unit having a cyano group, and a constitutional unit having an alicyclic hydrocarbon group, is not necessarily sufficiently be favorable in terms of a resist pattern shape formed therefrom. Moreover, a polymer comprising a constitutional unit having adamantane lactone as a constitutional unit having an alicyclic lactone structure, a constitutional unit having a cyano group, and a constitutional unit having an alicyclic hydrocarbon group, is generally expensive, and such a polymer is not always be excellent in terms of solubility in organic solvents.

DISCLOSURE OF THE INVENTION

An object of the present invention is to provide: a resist polymer, which exhibits high sensitivity and high resolution, and can provide a good resist pattern shape, having a small degree of occurrence of line edge roughness or generation of microgels, when it is used as a resist resin in DUV excimer laser lithography or electron beam lithography; a resist composition; and a method of forming a pattern using the above resist composition.

Another object of the present invention is to provide: a resist polymer, which achieves a uniform resist pattern size in plane on a substrate, even when a large substrate with a diameter of 300 mm or greater is used; a resist composition; and a method of forming a pattern using the above resist composition.

The present invention relates to a resist polymer, which comprises a constitutional unit represented by formula (1) indicated below, a constitutional unit having an acid-dissociable group, and a constitutional unit having a lactone skeleton that is represented by at least one selected from the group consisting of formulas (4-1), (4-2), (4-3), (4-5), (4-6), and (4-10) indicated below:

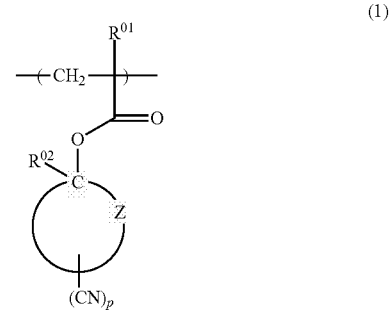

(wherein, in formula (1), $R^{01}$ represents a hydrogen atom or a methyl group; $R^{02}$ represents a hydrogen atom or an alkyl group having 1 to 4 carbon atoms; Z represents an atomic group that constitutes a cyclic hydrocarbon group together with a carbon atom constituting an ester bond and a carbon atom to which cyano group binds; and p represents an integer between 1 and 4, provided that when p is 2 or greater, cyano groups may bind to a single carbon atom or may bind to different carbon atoms,)

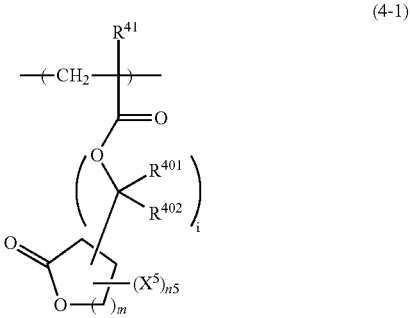

-continued (4-2)
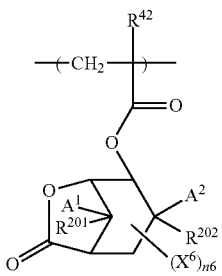

(4-3)
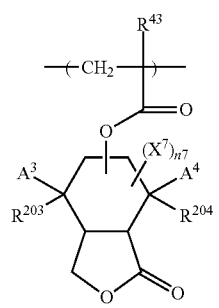

(4-5)
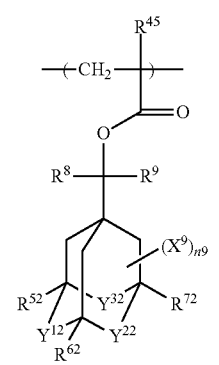

(4-6)
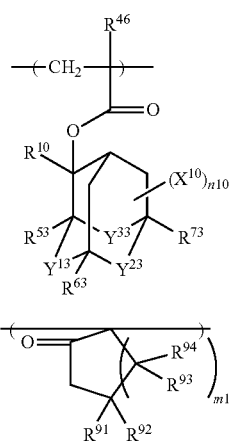

(4-10)

(wherein, in formula (4-1), $R^{41}$ represents a hydrogen atom or a methyl group; each of $R^{401}$ and $R^{402}$ independently represents a hydrogen atom, a linear or branched alkyl group having 1 to 6 carbon atoms, a hydroxy group, a carboxy group, or a carboxy group that is esterified with alcohol having 1 to 6 carbon atoms, or $R^{401}$ and $R^{402}$ together represent —O—, —S—, —NH—, or a methylene chain having 1 to 6 carbon atoms {—(CH$_2$)$_j$— (wherein j represents an integer between 1 and 6)}; i represents 0 or 1; $X^5$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, a cyano group, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n5 represents an integer between 0 and 4, and m represents 1 or 2, provided that when n5 is 2 or greater, $X^5$ may be a plurality of different groups, wherein, in formula (4-2), $R^{42}$ represents a hydrogen atom or a methyl group; each of $R^{201}$ and $R^{202}$ independently represents a hydrogen atom, a linear or branched alkyl group having 1 to 6 carbon atoms, a hydroxy group, a carboxy group, or a carboxy group esterified with alcohol having 1 to 6 carbon atoms; $A^1$ and $A^2$ together represent —O—, —S—, —NH—, or a methylene chain having 1 to 6 carbon atoms {—(CH$_2$)$_k$— (wherein k represents an integer between 1 and 6)}; $X^6$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, a cyano group, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n0 represents an integer between 0 and 4, provided that when n6 is 2 or greater, $X^6$ may be a plurality of different groups, wherein, in formula (4-3), $R^{43}$ represents a hydrogen atom or a methyl group; each of $R^{203}$ and $R^{204}$ independently represents a hydrogen atom, a linear or branched alkyl group having 1 to 6 carbon atoms, a hydroxy group, a carboxy group, or a carboxy group esterified with alcohol having 1 to 6 carbon atoms; each of $A^3$ and $A^4$ independently represents a hydrogen atom, a linear or branched alkyl group having 1 to 6 carbon atoms, a hydroxy group, a carboxy group, or a carboxy group that is esterified with alcohol having 1 to 6 carbon atoms, or $A^3$ and $A^4$ together represent —O—, —S—, —NH—, or a methylene chain having 1 to 6 carbon atoms {—(CH$_2$)$_l$— (wherein l represents an integer between 1 and 6)}; $X^7$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, a cyano group, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n7 represents an integer between 0 and 4, provided that when n7 is 2 or greater, $X^7$ may be a plurality of different groups, wherein, in formula (4-5), $R^{45}$ represents a hydrogen atom or a methyl group; each of $R^8$ and $R^9$ independently represents a hydrogen atom or a linear or branched alkyl group having 1 to 8 carbon atoms; each of $R^{52}$, $R^{62}$ and $R^{72}$ independently represents a hydrogen atom or a methyl group; each of $Y^{12}$, $Y^{22}$, and $Y^{32}$ independently represents —$CH_2$— or —CO—O—, and at least one of them represents —CO—O—; $X^9$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, a cyano group, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n9 represents an integer between 0 and 4, provided that when n9 is 2 or greater, $X^9$ may be a plurality of different groups, wherein, in formula (4-6), $R^{46}$ represents a hydrogen atom or a methyl group; $R^{10}$ represents a hydrogen atom or a linear or branched alkyl group having 1 to 8 carbon atoms; each of $R^{53}$, $R^{63}$, and $R^{73}$ independently represents a hydrogen atom or a methyl group; each of $Y^{13}$, $Y^{23}$, and $Y^{33}$ independently represents —$CH_2$— or —CO—O—, and at least one of them represents —CO—O—; $X^{10}$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, a cyano group, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n10 represents an integer between 0 and 4, provided that when n10 is 2 or greater, $X^{10}$ may be a plurality of different groups, and wherein, in formula (4-10), each of $R^{91}$, $R^{92}$, $R^{93}$, and $R^{94}$ independently represents a hydrogen atom, a linear or branched alkyl group having 1 to 6 carbon atoms, a hydroxy group, a carboxy group, or a carboxy group that is esterified with alcohol having 1 to 6 carbon atoms, or $R^{91}$ and $R^{92}$ together represent —O—, —S—, —NH—, or a methylene chain having 1 to 6 carbon atoms {—$(CH_2)_t$— (wherein t represents an integer between 1 and 6)}; and m1 represents 1 or 2.)

It is to be noted that, in formulas (4-1), (4-2), (4-3), (4-5), and (4-6), positions substituted with $X^5$, $X^6$, $X^7$, $X^9$, and $X^{10}$ may be any positions in the cyclic structures.

In this polymer, constitutional units represented by formula (1) are not necessarily all the same, but may be a mixture of two or more kinds thereof. Also, constitutional units having an acid-dissociable group are not necessarily all the same, but may be a mixture of two or more kinds thereof. Also, constitutional units having a lactone skeleton are not necessarily all the same, but may be a mixture of two or more kinds thereof. That is to say, constitutional units (4-1), (4-2), (4-3), (4-5), (4-6), and (4-10) are not necessarily all the same, respectively, but they may be a mixture of two or more kinds thereof.

In addition, in this polymer, each constitutional unit may have any given sequence. Accordingly, this polymer may be a random copolymer, an alternating copolymer, or a block copolymer.

The present invention relates to the above-described resist polymer, wherein, in the above-described formula (1), $R^{02}$ represents a hydrogen atom.

The present invention relates to the above-described resist polymer, wherein, in the above-described formula (1), Z represents an atomic group that constitutes a bridged cyclic hydrocarbon group together with a carbon atom constituting an ester bond and a carbon atom to which a cyano group binds.

The present invention relates to the above-described resist polymer, wherein, in the above-described formula (1), $R^{02}$ represents a hydrogen atom; Z represents an atomic group that constitutes a bridged cyclic hydrocarbon group together with a carbon atom constituting an ester bond and a carbon atom to which a cyano group binds, and p is 1.

The present invention relates to the above-described resist polymer, wherein the above-described cyclic hydrocarbon group has a skeleton selected from the group consisting of a cyclic terpene hydrocarbon, an adamantane ring, a tetracyclododecane ring, a dicylclopentane ring, and a tricyclodecane ring.

The present invention relates to the above-described resist polymer, wherein the above-described cyclic hydrocarbon group has a norbornane ring.

The present invention relates to the above-described resist polymer, wherein the constitutional unit represented by the above-described formula (1) is a constitutional unit represented by the following formula (2):

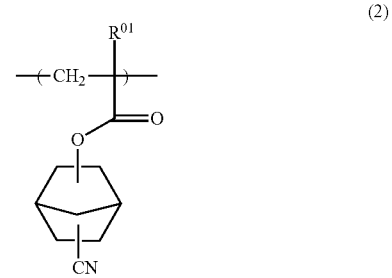

(2)

(wherein, in formula (2), $R^{01}$ represents a hydrogen atom or a methyl group.)

It is to be noted that, in this polymer, the constitutional unit represented by formula (2) is not necessarily all the same, but may be a mixture of two or more kinds thereof.

The present invention relates to the above-described resist polymer, wherein the constitutional unit represented by the above-described formula (1) is a constitutional unit represented by the following formula (1-1):

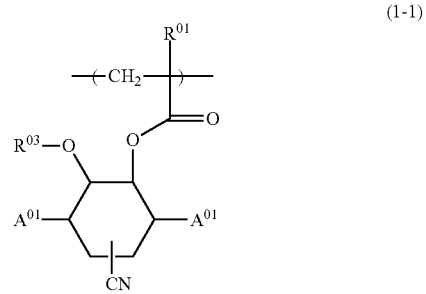

(1-1)

(wherein, in formula (1-1), $R^{01}$ represents a hydrogen atom or a methyl group; $R^{03}$ represents a hydrogen atom or a linear or branched alkyl group having 1 to 6 carbon atoms; and each of $A^{01}$ and $A^{02}$ independently represents a hydrogen atom, or a linear or branched alkyl group having 1 to 4 carbon atoms, or $A^{01}$ and $A^{02}$ together represent —O—, —S—, —NH—, or an alkylene chain having 1 to 6 carbon atoms.)

It is to be noted that, in this polymer, the constitutional unit represented by formula (1-1) is not necessarily all the same, but may be a mixture of two or more kinds thereof.

The present invention relates to the above-described resist polymer, wherein, in the above-described formula (1), p is 1, and a cyano group binds to a carbon atom that is adjacent to the carbon atom constituting an ester bond.

The present invention relates to the above-described resist polymer, wherein the constitutional unit represented by the above-described formula (1) is a constitutional unit represented by the following formula (1-2):

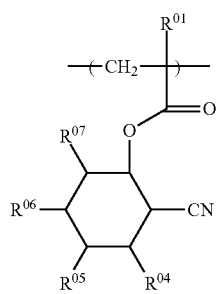

(1-2)

(wherein, in formula (1-2), $R^{01}$ represents a hydrogen atom or a methyl group; each of $R^{04}$, $R^{05}$, $R^{06}$, and $R^{07}$ independently represents a hydrogen atom or a linear or branched alkyl group having 1 to 4 carbon atoms, or two out of $R^{04}$, $R^{05}$, $R^{06}$, and $R^{07}$ together represent an alkylene chain having 1 to 6 carbon atoms.)

It is to be noted that, in this polymer, the constitutional unit represented by formula (1-2) is not necessarily all the same, but may be a mixture of two or more kinds thereof.

The present invention relates to the above-described resist polymer, wherein the above-described constitutional unit having a lactone skeleton is at least one selected from the group consisting of those represented by the above-described formulas (4-1), (4-2), (4-3), and (4-10).

It is to be noted that, in this polymer, constitutional units represented by formulas (4-1), (4-2), (4-3), and (4-10) are not necessarily all the same, respectively, but may be a mixture of two or more kinds thereof.

The present invention relates to the above-described resist polymer, wherein the total ratio of the constitutional unit represented by the above-described formula (1) is between 5% and 30% by mole, the total ratio of the constitutional unit having an acid-dissociable group is between 30% and 60% by mole, and the total ratio of the constitutional unit having a lactone skeleton is between 30% and 60% by mole.

The present invention relates to the above-described resist polymer, wherein the above-described constitutional unit having an acid-dissociable group has an alicyclic skeleton. The term "constitutional unit having an alicyclic skeleton" is used to mean a constitutional unit, which has a structure having one or more cyclic hydrocarbon groups.

The present invention relates to the above-described resist polymer, wherein the above-described constitutional unit having an acid-dissociable group is at least one selected from the group consisting of the following formulas (3-1-1), (3-2-1), and (3-3-1):

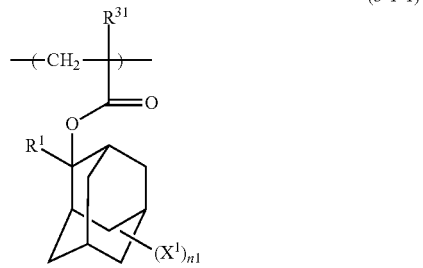

(3-1-1)

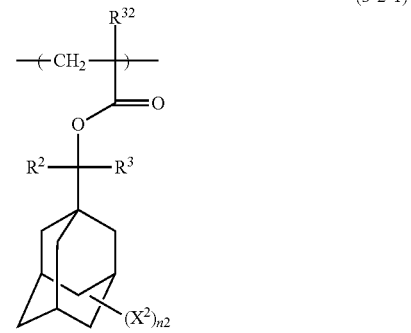

(3-2-1)

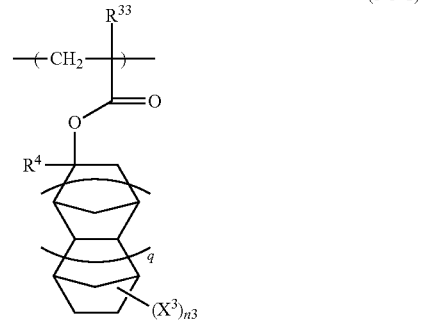

(3-3-1)

(wherein, in formula (3-1-1), $R^{31}$ represents a hydrogen atom or a methyl group; $R^1$ represents an alkyl group having 1 to 3 carbon atoms; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, wherein, in formula (3-2-1), $R^{32}$ represents a hydrogen atom or a methyl group; each of $R^2$ and $R^3$ independently represents an alkyl group having 1 to 3 carbon atoms; $X^2$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n2 represents an integer between 0 and 4, and when n2 is 2 or greater, $X^2$ may be a plurality of different groups, and wherein, in formula (3-3-1), $R^{33}$ represents a hydrogen atom or a methyl group; $R^4$ represents an alkyl group having 1 to 3 carbon atoms; $X^3$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n3 represents an integer between 0 and 4, and q represents 0 or 1, provided that when n3 is 2 or greater, $X^3$ may be a plurality of different groups.)

It is to be noted that, in formulas (3-1-1), (3-2-1), and (3-3-1), positions substituted with $X^1$, $X^2$, and $X^3$ may be any positions in the cyclic structures.

In this polymer, constitutional units represented by formulas (3-1-1), (3-2-1), and (3-3-1) are not necessarily all the same, but may be a mixture of two or more kinds thereof.

The present invention relates to the above-described resist polymer, wherein the above-described constitutional unit having an acid-dissociable group is a constitutional unit represented by the following formula (3-5):

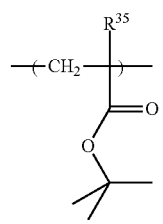

(3-5)

(wherein, in formula (3-5), $R^{35}$ represents a hydrogen atom or a methyl group.)

It is to be noted that, in this polymer, constitutional units represented by formula (3-5) are not necessarily all the same, but may be a mixture of two or more kinds thereof.

The present invention relates to the above-described resist polymer, which comprises at least one constitutional unit represented by the above-described formula (1), at least one constitutional unit selected from the group consisting of those represented by the above-described formulas (3-1-1), (3-2-1), (3-3-1), and (3-5), and at least one constitutional unit selected from the group consisting of those represented by the above-described formulas (4-1), (4-2), (4-3), (4-5), (4-6), and (4-10).

It is to be noted that, in this polymer, constitutional units represented by formula (1), at least one constitutional unit selected from the group consisting of those represented by the above-described formulas (3-1-1), (3-2-1), (3-3-1), and (3-5), and at least one constitutional unit selected from the group consisting of those represented by the above-described formulas (4-1), (4-2), (4-3), (4-5), (4-6), and (4-10), are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The present invention relates to the above-described resist polymer, which comprises at least one constitutional unit represented by the above-described formula (1), at least one constitutional unit selected from the group consisting of those represented by the above-described formulas (3-1-1), (3-2-1), (3-3-1), and (3-5), and at least one constitutional unit selected from the group consisting of those represented by the above-described formulas (4-1), (4-2), (4-3), and (4-10).

It is to be noted that, in this polymer, constitutional units represented by formula (1), at least one constitutional unit selected from the group consisting of those represented by the above-described formulas (3-1-1), (3-2-1), (3-3-1), and (3-5), and at least one constitutional unit selected from the group consisting of those represented by the above-described formulas (4-1), (4-2), (4-3), and (4-10), are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The present invention relates to the above-described resist polymer, which comprises at least one constitutional unit selected from the group consisting of those represented by the above-described formulas (2) and (1-1), at least one constitutional unit selected from the group consisting of those represented by the above-described formulas (3-1-1), (3-3-1), and (3-5), and at least one constitutional unit represented by the following formula (4-7):

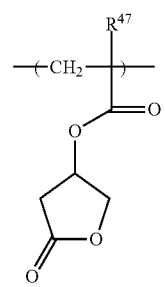

(4-7)

(wherein, in formula (4-7), $R^{47}$ represents a hydrogen atom or a methyl group.)

It is to be noted that, in this polymer, at least one constitutional unit selected from the group consisting of those represented by the above-described formulas (2) and (1-1), at least one constitutional unit selected from the group consisting of those represented by the above-described formulas (3-1-1), (3-3-1), and (3-5), and constitutional units represented by the above-described formula (4-7), are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The present invention relates to the above-described resist polymer, wherein the total ratio of at least one constitutional unit selected from those represented by the above-described formulas (2) and (1-1) is between 5% and 30% by mole, the total ratio of at least one constitutional unit selected from the group consisting of those represented by the above-described formulas (3-1-1), (3-3-1), and (3-5) is between 30% and 60% by mole, and the total ratio of the constitutional unit represented by the above-described formula (4-7) is between 30% and 60% by mole.

The present invention relates to the above-described resist polymer, which comprises at least one constitutional unit selected from the group consisting of those represented by the above-described formulas (2) and (1-1), at least one constitutional unit selected from the group consisting of those represented by the above-described formulas (3-1-1), (3-3-1), and (3-5), and at least one constitutional unit represented by the following formula (4-8):

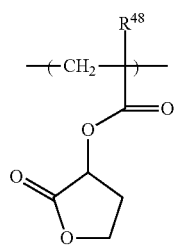

(4-8)

(wherein, in formula (4-8), $R^{48}$ represents a hydrogen atom or a methyl group.)

It is to be noted that, in this polymer, at least one constitutional unit selected from the group consisting of those represented by the above-described formulas (2) and (1-1), at least one constitutional unit selected from the group consisting of those represented by the above-described formulas (3-1-1), (3-3-1), and (3-5), and constitutional units represented by the above-described formula (4-8), are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The present invention relates to the above-described resist polymer, wherein the total ratio of at least one constitutional unit selected from those represented by the above-described formulas (2) and (1-1) is between 5% and 30% by mole, the total ratio of at least one constitutional unit selected from the group consisting of those represented by the above-described formulas (3-1-1), (3-3-1), and (3-5) is between 30% and 60% by mole, and the total ratio of the constitutional unit represented by the above-described formula (4-8) is between 30% and 60% by mole.

The present invention relates to the above-described resist polymer, which comprises at least one constitutional unit selected from the group consisting of those represented by the above-described formulas (2) and (1-1), at least one constitutional unit selected from the group consisting of those represented by the above-described formulas (3-1-1), (3-3-1), and (3-5), and at least one constitutional unit represented by the following formula (4-11):

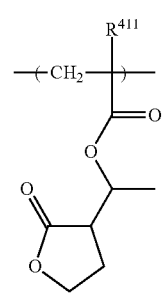

(4-11)

(wherein, in formula (4-11), $R^{411}$ represents a hydrogen atom or a methyl group.)

It is to be noted that, in this polymer, at least one constitutional unit selected from the group consisting of those represented by the above-described formulas (2) and (1-1), at least one constitutional unit selected from the group consisting of those represented by the above-described formulas (3-1-1), (3-3-1), and (3-5), and constitutional units represented by the above-described formula (4-11), are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The present invention relates to the above-described resist polymer, wherein the total ratio of at least one constitutional unit selected from those represented by the above-described formulas (2) and (1-1) is between 5% and 30% by mole, the total ratio of at least one constitutional unit selected from the group consisting of those represented by the above-described formulas (3-1-1), (3-3-1), and (3-5) is between 30% and 60% by mole, and the total ratio of the constitutional unit represented by the above-described formula (4-11) is between 30% and 60% by mole.

The present invention relates to the above-described resist polymer, which comprises at least one constitutional unit selected from the group consisting of those represented by the above-described formulas (2) and (1-1), at least one constitutional unit selected from the group consisting of those represented by the above-described formulas (3-1-1), (3-3-1), and (3-5), and at least one constitutional unit represented by the following formula (4-9):

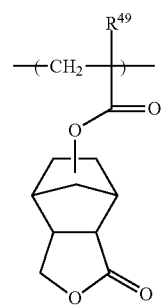

(4-9)

(wherein, in formula (4-9), $R^{49}$ represents a hydrogen atom or a methyl group.)

It is to be noted that, in this polymer, at least one constitutional unit selected from the group consisting of those represented by the above-described formulas (2) and (1-1), at least one constitutional unit selected from the group consisting of those represented by the above-described formulas (3-1-1), (3-3-1), and (3-5), and constitutional units represented by the above-described formula (4-9), are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The present invention relates to the above-described resist polymer, wherein the total ratio of at least one constitutional unit selected from those represented by the above-described formulas (2) and (1-1) is between 5% and 30% by mole, the total ratio of at least one constitutional unit selected from the group consisting of those represented by the above-described formulas (3-1-1), (3-3-1), and (3-5) is between 30% and 60% by mole, and the total ratio of the constitutional unit represented by the above-described formula (4-9) is between 30% and 60% by mole.

The present invention relates to the above-described resist polymer, which comprises at least one constitutional unit selected from the group consisting of those represented by the above-described formulas (2) and (1-1), at least one constitutional unit selected from the group consisting of those represented by the above-described formulas (3-1-1), (3-3-1), and (3-5), and at least one constitutional unit selected from the group consisting of those represented by the above-described formulas (4-2) and (4-3).

It is to be noted that, in this polymer, at least one constitutional unit selected from the group consisting of those represented by the above-described formulas (2) and (1-1), at least one constitutional unit selected from the group consisting of those represented by the above-described formulas (3-1-1), (3-3-1), and (3-5), and at least one constitutional unit selected from the group consisting of those represented by the above-described formulas (4-2) and (4-3), are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The present invention relates to the above-described resist polymer, wherein the total ratio of at least one constitutional unit selected from those represented by the above-described formulas (2) and (1-1) is between 5% and 30% by mole, the total ratio of at least one constitutional unit selected from the group consisting of those represented by the above-described formulas (3-1-1), (3-3-1), and (3-5) is between 30% and 60% by mole, and the total ratio of at least one constitutional unit selected from the group consisting of those represented by the above-described formulas (4-2) and (4-3) is between 30% and 60% by mole.

The present invention relates to the above-described resist polymer, which comprises at least one constitutional unit represented by the above-described formulas (1), at least one constitutional unit selected from the group consisting of those represented by the above-described formulas (3-1-1), (3-2-1), and (3-3-1), and at least one constitutional unit selected from the group consisting of those represented by the above-described formulas (4-7) and (4-8).

It is to be noted that, in this polymer, constitutional units represented by the above-described formula (1), at least one constitutional unit selected from the group consisting of those represented by the above-described formulas (3-1-1), (3-2-1) and (3-3-1), and at least one constitutional unit selected from the group consisting of those represented by the above-described formulas (4-7) and (4-8), are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The present invention relates to the above-described resist polymer, wherein the total ratio of the constitutional unit represented by the above-described formula (1) is between 5% and 30% by mole, the total ratio of at least one constitutional unit selected from the group consisting of those represented by the above-described formulas (3-1-1), (3-2-1), and (3-3-1) is between 30% and 60% by mole, and the total ratio of at least one constitutional unit selected from the group consisting of those represented by the above-described formulas (4-7) and (4-8) is between 30% and 60% by mole.

The present invention relates to the above-described resist polymer, which comprises at least one constitutional unit represented by the above-described formula (2), at least one constitutional unit represented by the above-described formula (3-1-1), and at least one constitutional unit represented by the above-described formula (4-8).

It is to be noted that, in this polymer, constitutional units represented by the above-described formula (2), constitutional units represented by the above-described formula (3-1-1), and constitutional units represented by the above-described formula (4-8), are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The present invention relates to the above-described resist polymer, wherein the total ratio of the constitutional unit represented by the above-described formula (2) is between 5% and 30% by mole, the total ratio of the constitutional unit represented by the above-described formula (3-1-1) is between 30% and 60% by mole, and the total ratio of the constitutional unit represented by the above-described formula (4-8) is between 30% and 60% by mole.

The present invention relates to the above-described resist polymer, which further comprises at least one constitutional unit selected from the group consisting of those represented by the following formulas (3-1-2) and (3-4):

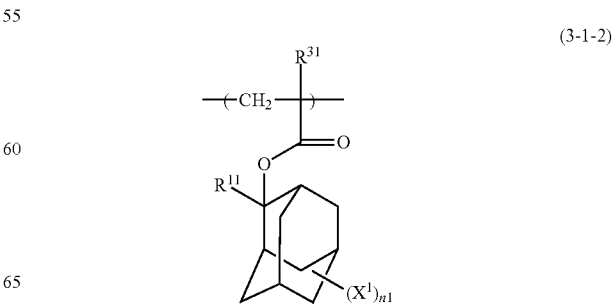

(3-1-2)

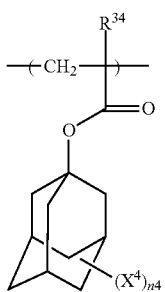

(3-4)

(wherein, in formula (3-1-2), $R^{31}$ represents a hydrogen atom or a methyl group; $R^{11}$ represents a hydrogen atom; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, a cyano group, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, and wherein, in formula (3-4), $R^{34}$ represents a hydrogen atom or a methyl group; $X^4$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n4 represents an integer between 0 and 4, and when n4 is 2 or greater, $X^4$ may be a plurality of different groups.)

It is to be noted that, in formulas (3-1-2) and (3-4), positions substituted with $X^1$ and $X^4$ may be any positions in the cyclic structures.

In this polymer, constitutional units represented by formulas (3-1-2) and (3-4) are not necessarily all the same, but may be a mixture of two or more kinds thereof.

The present invention relates to the above-described resist polymer, which has a mass average molecular weight between 1,000 and 100,000.

The present invention relates to the above-described resist polymer, which has a mass average molecular weight between 5,000 and 8,000.

The present invention relates to the above-described resist polymer, which further comprises a constitutional unit derived from a chain transfer agent.

It is to be noted that, in this polymer, constitutional units derived from a chain transfer agent are not necessarily all the same, but may be a mixture of two or more kinds thereof.

The present invention relates to the above-described resist polymer, which is produced by carrying out polymerization, while adding dropwise to a polymerization reactor a solution containing monomers that become constitutional units of a polymer of interest as a result of the polymerization.

In addition, the present invention relates to a resist composition, which comprises the above-described resist polymer.

Moreover, the present invention relates to a chemically amplified resist composition, which comprises the above-described resist polymer and a photoacid generator.

The present invention relates to the above-described chemically amplified resist composition, which further comprises a nitrogen-containing compound.

Furthermore, the present invention relates to a method of producing a pattern, which comprises the steps of applying the above-described resist composition onto a substrate to be processed, exposing the substrate to a light with a wavelength of 250 nm or shorter, and developing it with a developing solution.

The present invention relates to the above-described method of producing a pattern, wherein the light used for exposure is an ArF excimer laser.

Still further, the present invention relates to a method of producing a pattern, which comprises the steps of applying the above-described resist composition onto a substrate to be processed, exposing the substrate to an electron beam, and developing it with a developing solution.

The resist polymer of the present invention comprises a constitutional unit represented by the above formula (1), a constitutional unit having an acid-dissociable group, and a constitutional unit having a lactone skeleton represented by at least one selected from the group consisting of the above formulas (4-1), (4-2), (4-3), (4-5), (4-6), and (4-10). The term "acid-dissociable group" is used herein to mean a group that is decomposed or dissociated by the action of acid.

Among others, the constitutional unit represented by the above formula (1) is preferably one having a norbornane ring, and a constitutional unit represented by the above formula (2) is more preferable.

Among others, preferred examples of a constitutional unit having a lactone skeleton may include a constitutional unit represented by the above (4-1), a constitutional unit represented by the above (4-2), a constitutional unit represented by the above (4-3), and a constitutional unit represented by the above (4-10).

As stated above, constitutional units represented by the above formula (1) are not necessarily all the same, but may be a mixture of two or more kinds thereof. Likewise, constitutional units having an acid-dissociable group and constitutional units having a lactone skeleton are not necessarily all the same, but may be a mixture of two or more kinds thereof. In addition, in this polymer, each constitutional unit may have any given sequence. Accordingly, this polymer may be a random copolymer, an alternating copolymer, or a block copolymer.

The resist polymer of the present invention comprises a constitutional unit having a cyano group having cyclic hydrocarbon group represented by the above formula (1), a constitutional unit having an acid-dissociable group, and a constitutional unit having a lactone skeleton represented by at least one selected from the group consisting of the above formulas (4-1), (4-2), (4-3), (4-5), (4-6), and (4-10). With such a structure, the resist polymer of the present invention exhibits the same degree of high sensitivity and resolution as those of the conventional polymers used for resists, and provides a better resist pattern and improved adhesiveness to a substrate, inhibiting occurrence of line edge roughness or generation of microgels.

Moreover, using the resist polymer of the present invention, a uniform resist pattern size can be achieved on the surface of a substrate, even when a large substrate with a diameter of 300 mm or greater is used. Furthermore, a resist pattern to be formed is not significantly influenced by the PEB temperature. That is to say, the present invention can be reduced the dependency of the PEB temperature.

In order to obtain the aforementioned effects of the present invention, all of the constitutional unit represented by the above formula (1), the constitutional unit having an acid-dissociable group, and at least one constitutional unit having a lactone skeleton represented by at least one selected from the group consisting of the above formulas (4-1), (4-2), (4-3), (4-5), (4-6), and (4-10), are essential. If the polymer of the present invention lacked any one of these constitutional units, excellent effects could not be obtained.

BEST MODE FOR CARRYING OUT THE INVENTION

1. Monomer Containing Cyano Group Used for the Resist Polymer of the Present Invention The constitutional unit represented by the above formula (1) in the resist polymer of the present invention is derived from a (meth)acrylic acid ester derivative having a cyano group represented by formula (5) indicated below. In other words, the resist polymer of the present invention is obtained by copolymerization of a monomer composition containing a (meth)acrylic acid ester derivative having a cyano group represented by formula (5) indicated below. Such a (meth)acrylic acid ester derivative represented by the following formula (5) may be used alone or in combination.

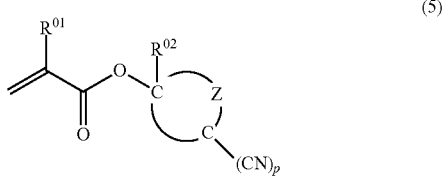

(wherein, in formula (5), $R^{01}$ represents a hydrogen atom or a methyl group; $R^{02}$ represents a hydrogen atom or an alkyl group having 1 to 4 carbon atoms; Z represents an atomic group that constitutes a cyclic hydrocarbon group together with a carbon atom constituting an ester bond and a carbon atom to which a cyano group binds; and p represents an integer between 1 and 4, provided that when p is 2 or greater, cyano groups may bind to a single carbon atom or different carbon atoms.)

The term "(meth)acrylic acid" is a generic name for both acrylic acid and methacrylic acid.

In formula (5), $R^{02}$ represents a hydrogen atom or an alkyl group having 1 to 4 carbon atoms. Such an alkyl group may be either linear or branched. Examples of such an alkyl group may include a methyl group, an ethyl group, a propyl group, and an isopropyl group. In terms of solubility in organic solvents, $R^{02}$ is preferably a hydrogen atom or a methyl group, and more preferably a hydrogen atom. In addition, in terms of stability of the polymer and easy handlability, a hydrogen atom is particularly preferable.

In formula (5), Z represents an atomic group that constitutes a cyclic hydrocarbon group, and preferably a bridged cyclic hydrocarbon group, together with a carbon atom constituting an ester bond and a carbon atom to which a cyano group binds. The number of carbon atoms contained in such a cyclic hydrocarbon group is not particularly limited. It is preferably between 7 and 20. This cyclic hydrocarbon group may have a substituent as well as a cyano group. Examples of such a substituent may include: a linear or branched alkyl group having 1 to 6 carbon atoms that may have at least one radical selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group; a hydroxy group; a carboxy group; an acyl group having 1 to 6 carbon atoms; an alkoxy group having 1 to 6 carbon atoms; a carboxy group that is esterified with alcohol having 1 to 6 carbon atoms; and an amino group.

In terms of high dry etching resistance required for resists, Z in formula (5) is preferably an atomic group that constitutes a bridged cyclic hydrocarbon group together with a carbon atom constituting an ester bond and a carbon atom to which a cyano group binds.

Examples of Z in formula (5) may include atomic groups having a cyclic terpene hydrocarbon such as a norbornane ring, an adamantane ring, a tetracyclododecane ring, a dicyclopentane ring, tricyclodecane ring, a decahydronaphthalene ring, a polyhydroanthracene ring, a camphor ring, a cholesteric ring, or the like. In terms of high dry-etching resistance required for resists, Z is preferably an atomic group having a cyclic terpene hydrocarbon such as a norbornane ring, an adamantane ring, a tetracyclododecane ring, a dicyclopentane ring, or a tricyclodecane ring. An atomic group having a norbornane ring represented by formula (11-1) indicated below, a tetracyclododecane ring represented by formula (11-2) indicated below, and an adamantane ring represented by formula (11-3) indicated below, are more preferable. Of these, an atomic group having a norbornane ring is particularly preferable because it is excellent in terms of copolymerizability with other monomers.

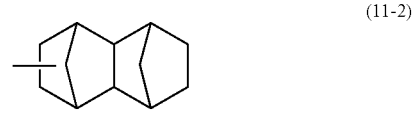

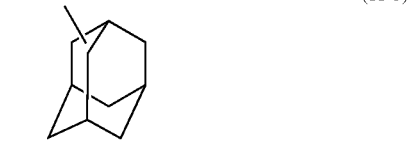

In formula (5), p represents the number of cyano groups contained in the cyclic hydrocarbon group. p represents an integer between 1 and 4. In terms of sensitivity and resolution, p is preferably 1 or 2, and more preferably 1.

When p is 2 or greater, cyano groups may bind to a single carbon atom or may bind to different carbon atoms. In terms of adhesiveness to metal surface or the like, it is preferable that cyano groups bind to different carbon atoms.

The positions of substitution of cyano groups are not particularly limited. When Z is a norbornyl ring for example, if it is substituted at position 5 with a (meth)acryloyl group, the positions of substitution of cyano groups are preferably position 2 and/or position 3.

Specific examples of a monomer represented by the above formula (5) may include monomers represented by formulas (6-1) to (6-16) indicated below. In formulas (6-1) to (6-16), R represents a hydrogen atom or a methyl group.

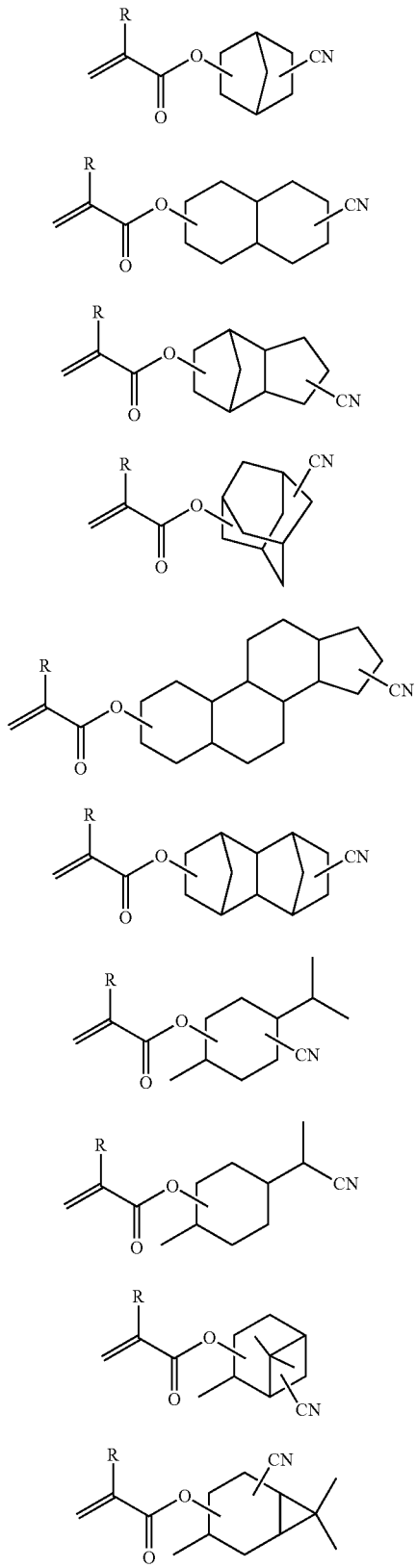

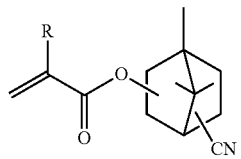

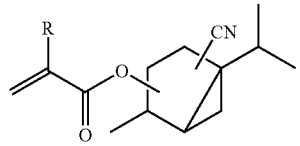

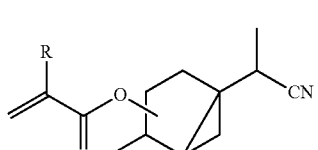

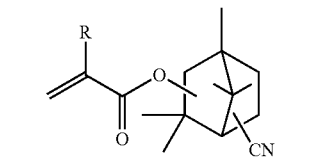

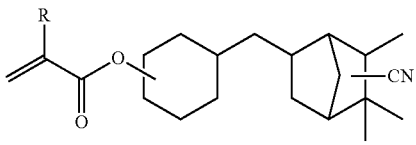

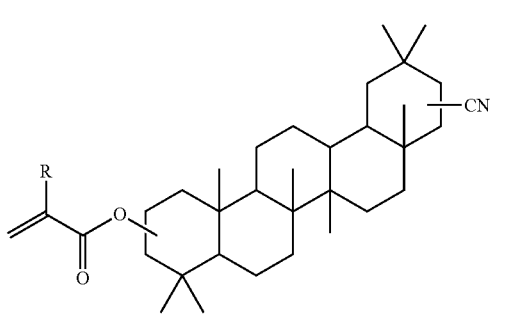

In terms of dry etching resistance, preferred examples of a monomer represented by the above formula (5) may include a monomer represented by the above formula (6-1), a monomer represented by the above formula (6-3), a monomer represented by the above formula (6-4), and a monomer represented by the above formula (6-6). Of these, a monomer represented by the above formula (6-1), a monomer represented by the above formula (6-4), and a monomer represented by the above formula (6-6), are more preferable. A monomer represented by the above formula (6-1) is particularly preferable in terms of copolymerizability with other monomers.

The constitutional unit represented by the above formula (1-1) is an example of the constitutional unit represented by the above formula (1) in the resist polymer of the present invention. The constitutional unit represented by the above formula (1-1) is derived from a (meth)acrylic acid ester derivative having a cyano group represented by formula (5-1) indicated below. In other words, the resist polymer of the present invention containing the constitutional unit represented by the above formula (1-1) is obtained by copolymerization of a monomer composition containing a (meth)acrylic acid ester derivative having a cyano group represented by formula (5-1) indicated below. Such a (meth)acrylic acid ester derivative represented by the following formula (5-1) may be used alone or in combination.

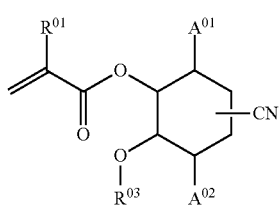

(5-1)

(wherein, in formula (5-1), $R^{01}$ represents a hydrogen atom or a methyl group; $R^{03}$ represents a hydrogen atom, or a linear or branched alkyl group having 1 to 6 carbon atoms; and each of $A^{01}$ and $A^{02}$ independently represents a hydrogen atom, or a linear or branched alkyl group having 1 to 4 carbon atoms, or $A^{01}$ and $A^{02}$ together represent —O—, —S—, —NH—, or an alkylene chain having 1 to 6 carbon atoms.)

In formula (5-1), $R^{03}$ represents a hydrogen atom, or a linear or branched alkyl group having 1 to 6 carbon atoms. In terms of excellent copolymerizability with other monomers, an ethyl group, a methyl group, and a hydrogen atom are preferable as $R^{03}$, and of these, a methyl group is more preferable.

In formula (5-1), each of $A^{01}$ and $A^{02}$ independently represents a hydrogen atom, or a linear or branched alkyl group having 1 to 4 carbon atoms, or $A^{01}$ and $A^{02}$ together represent —O—, —S—, —NH—, or an alkylene chain having 1 to 6 carbon atoms. In terms of excellent solubility in solvents, both $A^{01}$ and $A^{02}$ are preferably hydrogen atoms. In terms of excellent dry etching resistance, $A^{01}$ and $A^{02}$ preferably together form —CH$_2$— or —CH$_2$—CH$_2$—.

Specific examples of the monomer represented by the above formula (5-1) may include those represented by formulas (6-17) and (6-18) indicated below. R in formulas (6-17) and (6-18) represents a hydrogen atom or a methyl group.

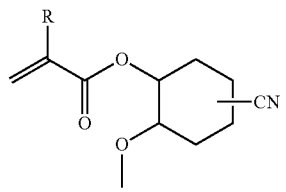

(6-17)

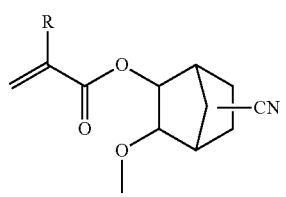

(6-18)

In addition, another example of the constitutional unit represented by the above formula (1) contained in the resist polymer of the present invention may be a constitutional unit, wherein, in the above formula (1), p is 1, and a cyano group binds to a carbon atom that is adjacent to the ester carbon atom. The bond between the ester carbon atom and a carbon atom to which a cyano group binds is generally a single bond.

In such a case, an atomic group having a cyclohexane ring is preferable as Z in formula (1) because it is excellent in terms of copolymerizability with other monomers. In addition, in terms of high dry etching resistance required for resists, an atomic group having a bridged cyclic hydrocarbon group is preferable as Z. Particularly preferred examples of Z may include an atomic group having a cyclohexane ring, an atomic group having an adamantine ring, an atomic group having a camphor ring, an atomic group having a norbornane ring, and an atomic group having a pinane ring.

As such a constitutional unit represented by the above formula (1), which has a cyano group binding to a carbon atom that is adjacent to the ester carbon atom, the constitutional unit represented by the above formula (1-2) is preferable. The constitutional unit represented by the above formula (1-2) is derived from a (meth)acrylic acid ester derivative having a cyano group represented by formula (5-2) indicated below. In other words, the resist polymer containing the constitutional unit represented by the above formula (1-2) is obtained by copolymerization of a monomer composition containing a (meth)acrylic acid ester derivative having a cyano group represented by formula (5-2) indicated below. Such a (meth)acrylic acid ester derivative represented by the following formula (5-2) may be used alone or in combination:

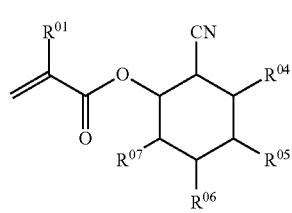

(5-2)

(wherein, in formula (5-2), $R^{01}$ represents a hydrogen atom or a methyl group; and each of $R^{04}$, $R^{05}$, $R^{06}$, and $R^{07}$ independently represents a hydrogen atom, or a linear or branched alkyl group having 1 to 4 carbon atoms, or two out of $R^{04}$, $R^{05}$, $R^{06}$, and $R^{07}$ together represent an alkylene chain having 1 to 6 carbon atoms.)

In formula (5-2), each of $R^{04}$, $R^{05}$, $R^{06}$, and $R^{07}$ independently represents a hydrogen atom, or a linear or branched alkyl group having 1 to 4 carbon atoms, or two out of $R^{04}$, $R^{05}$, $R^{06}$, and $R^{07}$ together represent an alkylene chain having 1 to 6 carbon atoms. In terms of excellent copolymerizability with other monomers, all of $R^{04}$, $R^{05}$, $R^{06}$, and $R^{07}$ are preferably hydrogen atoms. In terms of excellent dry etching resistance, with regard to $R^{04}$, $R^{05}$, $R^{06}$, and $R^{07}$, it is preferable that $R^{04}$ and $R^{07}$ together form —CH$_2$— or —CH$_2$—CH$_2$—.

Specific examples of the monomer represented by the above formula (5-2) may include monomers represented by formulas (6-19) and (6-20) indicated below. R in formulas (6-19) and (6-20) represents a hydrogen atom or a methyl group.

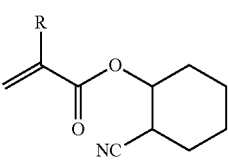

(6-19)

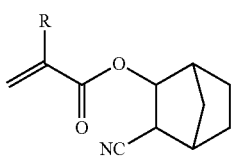

(6-20)

The (meth)acrylic acid ester derivative containing a cyano group represented by the above formula (5) can be produced by processes (I) or (II) shown below, for example. Process (I) shown below indicates a process of producing the monomer represented by the above formula (6-1), and process (II) shown below indicates a process of producing the monomer represented by the above formula (6-17). Other monomers represented by the above formula (5) can also be produced in the same manner.

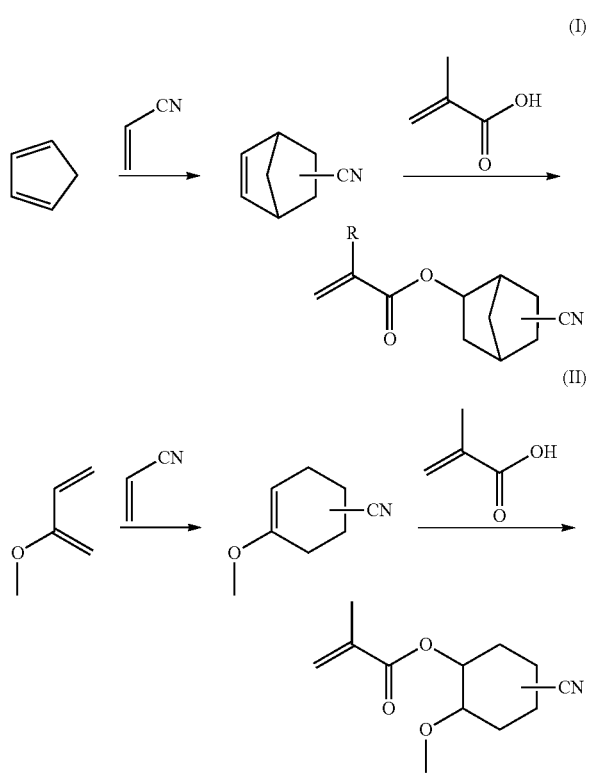

Raw materials, such as (meth)acrylonitrile, cyclopentadiene, 2-methoxybutadiene, (meth)acrylic acid, and a derivative thereof, can be produced by known methods. Otherwise, commercially available products can also be used.

A cycloaddition reaction between (meth)acrylonitrile and cyclopentadiene or 2-methoxybutadiene can easily be carried out by known methods. Such a reaction is preferably carried out, using a catalyst such as Lewis acid as necessary, in no solvents or in a solvent such as methanol.

An addition reaction of adding acrylic acid or methacrylic acid to an unsaturated bond is preferably carried out, using an acid catalyst, in no solvents or in a solvent such as toluene, with excessive acrylic acid or methacrylic acid. The type of an acid catalyst used in this addition reaction is not particularly limited. Examples of such an acid catalyst may include hydrochloric acid, sulfuric acid, nitric acid, p-toluenesulfonic acid, acetic acid, trifluoroacetic acid, and trifluoromethanesulfonic acid. Among these acid catalysts, sulfuric acid, p-toluenesulfonic acid, and trifluoromethanesulfonic acid are preferable in terms of reaction rate. Trifluoromethanesulfonic acid is more preferable.

The product obtained from the above reaction may include several structural isomers, geometric isomers, and optical isomers, in some cases. In the present invention, a mixture consisting of two or more types of isomers may be used, or a specific isomer may be used singly after purification. In the present invention, a mixture consisting of isomers may directly be used in a polymerization reaction. Moreover, even if the product contains a reaction intermediate, it can directly be used in a polymerization reaction. The above reaction product may be purified by simple distillation, thin film distillation, recrystallization, column chromatography, or the like, as necessary.

The (meth)acrylic acid ester derivative containing a cyano group represented by the above formula (5-2) can be produced by process (III) shown below, for example. Process (III) shown below indicates a process of producing the monomer represented by the above formula (6-19). Other monomers represented by the above formula (5-2) can also be produced in the same manner. R in formula (III) represents a hydrogen atom or a methyl group.

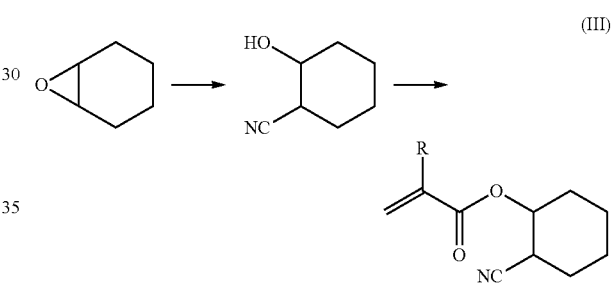

Raw material, epoxide such as cyclohexene oxide, can be produced by known methods. Otherwise, commercially available products can also be used.

In the present production method, epoxide is first allowed to react with a cyanating agent, so as to synthesize β-cyanohydrin. Examples of a cyanating agent used in this cyanation reaction may include hydrogen cyanide, sodium cyanide, potassium cyanide, trimethylsilylcyan, and acetonecyanhydrin. Of these, in terms of safety, sodium cyanide, potassium cyanide, and trimethylsilylcyan are preferable. In terms of inexpensiveness, hydrogen cyanide, sodium cyanide, and potassium cyanide are preferable. This cyanation reaction progresses either under acidic conditions or under alkaline conditions. In the present production method, in terms of reaction rate, it is preferable that the cyanation reaction be carried out using potassium cyanide as a cyanating agent under alkaline conditions.

The obtained β-cyanohydrin may be purified by known methods such as distillation or column chromatography, or it may directly be used in the subsequent reaction without being purified.

Subsequently, β-cyanohydrin is converted into (meth)acrylic acid ester. The reaction of converting β-cyanohydrin into (meth)acrylic acid ester can be carried out by known methods such as esterification or transesterification. Examples of an esterifying agent used in this reaction may include (meth)acrylic acid, (meth)acrylic acid chloride, (meth)acrylic acid anhydride, and (meth)acrylic acid ester. Of these, in terms of reaction rate, (meth)acrylic acid chloride and (meth)acrylic acid anhydride are preferable as an esterifying agent. Moreover, in such a reaction of converting β-cyanohydrin into (meth)acrylic acid ester, a catalyst such as Lewis acid may be used, as necessary.

The product obtained from the above reaction may include several structural isomers, geometric isomers, and optical isomers, in some cases. In the present invention, a mixture consisting of two or more types of isomers may be used, or a specific isomer may be used singly after purification. In the present invention, a mixture consisting of isomers may directly be used in a polymerization reaction. Moreover, even if the product contains a reaction intermediate, it can directly be used in a polymerization reaction. The above reaction product may be purified by known methods such as distillation or column chromatography, as necessary.

The cyano group having (meth)acrylic acid ester derivative represented by the above formula (6-18) can be produced by the following process (IV), for example:

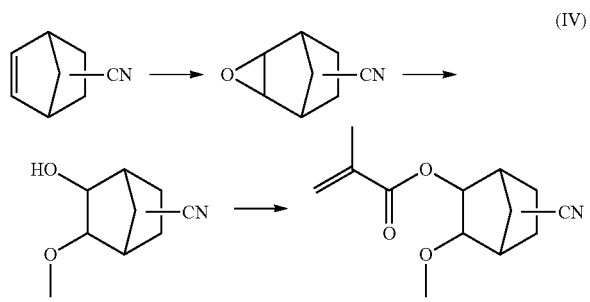

(IV)

Cyano norbornene used as a raw material can be produced by the same method as the above process (I).

In the present production method, first, an epoxidization reaction of cyano norbornene is carried out. In such an epoxidization reaction of cyano norbornene, cyano norbornene is generally allowed to react with an oxidizing agent. Examples of an oxidizing agent used herein may include hydrogen peroxide, peracetic acid, perbenzoic acid, and m-chloroperbenzoic acid. Of these, hydrogen peroxide is preferable as an oxidizing agent in terms of easy handlability. In terms of excellent reactivity, m-chloroperbenzoic acid is preferable.

Subsequently, a ring-opening reaction of epoxide is carried out. Such a ring-opening reaction of epoxide is generally carried out under acidic conditions or basic conditions. In addition, a catalyst such as Lewis acid may be used, as necessary. In the present production method, a method of adding methanol or metal methoxide to epoxide (allowing them to react with epoxide) under basic conditions is preferably applied because it is excellent in terms of reactivity.

The obtained compound may be purified by known methods such as distillation or column chromatography, or it may directly be used in the subsequent reaction without being purified.

The subsequent reaction of converting the compound into (meth)acrylic acid ester can be carried out by the above-described method, that is, the reaction of converting β-cyanohydrin into (meth)acrylic acid ester.

The product obtained from the above reaction may include several structural isomers, geometric isomers, and optical isomers, in some cases. In the present invention, a mixture consisting of two or more types of isomers may be used, or a specific isomer may be used singly after purification. In the present invention, a mixture consisting of isomers may directly be used in a polymerization reaction. Moreover, even if the product contains a reaction intermediate, it can directly be used in a polymerization reaction. The above reaction product may be purified by known methods such as distillation or column chromatography, as necessary.

2. The Resist Polymer of the Present Invention

The resist polymer of the present invention is obtained by copolymerization of a monomer composition, which comprises at least one (meth)acrylic acid ester derivative containing a cyano group represented by the above formula (5), at least one monomer having an acid-dissociable group, and at least one monomer having a lactone skeleton. It comprises a constitutional unit represented by the above formula (1), a constitutional unit having an acid-dissociable group, and a constitutional unit having a lactone skeleton.

In addition, the resist polymer of the present invention is preferably obtained by copolymerization of a monomer composition, which comprises at least one (meth)acrylic acid ester derivative containing a cyano group represented by the above formula (6-1) and/or (6-17), at least one monomer having an acid-dissociable group, and at least one monomer having a lactone skeleton. The resist polymer of the present invention is particularly preferably obtained by copolymerization of a monomer composition, which comprises at least one (meth)acrylic acid ester derivative containing a cyano group represented by the above formula (6-1), at least one monomer having an acid-dissociable group, and at least one monomer having a lactone skeleton. It comprises a constitutional unit represented by the above formula (2), a constitutional unit having an acid-dissociable group, and a constitutional unit having a lactone skeleton.

The resist polymer of the present invention may comprise at least one constitutional unit represented by the above formula (1) other than the constitutional unit represented by the above formula (2), and at least one constitutional unit represented by the above formula (2).

In addition, each constitutional unit in the resist polymer of the present invention may have any given sequence. Accordingly, this polymer may be a random copolymer, an alternating copolymer, or a block copolymer.

The total ratio of the constitutional unit represented by the above formula (1) (which includes the constitutional unit represented by the above formula (2) and the constitutional unit represented by the above formula (1-1)) in the resist polymer of the present invention is preferably 5% or more by mole, and more preferably 10% or more by mole, in terms of good resist pattern. Moreover, the total ratio of the constitutional unit represented by the above formula (1) (which includes the constitutional unit represented by the above formula (2) and the constitutional unit represented by the above formula (1-1)) in the resist polymer of the present invention is preferably 30% or less by mole, and more preferably 25% or less by mole, in terms of sensitivity and resolution.

The total ratio of the constitutional unit having an acid-dissociable group in the resist polymer of the present invention is preferably 30% or more by mole, and more preferably 35% or more by mole, in terms of sensitivity and resolution. Moreover, the total ratio the constitutional unit having an acid-dissociable group in the resist polymer of the present invention is preferably 60% or less by mole, and more preferably 50% or less by mole, in terms of adhesiveness to the metal surface or the like.

The total ratio of the constitutional unit having a lactone skeleton in the resist polymer of the present invention is preferably 30% or more by mole, and more preferably 35% or more by mole, in terms of adhesiveness to the metal surface or the like. Moreover, the total ratio the constitutional unit having a lactone skeleton in the resist polymer of the present invention is preferably 60% or less by mole, and more preferably 50% or less by mole, in terms of sensitivity and resolution.

The constitutional unit having an acid-dissociable group will be described.

The type of an acid-dissociable group is not particularly limited, as long as it is a group that is decomposed or dissociated by the action of acid. Examples of such an acid-dissociable group may include those represented by the following formulas (12-1) to (12-9):

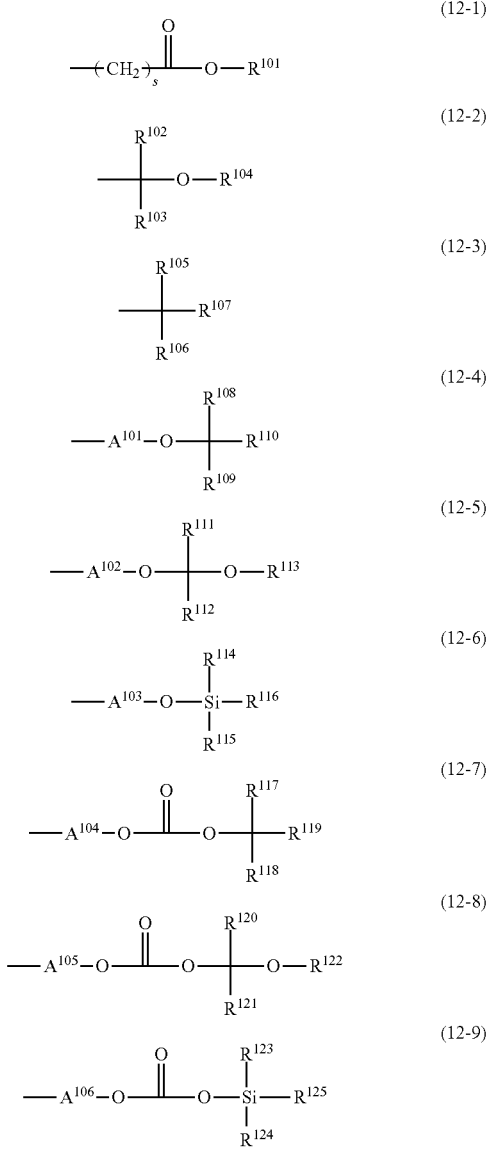

(wherein, in formula (12-1), $R^{101}$ represents a tertiary alkyl group having 4 to 20 carbon atoms, and s represents an integer between 0 and 10;

wherein, in formula (12-2), each of $R^{102}$ and $R^{103}$ independently represents a hydrogen atom, or a linear, branched, or cyclic alkyl group having 1 to 18 carbon atoms, and $R^{104}$ represents a monovalent hydrocarbon group having 1 to 20 carbon atoms that may contain a heteroatom, or $R^{102}$ and $R^{103}$, $R^{102}$ and $R^{104}$, or $R^{103}$ and $R^{104}$, represent a cyclic hydrocarbon group together with carbon atoms to which they bind;

wherein, in formula (12-3), each of $R^{105}$, $R^{106}$, and $R^{107}$ independently represents a linear, branched, or cyclic alkyl group having 1 to 18 carbon atoms, or $R^{105}$ and $R^{106}$, $R^{105}$ and $R^{107}$, or $R^{106}$ and $R^{107}$, represent a cyclic hydrocarbon group together with carbon atoms to which they bind;

wherein, in formula (12-4), each of $R^{108}$, $R^{109}$, and $R^{110}$ independently represents a hydrogen atom, an alkyl group, a cycloalkyl group, an alkenyl group, or an aryl group, or $R^{108}$ and $R^{109}$, $R^{108}$ and $R^{110}$, or $R^{109}$ and $R^{110}$, represent a cyclic hydrocarbon group together with carbon atoms to which they bind, provided that at least two out of $R^{108}$, $R^{109}$, and $R^{110}$ represent groups other than hydrogen atoms, and $A^{101}$ represents a divalent aromatic hydrocarbon group that may have a monocyclic or polycyclic substituent;

wherein, in formula (12-5), each of $R^{111}$ and $R^{112}$ independently represents a hydrogen atom, an alkyl group, a cycloalkyl group, an alkenyl group, or an aryl group, and $R^{113}$ represents an alkyl group or an aryl group, or $R^{111}$ and $R^{112}$, $R^{111}$ and $R^{113}$, or $R^{112}$ and $R^{113}$, represent a cyclic hydrocarbon group or an aliphatic heterocyclic ring together with carbon atoms or oxygen atoms to which they bind, provided that at least two out of $R^{111}$, $R^{112}$, and $R^{113}$ represent groups other than hydrogen atoms, and $A^{102}$ represents a divalent aromatic hydrocarbon group that may have a monocyclic or polycyclic substituent;

wherein, in formula (12-6), each of $R^{114}$, $R^{115}$, and $R^{116}$ independently represents a hydrogen atom, an alkyl group, a cycloalkyl group, an alkenyl group, or an aryl group, or $R^{114}$ and $R^{115}$, $R^{114}$ and $R^{116}$, or $R^{115}$ and $R^{116}$, represent an aliphatic heterocyclic ring together with silicon atoms to which they bind, provided that at least two out of $R^{114}$, $R^{115}$, and $R^{116}$ represent groups other than hydrogen atoms, and $A^{103}$ represents a divalent aromatic hydrocarbon group that may have a monocyclic or polycyclic substituent;

wherein, in formula (12-7), each of $R^{117}$, $R^{118}$, and $R^{119}$ independently represents a hydrogen atom, an alkyl group, a cycloalkyl group, an alkenyl group, or an aryl group, or $R^{117}$ and $R^{118}$, $R^{117}$ and $R^{119}$, or $R^{118}$ and $R^{119}$, represent a cyclic hydrocarbon group together with carbon atoms to which they bind, provided that at least two out of $R^{117}$, $R^{118}$, and $R^{119}$ represent groups other than hydrogen atoms, and $A^{104}$ represents a divalent aromatic hydrocarbon group that may have a monocyclic or polycyclic substituent;

wherein, in formula (12-8), each of $R^{120}$ and $R^{121}$ independently represents a hydrogen atom, an alkyl group, a cycloalkyl group, an alkenyl group, or an aryl group, and $R^{122}$ represents an alkyl group or an aryl group, or $R^{120}$ and $R^{121}$, $R^{120}$ and $R^{122}$, or $R^{121}$ and $R^{122}$, represent a cyclic hydrocarbon group or an aliphatic heterocyclic ring together with carbon atoms or oxygen atoms to which they bind, provided that at (east two out of $R^{120}$, $R^{121}$, and $R^{122}$ represent groups other than hydrogen atoms, and $A^{105}$ represents a divalent aromatic hydrocarbon group that may have a monocyclic or polycyclic substituent; and wherein, in formula (12-9), each of $R^{123}$, $R^{124}$, and $R^{125}$ independently represents a hydrogen atom, an alkyl group, a cycloalkyl group, an alkenyl group, or an aryl group, or $R^{123}$ and $R^{124}$, $R^{123}$ and $R^{125}$, or $R^{124}$ and $R^{125}$, represent an aliphatic heterocyclic ring together with silicon atoms to which they bind, provided that at least two out of $R^{123}$, $R^{124}$, and $R^{125}$ represent groups other than hydrogen atoms, and $A^{106}$ represents a divalent aromatic hydrocarbon group that may have a monocyclic or polycyclic substituent.)

In formula (12-1), $R^{101}$ represents a tertiary alkyl group having 4 to 20 carbon atoms, and preferably 4 to 15 carbon atoms, and s represents an integer between 0 and 10.

Specific examples of a group represented by formula (12-1) may include a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxy-carbonylmethyl group, a 1-ethyl-2-cyclopentenyloxycarbonyl group, a 1-ethyl-2-cyclopentenyloxycarbonylmethyl group, a 1-ethoxycarbonylmethyl group, a 2-tetrahydropyranyloxycarbonylmethyl group, and a 2-tetrahydrofuranyloxy-carbonylmethyl group.

In formula (12-2), each of $R^{102}$ and $R^{103}$ independently represents a hydrogen atom, or a linear, branched, or cyclic alkyl group having 1 to 18 carbon atoms, and preferably 1 to 10 carbon atoms. Specific examples of such an alkyl group may include a methyl group, an ethyl group, an n-propyl group, an isopropyl group, an n-butyl group, a sec-butyl group, a tert-butyl group, a cyclopentyl group, a cyclohexyl group, a 2-ethylcyclohexyl group, and an n-octyl group.

In formula (12-2), $R^{104}$ represents a monovalent hydrocarbon group having 1 to 20 carbon atoms, and preferably 1 to 10 carbon atoms, that may contain a heteroatom such as an oxygen atom. Examples of $R^{104}$ may include a linear, branched, or cyclic alkyl group, and a linear, branched, or cyclic alkyl group, several hydrogen atoms of which are substituted with a hydroxyl group, an alkoxy group, an oxo group, an amino group, an alkylamino group, or the like.

In addition, $R^{102}$ and $R^{103}$, $R^{102}$ and $R^{104}$, or $R^{103}$ and $R^{104}$, may bind to each other, so as to form a ring. In this case, each of $R^{102}$, $R^{103}$, and $R^{104}$ is an alkylene group having 1 to 18 carbon atoms, and preferably 1 to 10 carbon atoms, that may contain a heteroatom such as an oxygen atom.

Specific examples of a group represented by formula (12-2) may include a tetrahydrofuran-2-yl group, a 2-methyltetrahydrofuran-2-yl group, a tetrahydropyran-2-yl group, a 2-methyltetrahydropyran-2-yl group, and groups represented by the following formulas:

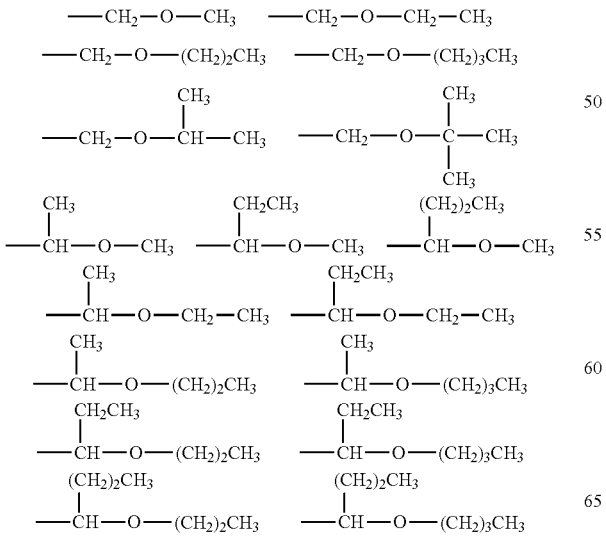

Of these, an ethoxyethyl group, a butoxyethyl group, and an ethoxypropyl group are preferable as groups represented by formula (12-2).

In formula (12-3), each of $R^{105}$, $R^{106}$, and $R^{107}$ independently represents a linear, branched, or cyclic alkyl group having 1 to 18 carbon atoms, and preferably 1 to 10 carbon atoms. Examples of such an alkyl group are the same as those of $R^{102}$ and $R^{103}$ in formula (12-2).

Moreover, $R^{105}$ and $R^{106}$, $R^{105}$ and $R^{107}$, or $R^{106}$ and $R^{107}$, may bind to each other, so as to form a ring.

Specific examples of a group represented by formula (12-3) may include a tert-butyl group, a tert-amyl group, a triethylcarbyl group, a 1-methylcyclo-hexyl group, a 1-ethylcyclopentyl group, a 1-ethylnorbornyl group, a 2-(2-methyl)adamantyl group, a 2-(2-ethyl)adamantyl group, a 1,1,1,3,3,3-hexafluoro-2-methyl-isopropyl group, and a 1,1,1,3,3,3-hexafluoro-2-cyclohexyl-isopropyl group. Furthermore, groups represented by the following formulas (13-1) to (13-17) are also included.

(13-1)

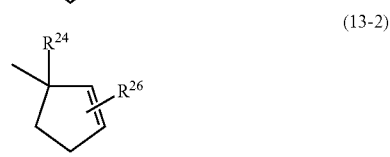

(13-2)

(13-3)

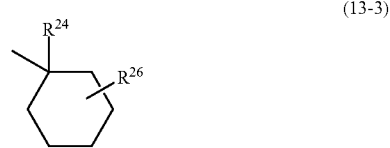

(13-4)

(13-5)

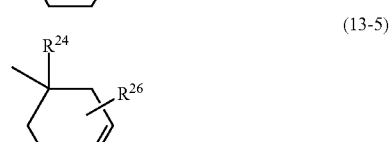

(13-6)

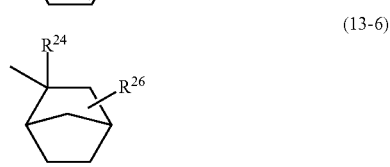

(13-7) 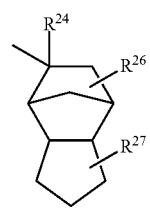

(13-8) 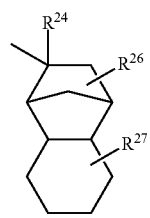

(13-9) 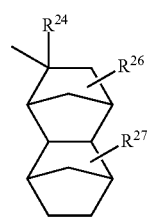

(13-10) 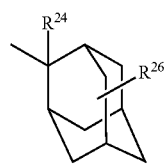

(13-11) 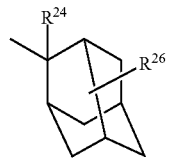

(13-12) 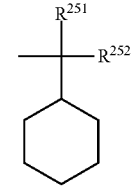

(13-13) 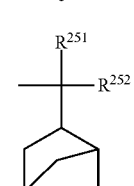

(13-14) 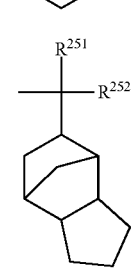

(13-14) 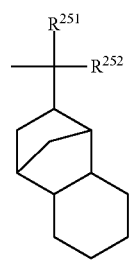

(13-15) 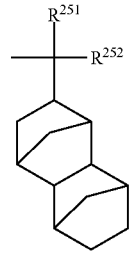

(13-16) 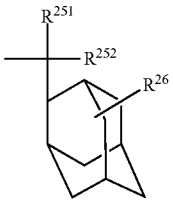

(wherein, each of $R^{24}$, $R^{251}$, and $R^{252}$ independently represents a linear, branched, or cyclic alkyl group having 1 to 6 carbon atoms, each of $R^{26}$ and $R^{27}$ independently represents a hydrogen atom, a monovalent hydrocarbon group that may contain a heteroatom, or a monovalent hydrocarbon group that may be mediated by a heteroatom, wherein, in such a case, examples of a heteroatom may include an oxygen atom, a sulfur atom, and a nitrogen atom, and such a heteroatom may be contained or mediated in the form of —OH, —$OR^{28}$, —O—, —S—, —S(=O)—, —$NH_2$, —$NHR^{28}$, —$N(R^{28})_2$, —NH—, —$NR^{28}$—, or the like, and $R^{28}$ represents a linear, branched, or cyclic alkyl group having 1 to 10 carbon atoms.)

Specific examples of $R^{24}$, $R^{251}$, and $R^{252}$ may include a methyl group, an ethyl group, a propyl group, an isopropyl group, an n-butyl group, a sec-butyl group, an n-pentyl group, an n-hexyl group, a cyclopropyl group, a cyclopropylmethyl group, a cyclobutyl group, a cyclopentyl group, and a cyclohexyl group.

Examples of $R^{26}$ and $R^{27}$ may include a linear, branched, or cyclic alkyl group, a hydroxyalkyl group, an alkoxy group, an alkoxyalkyl group, as well as a hydrogen atom. Specific examples may include a methyl group, a hydroxymethyl group, an ethyl group, a hydroxyethyl group, an n-propyl group, an isopropyl group, an n-butyl group, a sec-butyl group, an n-pentyl group, an n-hexyl group, a methoxy group, a methoxymethoxy group, an ethoxy group, and a tert-butoxy group.

In formula (12-4), each of $R^{108}$, $R^{109}$, and $R^{110}$ independently represents a hydrogen atom, an alkyl group, a cycloalkyl group, an alkenyl group, or an aryl group.

An alkyl group may be either linear or branched. The number of carbon atoms contained in such an alkyl group is not particularly limited. It is preferably between 1 and 18, and more preferably between 1 and 10. The number of carbon atoms contained in a cycloalkyl group is not particularly limited. It is preferably between 1 and 18, and more preferably between 1 and 10. Examples of such an alkyl group and cycloalkyl group are the same as those of $R^{105}$, $R^{106}$, and $R^{107}$ in formula (12-3).

The number of carbon atoms contained in an alkenyl group is not particularly limited. It is preferably between 2 and 4. Examples of such an alkenyl group may include a vinyl group, a propenyl group, an allyl group, and a butenyl group.

The number of carbon atoms contained in an aryl group is not particularly limited. It is preferably between 6 and 14. Examples of such an aryl group may include a phenyl group, a xylyl group, a toluoyl group, a cumenyl group, a naphthyl group, and an anthracenyl group.

In addition, $R^{108}$ and $R^{109}$, $R^{108}$ and $R^{110}$, or $R^{109}$ and $R^{110}$, may bind to each other, so as to form a ring. Examples of groups that form such a ring are the same as those of $R^{105}$ and $R^{106}$, $R^{105}$ and $R^{107}$, or $R^{106}$ and $R^{107}$ in formula (12-3).

In formula (12-4), $A^{101}$ represents a divalent aromatic hydrocarbon group that may have a monocyclic or polycyclic substituent. The number of carbon atoms contained in this divalent aromatic hydrocarbon group is not particularly limited. It is preferably between 6 and 14. Examples of such a divalent aromatic hydrocarbon group may include a phenyl group, a xylyl group, a toluoyl group, a cumenyl group, a naphthyl group, and an anthracenyl group. Examples of a substituent may include: alkyl groups such as a hydroxyl group, a halogen atom (fluorine, chlorine, bromine, iodine), a nitro group, a cyano group, alkyl groups such as a methyl group, an ethyl group, a propyl group, an isopropyl group, an n-butyl group, a sec-butyl group, an n-pentyl group, an n-hexyl group, a cyclopropyl group, a cyclopropylmethyl group, a cyclobutyl group, a cyclopentyl group, or a cyclohexyl group; alkoxy groups such as a methoxy group, an ethoxy group, a hydroxyethoxy group, a propoxy group, a hydroxypropoxy group, an n-butoxy group, an isobutoxy group, a sec-butoxy group, or a t-butoxy group; alkoxycarbonyl groups such as a methoxycarbonyl group or an ethoxycarbonyl group; aralkyl groups such as a benzyl group, a phenethyl group, or a cumyl group; acyl groups such as an aralkyloxy group, a formyl group, an acetyl group, a butyryl group, a benzoyl group, a cyanamyl group, or valeryl group; acyloxy groups such as a butyryloxy group; alkenyloxy groups such as the aforementioned alkenyl group, a vinyloxy group, a propenyloxy group, an allyloxy group, or a butenyloxy group; aryloxy groups such as the aforementioned aryl group or a phenoxy group; and aryloxycarbonyl groups such as a benzoyloxy group.

In formula (12-5), each of $R^{111}$ and $R^{112}$ independently represents a hydrogen atom, an alkyl group, a cycloalkyl group, an alkenyl group, and an aryl group. In formula (12-5), examples of $R^{111}$ and $R^{112}$ are the same as those of $R^{108}$, $R^{109}$ and $R^{110}$ in formula (12-4), and preferred examples are also the same as those of $R^{108}$, $R^{109}$ and $R^{110}$.

In formula (12-5), $R^{113}$ represents an alkyl group or an aryl group.

An alkyl group may be either linear or branched. The number of carbon atoms contained in such an alkyl group is not particularly limited. It is preferably between 1 and 20, and more preferably between 1 and 10. Examples of such an alkyl group are the same as those of $R^{102}$ and $R^{103}$ in formula (12-2).

The number of carbon atoms contained in an aryl group is not particularly limited. It is preferably between 6 and 14. Examples of such an aryl group may include a phenyl group, a xylyl group, a toluoyl group, a cumenyl group, a naphthyl group, and an anthracenyl group.

In addition, $R^{111}$ and $R^{112}$, $R^{111}$ and $R^{113}$, or $R^{112}$ and $R^{113}$, may bind to each other, so as to form a ring. In such a case, each of $R^{111}$, $R^{112}$, and $R^{113}$ is an alkylene group having preferably 1 to 18 carbon atoms, and more preferably 1 to 10 carbon atoms, that may contain a heteroatom such as an oxygen atom. Examples of groups that form such a ring are the same as those of $R^{102}$ and $R^{103}$, $R^{102}$ and $R^{104}$, or $R^{103}$ and $R^{104}$ in formula (12-2).

In formula (12-5), $A^{102}$ represents a divalent aromatic hydrocarbon group that may have a monocyclic or polycyclic substituent. In formula (12-5), examples of $A^{102}$ are the same as those of $A^{101}$ in formula (12-4). Preferred examples of $A^{102}$ are also the same as those of $A^{101}$ in formula (12-4).

In formula (12-6), each of $R^{114}$, $R^{115}$, and $R^{116}$ independently represents a hydrogen atom, an alkyl group, a cycloalkyl group, an alkenyl group, or an aryl group. In formula (12-6), examples of such $R^{114}$, $R^{115}$, and $R^{116}$ are the same as those of $R^{108}$, $R^{109}$, and $R^{110}$ in formula (12-4). Preferred examples of $R^{114}$, $R^{115}$, and $R^{116}$, are also the same as those of $R^{108}$, $R^{109}$, and $R^{110}$ in formula (12-4).

In formula (12-6), $A^{103}$ represents a divalent aromatic hydrocarbon group that may have a monocyclic or polycyclic substituent. In formula (12-6), examples of $A^{103}$ are the same as those of $A^{101}$ in formula (12-4). Preferred examples of $A^{103}$ are also the same as those of $A^{101}$ in formula (12-4).

In formula (12-7), each of $R^{117}$, $R^{118}$, and $R^{119}$ independently represents a hydrogen atom, an alkyl group, a cycloalkyl group, an alkenyl group, or an aryl group. In formula (12-7), $A^{104}$ represents a divalent aromatic hydrocarbon group that may have a monocyclic or polycyclic substituent. In formula (12-7), examples of $R^{117}$, $R^{118}$, $R^{119}$, and $A^{104}$ are the same as those of $R^{108}$, $R^{109}$, $R^{110}$, and $A^{101}$ in formula (12-4). Preferred examples of $R^{117}$, $R^{118}$, $R^{119}$, and $A^{103}$ are also the same as those of $R^{108}$, $R^{109}$, $R^{110}$, and $A^{101}$ in formula (12-4).

In formula (12-8), each of $R^{120}$ and $R^{121}$ independently represents a hydrogen atom, an alkyl group, a cycloalkyl group, an alkenyl group, or an aryl group. In formula (12-8), $R^{122}$ represents an alkyl group or an aryl group. In formula (12-8), $A^{105}$ represents a divalent aromatic hydrocarbon group that may have a monocyclic or polycyclic substituent. In formula (12-8), examples of $R^{120}$, $R^{121}$, $R^{122}$, and $A^{105}$ are the same as those of $R^{111}$, $R^{112}$, $R^{113}$, and $A^{102}$ in formula (12-5). Preferred examples of $R^{120}$, $R^{121}$, $R^{122}$, and $A^{105}$ are also the same of those of $R^{111}$, $R^{112}$, $R^{113}$, and $A^{102}$ in formula (12-5).

In formula (12-9), each of $R^{123}$, $R^{124}$ and $R^{125}$ independently represents a hydrogen atom, an alkyl group, a cycloalkyl group, an alkenyl group, or an aryl group. In formula (12-9), $A^{106}$ represents a divalent aromatic hydrocarbon group that may have a monocyclic or polycyclic substituent. In formula (12-9), examples of $R^{123}$, $R^{124}$, $R^{125}$, and $A^{106}$ are the same as those of $R^{114}$, $R^{115}$, $R^{116}$ and $A^{103}$ in formula (12-6). Preferred examples of $R^{123}$, $R^{124}$, $R^{125}$, and $A^{106}$, are also the same as those of $R^{114}$, $R^{115}$, $R^{116}$, and $A^{103}$ in formula (12-6).

An acid-dissociable group preferably has an alicyclic skeleton in order to achieve high dry etching resistance required for resists. Specifically, the groups represented by the above formulas (13-1) to (13-17), which were exemplified for the group represented by formula (12-3), are preferable as such acid-dissociable groups.

Examples of a preferred constitutional unit having an acid-dissociable group may include constitutional units represented by the following formulas (7-1) to (7-4):

(7-1)

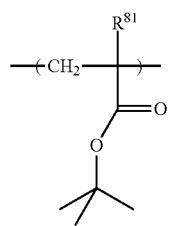

(7-2)

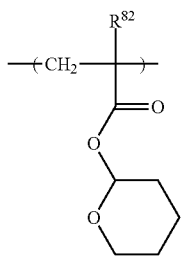

(7-3)

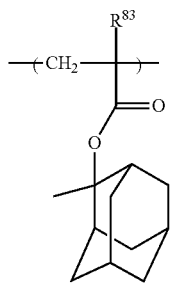

(7-4)

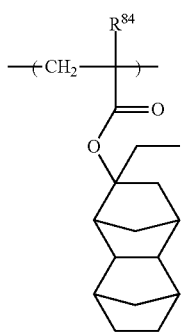

(wherein, in formulas (7-1) to (7-4), each of $R^{81}$, $R^{82}$, $R^{83}$, and $R^{84}$ represents a hydrogen atom or a methyl group.)

Of these, the constitutional unit represented by the above formula (7-3) and the constitutional unit represented by the above formula (7-4) are more preferable because they achieve high dry etching resistance required for resists.

The constitutional units represented by the above formulas (7-1) to (7-4) are obtained by copolymerization of monomers represented by the following formulas (8-1) to (8-4):

(8-1)

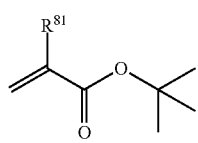

(8-2)

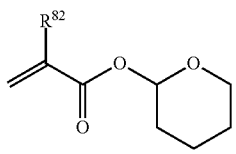

(8-3)

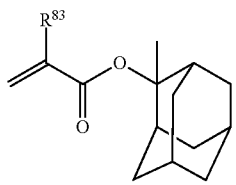

(8-4)

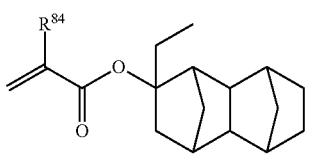

(wherein, in formulas (8-1) to (8-4), each of $R^{81}$, $R^{82}$, $R^{83}$, and $R^{84}$ represents a hydrogen atom or a methyl group.)

As a constitutional unit having an acid-dissociable group, a constitutional unit having an alicyclic skeleton is preferable because it achieves high dry etching resistance required for resists. Such a constitutional unit having an alicyclic skeleton is a constitutional unit having at least one cyclic hydrocarbon group. Such a constitutional unit is usually a group wherein a cyclic hydrocarbon group is dissociated by the action of acid.

As such a constitutional unit having an acid-dissociable group, the constitutional unit represented by the above formula (3-1-1), the constitutional unit represented by the above formula (3-2-1), and the constitutional unit represented by the above formula (3-3-1) are particularly preferable because they achieve high dry etching resistance required for resists.

In terms of sensitivity and resolution, preferred examples of $R^1$ in formula (3-1-1) may include a methyl group, an ethyl group, and an isopropyl group.

In terms of high dry etching resistance, n1 in formula (3-1-1) is preferably 0.

In terms of sensitivity and resolution, preferred examples of $R^2$ and $R^3$ in formula (3-2-1) may include a methyl group, an ethyl group, and an isopropyl group.

In terms of high dry etching resistance, n2 in formula (3-2-1) is preferably 0.

In terms of sensitivity and resolution, preferred examples of $R^4$ in formula (3-3-1) may include a methyl group, an ethyl group, and an isopropyl group.

In terms of high dry etching resistance, n3 in formula (3-3-1) is preferably 0.

In terms of high dry etching resistance, q in formula (3-3-1) is preferably 1.

In order to introduce a constitutional unit having an acid-dissociable group into a polymer, a monomer having an acid-dissociable group may be copolymerized. Such a monomer having an acid-dissociable group may be used alone or in combination, as necessary.

Specific examples of a monomer having an acid-dissociable group may include monomers represented by the following formulas (9-1) to (9-18) and (9-23). In formulas (9-1) to (9-18) and (9-23), R represents a hydrogen atom or a methyl group.

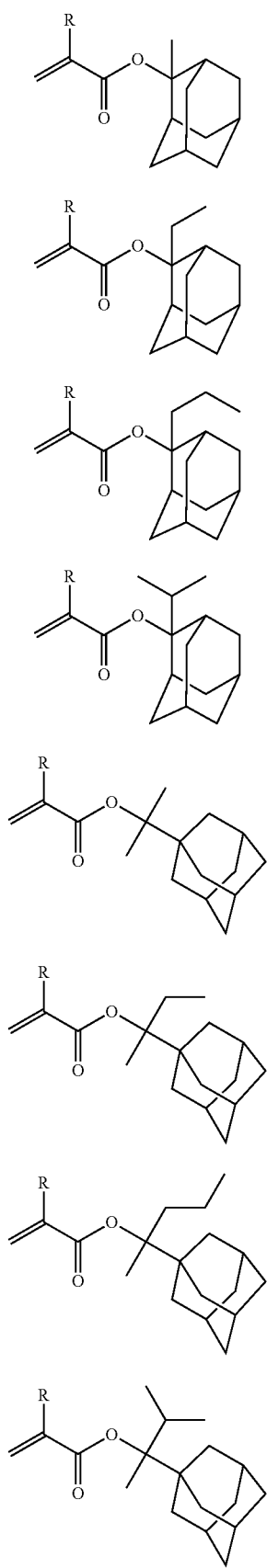
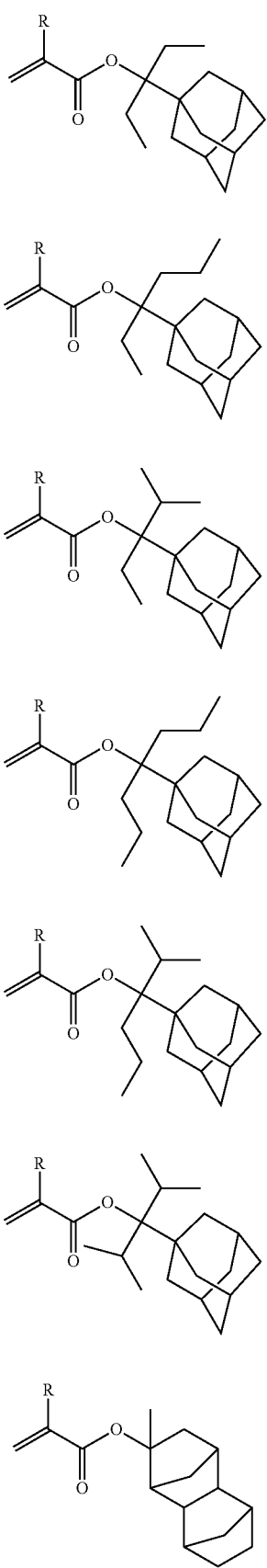

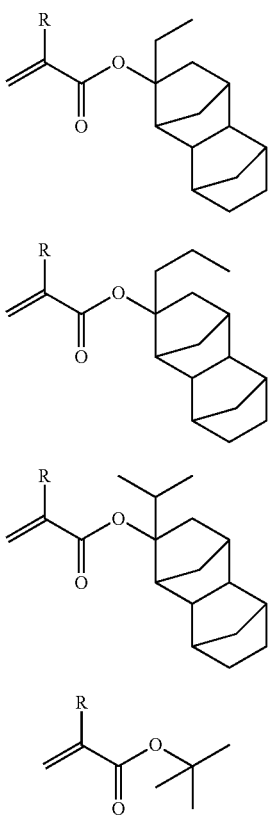

(9-16)

(9-17)

(9-18)

(9-23)

Of these, as a monomer having an acid-dissociable group, the monomer represented by the above formula (9-1), the monomer represented by the above formula (9-2), the monomer represented by the above formula (9-5), the monomer represented by the above formula (9-16), the monomer represented by the above formula (9-23), geometric isomers thereof, and optical isomers are more preferable in terms of sensitivity and resolution. Moreover, the monomer represented by the above formula (9-1) and the monomer represented by the above formula (9-2) are particularly preferable. Although the monomer represented by the above formula (9-23) is not a constitutional unit having an alicyclic skeleton, it is preferable because it can achieve high sensitivity and high resolution.

Moreover, a constitutional unit having an acid-dissociable group may also include those represented by the following formulas:

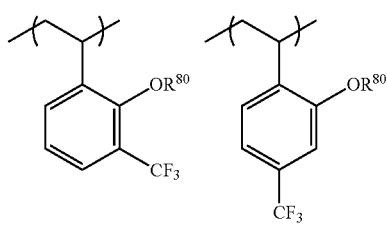

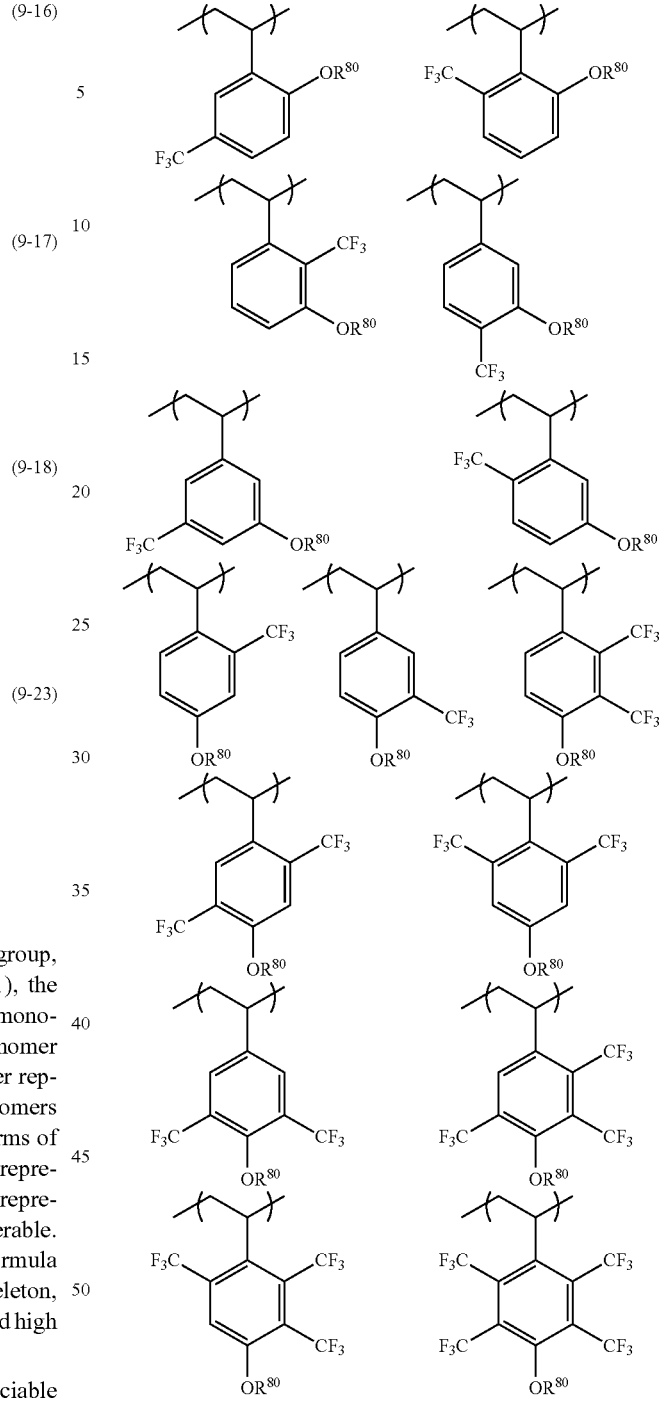

(wherein $R^{80}$ represents an acid-dissociable group.)

A constitutional unit having a lactone skeleton will be described.

When a constitutional unit having a lactone skeleton has a protecting group that is dissociated by the action of acid, it has superior sensitivity. In addition, when a constitutional unit having a lactone skeleton has a high carbon density, that is, when the ratio of the number of carbon atoms to the total number of atoms in the above constitutional unit is high, it has superior dry etching resistance.

In the present invention, the constitutional unit having a lactone skeleton is at least one selected from the group consisting of those represented by the above formulas (4-1), (4-2), (4-3), (4-5), (4-6), and (4-10). It is preferable not to contain other types of constitutional units having a lactone skeleton.

As a constitutional unit having a lactone skeleton, the constitutional unit represented by the above formula (4-1), the constitutional unit represented by the above formula (4-2), the constitutional unit represented by the above formula (4-3), the constitutional unit represented by the above formula (4-5), the constitutional unit represented by the above formula (4-6), and the constitutional unit represented by the above formula (4-10), are preferable in terms of sensitivity and dry etching resistance.

In formula (4-1), n5 is preferably 0 in terms of high dry etching resistance.

In formula (4-1), m is preferably 1 in terms of sensitivity and resolution.

In formula (4-2), each of $A^1$ and $A^2$ is preferably —O— in terms of high solubility in organic solvents.

In formula (4-2), each of $R^{201}$ and $R^{202}$ is preferably a hydrogen atom, a methyl group, an ethyl group, or an isopropyl group in terms of high solubility in organic solvents.

In formula (4-2), n6 is preferably 0 in terms of high dry etching resistance.

In formula (4-3), each of $A^3$ and $A^4$ is preferably —CH$_2$— in terms of high dry etching resistance, and it is preferably —O— in terms of high solubility in organic solvents.

In formula (4-3), each of $R^{203}$ and $R^{204}$ is preferably a hydrogen atom, a methyl group, an ethyl group, or an isopropyl group in terms of high solubility in organic solvents.

In formula (4-3), n7 is preferably 0 in terms of high dry etching resistance.

In formula (4-5), each of $R^8$ and $R^9$ is preferably a methyl group, an ethyl group, or an isopropyl group in terms of sensitivity and resolution.

In formula (4-5), each of $R^{52}$, $R^{62}$, and $R^{72}$ is preferably a hydrogen atom in terms of high solubility in organic solvents.

With regard to $Y^{12}$, $Y^{22}$, and $Y^{32}$ in formula (4-5), one is preferably —CO—O— and the remaining two are —CH$_2$—, in terms of high adhesiveness to the metal surface or the like.

In formula (4-5), n9 is preferably 0 in terms of high dry etching resistance.

In formula (4-6), $R^{10}$ is preferably a methyl group, an ethyl group, or an isopropyl group in terms of sensitivity and resolution.

In formula (4-6), each of $R^{53}$, $R^{63}$, and $R^{73}$ is preferably a hydrogen atom in terms of high solubility in organic solvents.

With regard to $Y^{13}$, $Y^{23}$, and $Y^{33}$ in formula (4-6), one is preferably —CO—O— and the remaining two are —CH$_2$—, in terms of high adhesiveness to the metal surface or the like.

In formula (4-6), n10 is preferably 0 in terms of high dry etching resistance.

In formula (4-10), each of $R^{91}$, $R^{92}$, $R^{93}$, and $R^{94}$ is preferably a hydrogen atom or a methyl group in terms of high solubility in organic solvents.

In formula (4-10), m1 is preferably 1 in terms of sensitivity and resolution.

As a constitutional unit having a lactone skeleton, the constitutional unit represented by the above formula (4-1), the constitutional unit represented by the above formula (4-2), the constitutional unit represented by the above formula (4-3), and the constitutional unit represented by the above formula (4-10), are more preferable in terms of high solubility in organic solvents and inexpensiveness. In order to achieve high sensitivity and inexpensiveness, the constitutional unit represented by the above formula (4-1) is particularly preferable. In order to achieve high dry etching resistance, the constitutional unit represented by the above formula (4-2) and the constitutional unit represented by the above formula (4-3) are particularly preferable. In order to achieve excellent heat stability and inexpensiveness, the constitutional unit represented by the above formula (4-10) is particularly preferable.

In order to introduce a constitutional unit having a lactone skeleton into a polymer, a monomer having a lactone skeleton may be copolymerized. Such a monomer having a lactone skeleton may be used alone or in combination, as necessary.

Examples of a monomer having a lactone skeleton may include a (meth)acrylic acid derivative having a δ-valerolactone ring, a (meth)acrylic acid derivative having a γ-butyrolactone ring, a (meth)acrylic acid derivative having polycyclic lactone, and a derivative having a substituent on the lactone ring of these compounds.

Specific examples of a monomer having a lactone skeleton may include monomers represented by formulas (10-1) to (10-20), (10-22) to (10-24), and (10-41) indicated below. In formulas (10-1) to (10-20), (10-22) to (10-24), and (10-41), R represents a hydrogen atom or a methyl group.

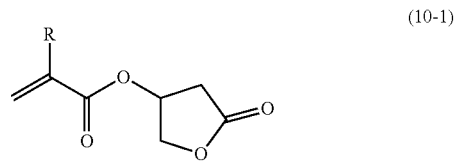

(10-1)

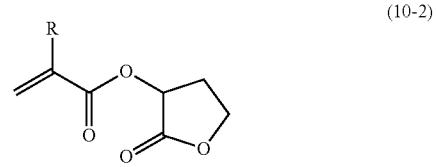

(10-2)

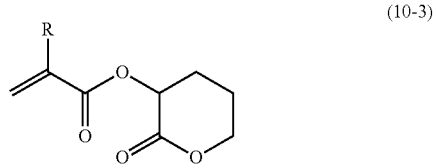

(10-3)

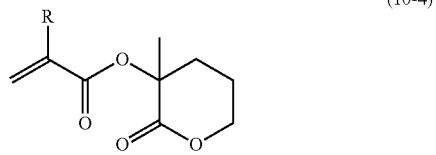

(10-4)

(10-5)

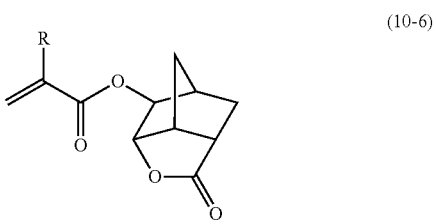

(10-6)

(10-7)
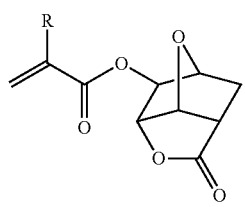
(10-8)
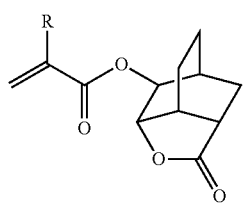
(10-9)
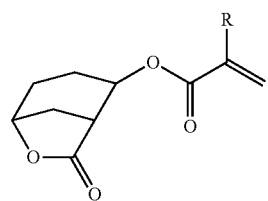
(10-10)
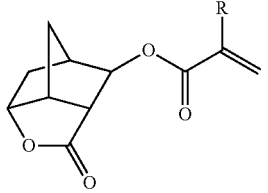
(10-11)
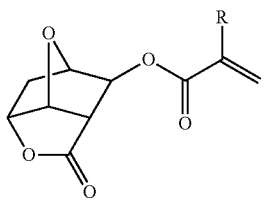
(10-12)
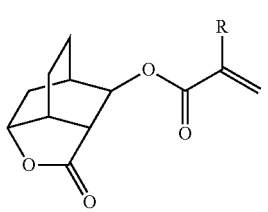
(10-13)
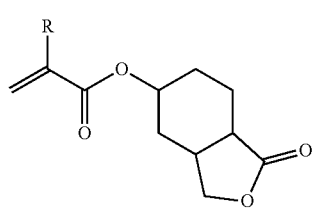
(10-14)
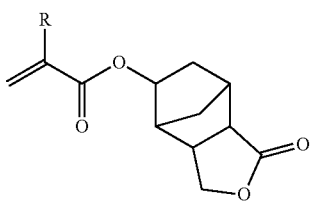
(10-15)
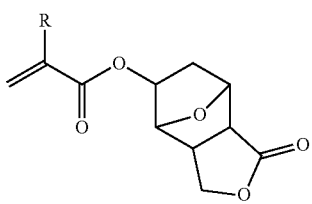
(10-16)
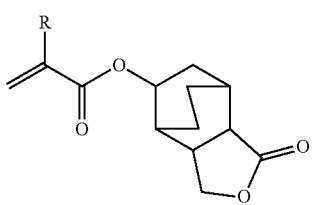
(10-17)
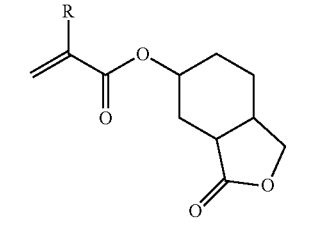
(10-18)
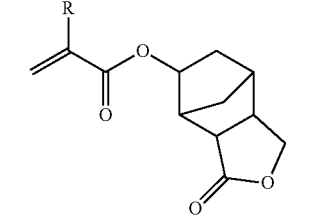
(10-19)
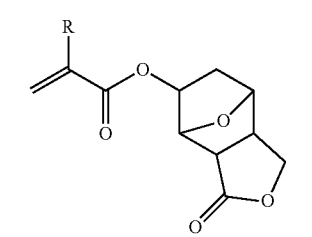
(10-20)
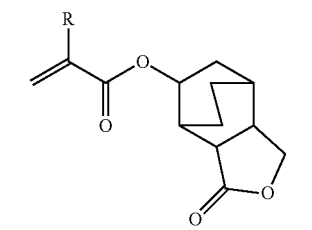

-continued (10-21)
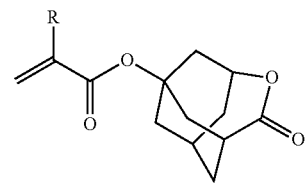

(10-22)
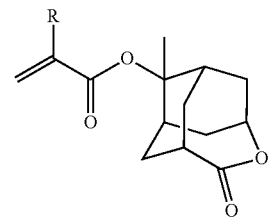

(10-23)
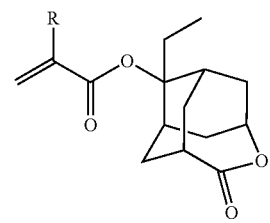

(10-24)
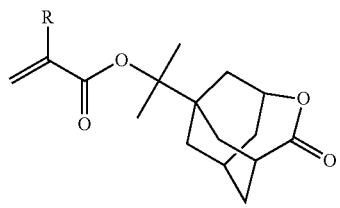

(10-41)
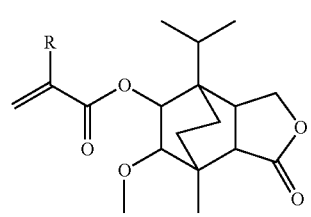

As a monomer having a lactone skeleton, the monomer represented by the above formula (10-1), the monomer represented by the above formula (10-2), the monomer represented by the above formula (10-41), and an optical isomer thereof, are more preferable in terms of sensitivity. In terms of dry etching resistance, the monomer represented by the above formula (10-6), the monomer represented by the above formula (10-10), the monomer represented by the above formula (10-14), the monomer represented by the above formula (10-18), a geometric isomer thereof, and an optical isomer thereof, are more preferable. In terms of solubility in resist solvents, the monomer represented by the above formula (10-7), the monomer represented by the above formula (10-11), the monomer represented by the above formula (10-15), the monomer represented by the above formula (10-19), a geometric isomer thereof, and an optical isomer thereof, are more preferable.

Further examples of a monomer having a lactone skeleton may include monomers represented by formulas (10-25) to (10-40) and (10-44) to (10-50) indicated below. In formulas (10-25) to (10-40) and (10-44) to (10-50), R represents a hydrogen atom or a methyl group.

(10-25)
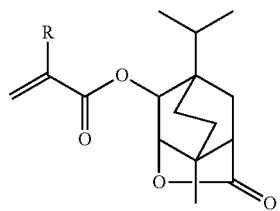

(10-26)
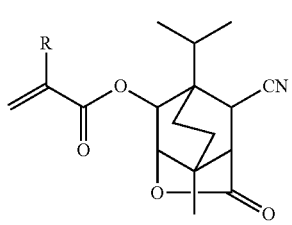

(10-27)
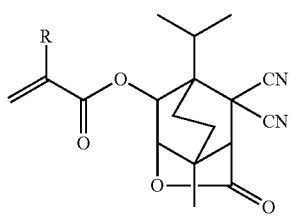

(10-28)
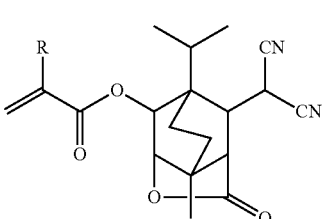

(10-29)
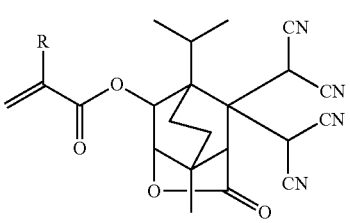

(10-30)
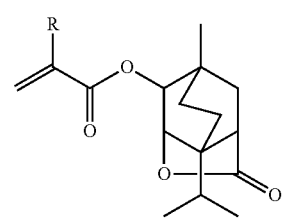

(10-31)
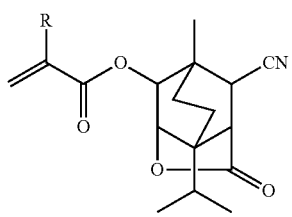

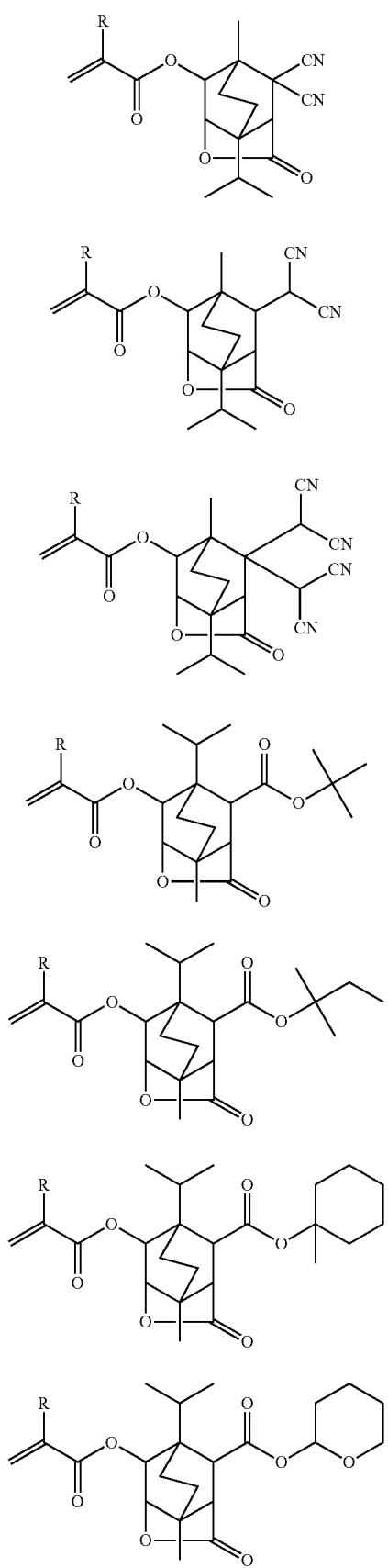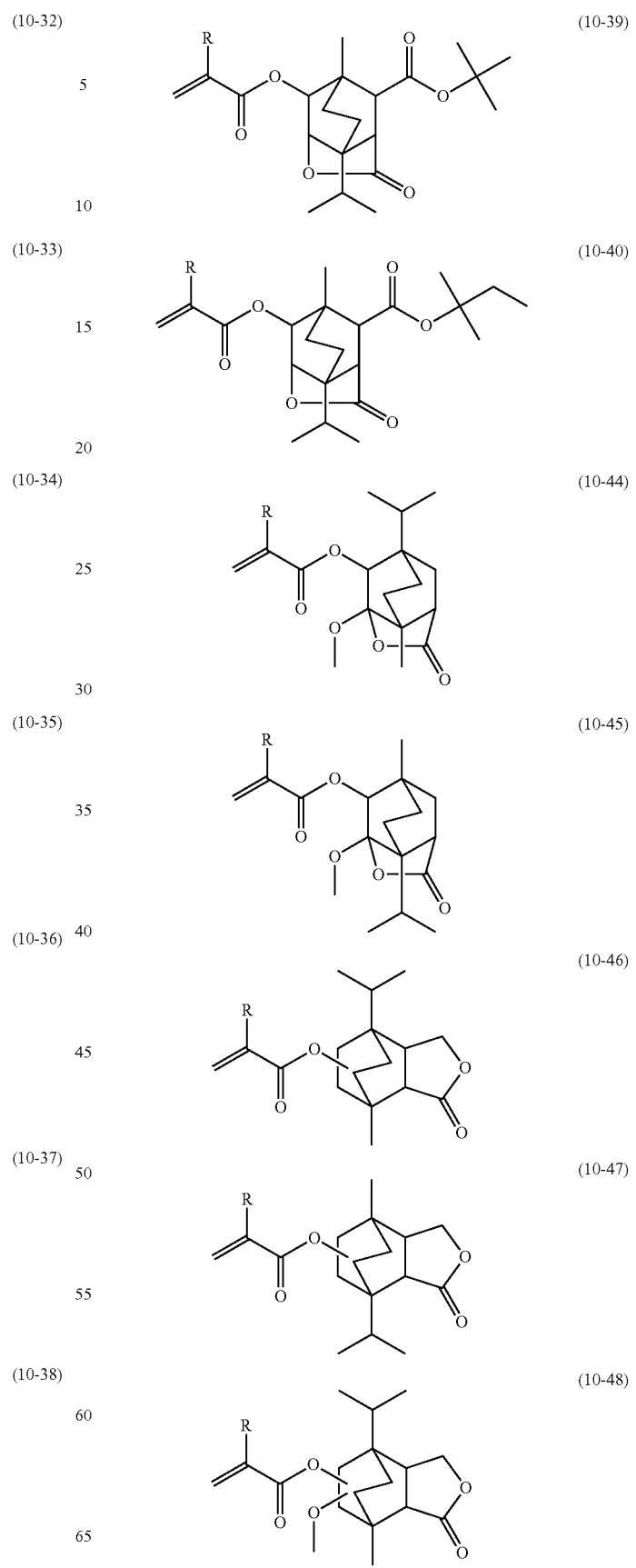

(10-49)
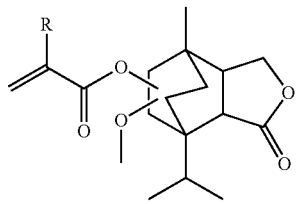

(10-50)
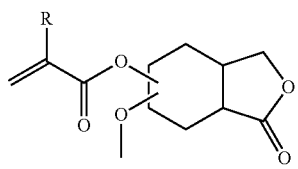

Of these, in terms of high solubility in organic solvents, the monomer represented by the above formula (10-25), a geometric isomer thereof, and an optical isomer thereof, are preferable.

Furthermore, examples of a monomer having a lactone skeleton may also include monomers represented by formulas (10-51) to (10-60) indicated below.

(10-51)
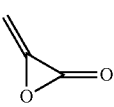

(10-52)
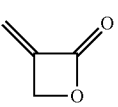

(10-53)
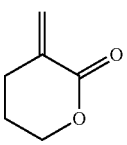

(10-54)
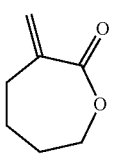

(10-55)
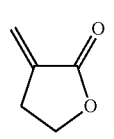

(10-56)
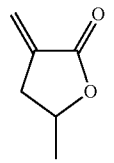

(10-57)
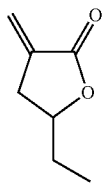

(10-58)
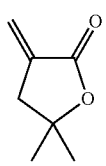

(10-59)
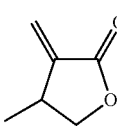

(10-60)
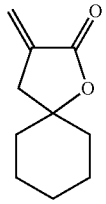

Of these, in terms of high solubility in organic solvents, the monomer represented by the above formula (10-55), the monomer represented by the above formula (10-56), the monomer represented by the above formula (10-57), and the monomer represented by the above formula (10-58), are preferable. The monomer represented by the above formula (10-58) is more preferable.

The resist polymer of the present invention may further comprise constitutional units other than those as described above. That is to say, the resist polymer of the present invention may be formed by copolymerization of copolymerizable monomers, other than a (meth)acrylic acid ester derivative containing a cyano group represented by the above formula (5), a monomer having an acid-dissociable group, and a monomer having a lactone skeleton represented by at least one selected from the group consisting of the above formulas (4-1), (4-2), (4-3), (4-5), (4-6), and (4-10).

For example, the resist polymer of the present invention may comprise a constitutional unit having an alicyclic skeleton that does not have an acid-dissociable group. Such a constitutional unit having an alicyclic skeleton has at least one cyclic hydrocarbon group. Such a constitutional unit having an alicyclic skeleton may be used alone or in combination.

A resist polymer, which contains a constitutional unit having an alicyclic skeleton, is excellent in terms of dry etching resistance. Moreover, when such a constitutional unit has a hydroxyl group, a superior resist pattern can be obtained.

As a constitutional unit having an alicyclic skeleton, a constitutional unit represented by the following formula (3-1-2) and a constitutional unit represented by the following formula (3-4) are preferable because they have high dry etching resistance required for resists:

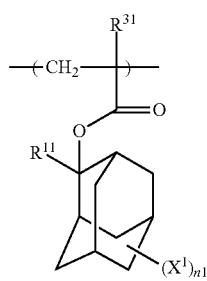

(3-1-2)

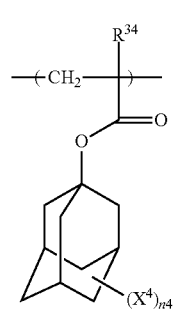

(3-4)

(wherein, in formula (3-1-2), $R^{31}$ represents a hydrogen atom or a methyl group; $R^{11}$ represents a hydrogen atom; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, a cyano group, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, and wherein, in formula (3-4), $R^{34}$ represents a hydrogen atom or a methyl group; $X^4$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n4 represents an integer between 0 and 4, and when n4 is 2 or greater, $X^4$ may be a plurality of different groups.)

In formula (3-1-2) and formula (3-4), positions substituted with $X^1$ and $X^4$ may be any positions in the cyclic structure.

In formula (3-1-2), n1 is preferably 0 in order to achieve high dry etching resistance, and it is preferably 1 in order to achieve a good resist pattern.

When n1 is 1 or greater, $X^1$ is preferably a hydroxy group in order to achieve a good resist pattern.

In formula (3-4), n4 is preferably 0 in order to achieve high dry etching resistance, and it is preferably 1 in order to achieve a good resist pattern.

When n4 is 1 or greater, $X^4$ is preferably a hydroxy group in order to achieve a good resist pattern.

In order to introduce a constitutional unit having an alicyclic skeleton into a polymer, a monomer having an alicyclic skeleton may be copolymerized. Such a monomer having an alicyclic skeleton may be used alone or in combination, as necessary.

Preferred examples of a monomer having an alicyclic skeleton may include cyclohexyl(meth)acrylate, isobornyl(meth)acrylate, adamantyl (meth)acrylate, tricyclodecanyl(meth)acrylate, dicyclopentadienyl (meth)acrylate, and derivatives having substituents on cyclic hydrocarbon groups of these compounds.

Specific examples of a monomer having an alicyclic skeleton may include monomers represented by formulas (9-19) to (9-22) indicated below. In formulas (9-19) to (9-22), R represents a hydrogen atom or a methyl group.

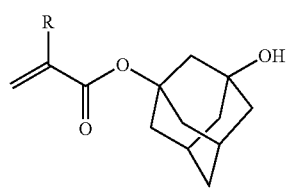

(9-19)

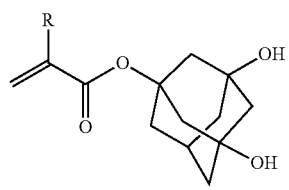

(9-20)

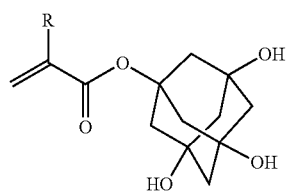

(9-21)

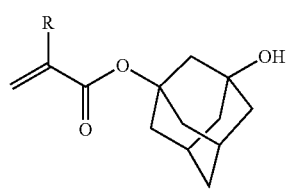

(9-22)

Moreover, examples of copolymerizable monomers other than those as described above may include:

(meth)acrylic acid esters with a linear or branched structure, such as methyl (meth)acrylate, ethyl (meth)acrylate, 2-ethylhexyl(meth)acrylate, n-propyl (meth)acrylate, isopropyl(meth)acrylate, butyl (meth)acrylate, isobutyl (meth)acrylate, t-butyl (meth)acrylate, methoxymethyl (meth)acrylate, n-propoxyethyl (meth)acrylate, i-propoxyethyl (meth)acrylate, n-butoxyethyl (meth)acrylate, i-butoxyethyl (meth)acrylate, t-butoxyethyl (meth)acrylate, 2-hydroxyethyl (meth)acrylate, 3-hydroxypropyl (meth)acrylate, 2-hydroxy-n-propyl (meth)acrylate, 4-hydroxy-n-butyl (meth)acrylate, 2-ethoxyethyl (meth)acrylate, 1-ethoxyethyl (meth)acrylate, 2,2,2-trifluoroethyl (meth)acrylate, 2,2,3,3-tetrafluoro-n-propyl(meth)acrylate, 2,2,3,3,3-pentafluoro-n-propyl (meth) acrylate, methyl α-(tri)fluoromethylacrylate, ethyl α-(tri)fluoromethylacrylate, 2-ethylhexyl α-(tri)fluoromethylacrylate, n-propyl α-(tri)fluoromethylacrylate, i-propyl α-(tri)fluoromethylacrylate, n-butyl α-(tri)fluoromethylacrylate, i-butyl α-(tri)fluoromethylacrylate, t-butyl α-(tri)fluoromethylacrylate, methoxymethyl α-(tri)fluoromethylacrylate, ethoxyethyl α-(tri)fluoromethylacrylate, n-propoxyethyl α-(tri)fluoromethylacrylate, i-propoxyethyl α-(tri)fluoromethylacrylate, n-butoxyethyl α-(tri)fluoromethylacrylate, i-butoxyethyl α-(tri)fluoromethylacrylate, or t-butoxyethyl α-(tri)fluoromethylacrylate;

aromatic alkenyl compounds, such as styrene, α-methylstyrene, vinyltoluene, p-hydroxystyrene, p-t-butoxycarbonylhydroxystyrene, 3,5-di-t-butyl-4-hydroxystyrene, 3,5-dimethyl-4-hydroxystyrene, p-t-perfluorobutylstyrene, or p-(2-hydroxy-i-propyl)styrene;

unsaturated carboxylic acids and carboxylic anhydrides, such as acrylic acid, methacrylic acid, maleic acid, maleic anhydride, itaconic acid, or itaconic anhydride; and ethylene, propylene, norbornene, tetrafluoroethylene, acrylamide, N-methylacrylamide, N,N-dimethylacrylamide, vinyl chloride, ethylene, vinyl fluoride, vinylidene fluoride, tetrafluoroethylene, and vinylpyrrolidone. These monomers may be used alone or in combination, as necessary.

Other monomers may be used within a range that does not significantly impair the effects of the present invention. In general, other monomers may preferably be used within a range of 20% or less by mole based on the total monomer components.

In the resist polymer of the present invention, as a constitutional unit represented by the above formula (1), at least one selected from the group consisting of the constitutional units represented by the above formula (2) and (1-1) is preferable. As a constitutional unit having an acid-dissociable group, at least one selected from the group consisting of the constitutional units represented by the above formulas (3-1-1), (3-3-1), and (3-5) is preferable. As a constitutional unit having a lactone skeleton, at least one selected from the group consisting of the constitutional units represented by the above formulas (4-2), (4-3), (4-7), (4-8), (4-9), and (4-11) is preferable.

Taking into consideration resist pattern, suppression of line edge roughness and microgels, sensitivity, resolution, adhesiveness to the metal surface, and high solubility in organic solvents, a polymer, which comprises at least one constitutional unit selected from the group consisting of those represented by the above formulas (2) and (1-1), at least one constitutional unit selected from the group consisting of those represented by the above formulas (3-1-1), (3-3-1), and (3-5), and at least one constitutional unit represented by formula (4-7) indicated below, is preferable as the resist polymer of the present invention.

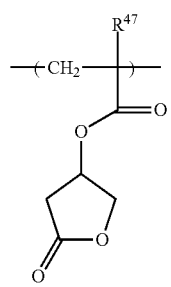

(4-7)

(wherein, in formula (4-7), $R^{47}$ represents a hydrogen atom or a methyl group.)

In this polymer, at least one constitutional unit selected from the group consisting of those represented by the above formulas (2) and (1-1), at least one constitutional unit selected from the group consisting of those represented by the above formulas (3-1-1), (3-3-1), and (3-5), and the constitutional unit represented by the above formula (4-7), are not necessarily all the same, but may be a mixture of two or more kinds thereof, as long as they can be represented by general formulas as described above. In addition, in this polymer, each constitutional unit may have any given sequence. Accordingly, this polymer may be a random copolymer, an alternating copolymer, or a block copolymer.

The total ratio of at least one constitutional unit selected from those represented by the above formulas (2) and (1-1) in the polymer is preferably between 5% and 30% by mole, in terms of resist pattern and suppression of line edge roughness and microgels. In addition, the total ratio of at least one constitutional unit selected from the group consisting of those represented by the above formulas (3-1-1), (3-3-1), and (3-5) in the polymer is preferably between 30% and 60% by mole, in terms of sensitivity and resolution. Moreover, the total ratio of the constitutional unit represented by the above formula (4-7) in the polymer is preferably between 30% and 60% by mole, in terms of adhesiveness to the metal surface or the like and high solubility in organic solvents.

As the resist polymer of the present invention, a polymer, which comprises at least one constitutional unit selected from the group consisting of those represented by the above formulas (2) and (1-1), at least one constitutional unit selected from the group consisting of those represented by the above formulas (3-1-1), (3-3-1), and (3-5), and at least one constitutional unit represented by formula (4-8) indicated below, is preferable, in terms of resist pattern, suppression of line edge roughness and microgels, sensitivity, resolution, adhesiveness to the metal surface, and high solubility in organic solvents.

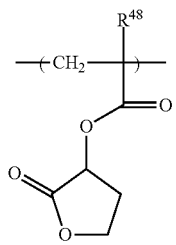

(4-8)

(wherein, in formula (4-8), $R^{48}$ represents a hydrogen atom or a methyl group.)

In this polymer, at least one constitutional unit selected from the group consisting of those represented by the above formulas (2) and (1-1), at least one constitutional unit selected from the group consisting of those represented by the above formulas (3-1-1), (3-3-1), and (3-5), and the constitutional unit represented by the above formula (4-8), are not necessarily all the same, but may be a mixture of two or more kinds thereof, as long as they can be represented by general formulas as described above. In addition, in this polymer, each constitutional unit may have any given sequence. Accordingly, this polymer may be a random copolymer, an alternating copolymer, or a block copolymer.

The total ratio of at least one constitutional unit selected from those represented by the above formulas (2) and (1-1) in the polymer is preferably between 5% and 30% by mole, in terms of resist pattern and suppression of line edge roughness and microgels. In addition, the total ratio of at least one constitutional unit selected from the group consisting of those represented by the above formulas (3-1-1), (3-3-1), and (3-5) in the polymer is preferably between 30% and 60% by mole, in terms of sensitivity and resolution. Moreover, the total ratio of the constitutional unit represented by the above formula (4-8) in the polymer is preferably between 30% and 60% by mole, in terms of adhesiveness to the metal surface or the like and high solubility in organic solvents.

As the resist polymer of the present invention, a polymer, which comprises at least one constitutional unit selected from the group consisting of those represented by the above formulas (2) and (1-1), at least one constitutional unit selected from the group consisting of those represented by the above formulas (3-1-1), (3-3-1), and (3-5), and at least one constitutional unit represented by formula (4-11) indicated below, is preferable, in terms of resist pattern, suppression of line edge roughness and microgels, sensitivity, resolution, adhesiveness to the metal surface, and high solubility in organic solvents.

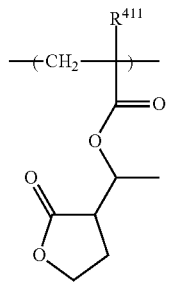

(4-11)

(wherein, in formula (4-11), $R^{411}$ represents a hydrogen atom or a methyl group.)

In this polymer, at least one constitutional unit selected from the group consisting of those represented by the above formulas (2) and (1-1), at least one constitutional unit selected from the group consisting of those represented by the above formulas (3-1-1), (3-3-1), and (3-5), and the constitutional unit represented by the above formula (4-11), are not necessarily all the same, but may be a mixture of two or more kinds thereof, as long as they can be represented by general formulas as described above. In addition, in this polymer, each constitutional unit may have any given sequence. Accordingly, this polymer may be a random copolymer, an alternating copolymer, or a block copolymer.

The total ratio of at least one constitutional unit selected from those represented by the above formulas (2) and (1-1) in the polymer is preferably between 5% and 30% by mole, in terms of resist pattern and suppression of line edge roughness and microgels. In addition, the total ratio of at least one constitutional unit selected from the group consisting of those represented by the above formulas (3-1-1), (3-3-1), and (3-5) in the polymer is preferably between 30% and 60% by mole, in terms of sensitivity and resolution. Moreover, the total ratio of the constitutional unit represented by the above formula (4-11) in the polymer is preferably between 30% and 60% by mole, in terms of adhesiveness to the metal surface or the like and high solubility in organic solvents.

As the resist polymer of the present invention, a polymer, which comprises at least one constitutional unit selected from the group consisting of those represented by the above formulas (2) and (1-1), at least one constitutional unit selected from the group consisting of those represented by the above formulas (3-1-1), (3-3-1), and (3-5), and at least one constitutional unit represented by formula (4-9) indicated below, is preferable, in terms of resist pattern, suppression of line edge roughness and microgels, sensitivity, resolution, adhesiveness to the metal surface, and high solubility in organic solvents.

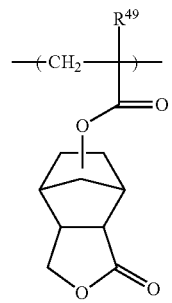

(4-9)

(wherein, in formula (4-9), $R^{49}$ represents a hydrogen atom or a methyl group.)

In this polymer, at least one constitutional unit selected from the group consisting of those represented by the above formulas (2) and (1-1), at least one constitutional unit selected from the group consisting of those represented by the above formulas (3-1-1), (3-3-1), and (3-5), and the constitutional unit represented by the above formula (4-9), are not necessarily all the same, but may be a mixture of two or more kinds thereof, as long as they can be represented by general formulas as described above. In addition, in this polymer, each constitutional unit may have any given sequence. Accordingly, this polymer may be a random copolymer, an alternating copolymer, or a block copolymer.

The total ratio of at least one constitutional unit selected from those represented by the above formulas (2) and (1-1) in the polymer is preferably between 5% and 30% by mole, in terms of resist pattern and suppression of line edge roughness and microgels. In addition, the total ratio of at least one constitutional unit selected from the group consisting of those represented by the above formulas (3-1-1), (3-3-1), and (3-5) in the polymer is preferably between 30% and 60% by mole, in terms of sensitivity and resolution. Moreover, the total ratio of the constitutional unit represented by the above formula (4-9) in the polymer is preferably between 30% and 60% by mole, in terms of adhesiveness to the metal surface or the like and high solubility in organic solvents.

As the resist polymer of the present invention, a polymer, which comprises at least one constitutional unit selected from the group consisting of those represented by the above formulas (2) and (1-1), at least one constitutional unit selected from the group consisting of those represented by the above formulas (3-1-1), (3-3-1), and (3-5), and at least one constitutional unit selected from the group consisting of those represented by the above formulas (4-2) and (4-3), is preferable, in terms of resist pattern, suppression of line edge roughness and microgels, sensitivity, resolution, adhesiveness to the metal surface, and high dry etching resistance.

In this polymer, at least one constitutional unit selected from the group consisting of those represented by the above formulas (2) and (1-1), at least one constitutional unit selected from the group consisting of those represented by the above formulas (3-1-1), (3-3-1), and (3-5), and at least one constitutional unit selected from the group consisting of those represented by the above formulas (4-2) and (4-3), are not necessarily all the same, but may be a mixture of two or more kinds thereof, as long as they can be represented by general formulas as described above. In addition, in this polymer, each constitutional unit may have any given sequence. Accordingly, this polymer may be a random copolymer, an alternating copolymer, or a block copolymer.

The total ratio of at least one constitutional unit selected from those represented by the above formulas (2) and (1-1) in the polymer is preferably between 5% and 30% by mole, in terms of resist pattern and suppression of line edge roughness and microgels. In addition, the total ratio of at least one constitutional unit selected from the group consisting of those represented by the above formulas (3-1-1), (3-3-1), and (3-5) in the polymer is preferably between 30% and 60% by mole, in terms of sensitivity and resolution. Moreover, the total ratio of at least one constitutional unit selected from the group consisting of those represented by the above formulas (4-2) and (4-3) in the polymer is preferably between 30% and 60% by mole, in terms of adhesiveness to the metal surface or the like and high dry etching resistance.

The mass average molecular weight of the resist polymer of the present invention is not particularly limited. In terms of dry etching resistance and resist pattern, it is preferably 1,000 or greater, more preferably 2,000 or greater, and particularly preferably 4,000 or greater. In addition, in terms of solubility in a resist solution and resolution, the mass average molecular weight of the resist polymer of the present invention is preferably 100,000 or less, more preferably 50,000 or less, and particularly preferably 30,000 or less. Moreover, depending on the type of a constitutional unit having a lactone skeleton contained in the resist polymer of the present invention, when the polymer of the present invention contains a constitutional unit derived from 2-exo-methacryloyloxy-4-oxatricyclo[4.2.1.0$^{3,7}$]nonan-5-one (which may also be referred to as OTNMA) for example, the mass average molecular weight thereof is more preferably 8,000 or less, in terms of solubility in a resist solution and resist pattern.

As stated above, in recent years, a resist polymer, which can achieve a uniform resist pattern size, having a small degree of deviation on the surface of a large substrate with a diameter of 300 mm or greater and a small degree of PEB temperature dependence, has been required.

From such a viewpoint, the mass average molecular weight of the resist polymer of the present invention is preferably between 5,000 and 8,000. More preferably, the upper limit thereof is 7,000 or less.

Moreover, from such a viewpoint, as the resist polymer of the present invention, a polymer, which comprises at least one constitutional unit represented by the above formula (1), at least one constitutional unit selected from the group consisting of those represented by the above formulas (3-1-1), (3-2-1), and (3-3-1), and at least one constitutional unit selected from the group consisting of those represented by the above formulas (4-7) and (4-8), is preferable. Such a polymer exhibits particularly small PEB temperature dependence in ordinary lithography, and a uniform resist pattern size with a particularly small degree of variation can be obtained even on the surface of a large substrate with a diameter of 300 mm or greater.

In this polymer, the constitutional unit represented by the above formula (1), at least one constitutional unit selected from the group consisting of those represented by the above formulas (3-1-1), (3-2-1), and (3-3-1), and at least one constitutional unit selected from the group consisting of those represented by the above formulas (4-7) and (4-8), are not necessarily all the same, but may be a mixture of two or more kinds thereof, as long as they can be represented by general formulas as described above. In addition, in this polymer, each constitutional unit may have any given sequence. Accordingly, this polymer may be a random copolymer, an alternating copolymer, or a block copolymer.

The total ratio of the constitutional unit represented by the above formula (1) in the polymer is preferably between 5% and 30% by mole. In addition, the total ratio of at least one constitutional unit selected from the group consisting of those represented by the above formulas (3-1-1), (3-2-1), and (3-3-1) in the polymer is preferably between 30% and 60% by mole. Moreover, the total ratio of at least one constitutional unit selected from the group consisting of those represented by the above formulas (4-7) and (4-8) in the polymer is preferably between 30% and 60% by mole. By adjusting the ratios of constitutional units within the above ranges, higher effects can be obtained from the present invention.

Among others, a polymer comprising at least one constitutional unit represented by the above formula (2), at least one constitutional unit represented by the above formula (3-1-1), and at least one constitutional unit represented by the above formula (4-8) is preferable. Such a polymer exhibits further smaller PEB temperature dependence in ordinary lithography, and a more uniform resist pattern size can be obtained even on the surface of a large substrate with a diameter of 300 mm or greater.

Moreover, in this polymer also, the constitutional unit represented by the above formula (2), the constitutional unit represented by the above formula (3-1-1), and the constitutional unit represented by the above formula (4-8), are not necessarily all the same, but may be a mixture of two or more kinds thereof, as long as they can be represented by general formulas as described above. In addition, in this polymer, each constitutional unit may have any given sequence. Accordingly, this polymer may be a random copolymer, an alternating copolymer, or a block copolymer.

In this case also, the total ratio of the constitutional unit represented by the above formula (2) in the polymer is preferably between 5% and 30% by mole. In addition, the total ratio of the constitutional unit represented by the above formula (3-1-1) in the polymer is preferably between 30% and 60% by mole. Moreover, the total ratio of the constitutional unit represented by the above formulas (4-8) in the polymer is preferably between 30% and 60% by mole. By adjusting the ratios of constitutional units within the above ranges, much higher effects can be obtained from the present invention.

In this polymer, as a constitutional unit represented by the above formula (3-1-1), a constitutional unit derived from 2-lower alkyl-2-adamantyl (meth)acrylate such as 2-methyl-2-adamantyl(meth)acrylate or 2-ethyl-2-adamantyl(meth)acrylate is preferable.

Moreover, a polymer is allowed to contain a constitutional unit derived from a chain transfer agent by using such a chain transfer agent during polymerization. When the resist polymer of the present invention contains a constitutional unit derived from a chain transfer agent, it may have higher effects.

Specific examples of a chain transfer agent that is preferably used herein may include 1-butanethiol, 1-octanethiol (n-octyl mercaptan), cyclohexanethiol, 2-butanethiol, 1-decanethiol, 1-tetradecanethiol, 2-methyl-1-propanethiol, 2-mercaptoethanol, and 1-thioglycerol.

In this case, generally, the amount of a chain transfer agent that is used when the resist polymer of the present invention is produced is preferably 0.001% or more by mole, more preferably 0.1% or more by mole, and particularly preferably 1% or more by mole, based on the total amount of monomers used for polymerization. In addition, the amount of a chain transfer agent that is used when the resist polymer of the present invention is produced is preferably 5% or less by mole, and more preferably 2% or less by mole, based on the total amount of monomers used for polymerization.

The polymer of the present invention may be a random copolymer, an alternating copolymer, or a block copolymer.

3. Method of Producing the Resist Polymer of the Present Invention

The resist polymer of the present invention is usually obtained by copolymerization of a monomer composition comprising at least one (meth)acrylic acid ester derivative having a cyano group represented by the above formula (5), at least one monomer having an acid-dissociable group, and at least one monomer having a lactone skeleton, in the presence of a polymerization initiator. In such polymerization using a polymerization initiator, a radical form of the polymerization initiator is first generated. Thereafter, using this radical form as an origin, chain polymerization of monomers progresses.

As a polymerization initiator used for the production of the resist polymer of the present invention, an initiator that efficiently generates radicals as a result of heating is preferable. Examples of such a polymerization initiator may include: azo compounds such as 2,2'-azobisisobutyronitrile, dimethyl-2,2'-azobisisobutyrate, or 2,2'-azobis[2-(2-imidazolin-2-yl)propane]; and organic peroxides such as 2,5-dimethyl-2,5-bis(tert-butylperoxy)hexane. When a resist polymer used in ArF excimer laser (wavelength: 193 nm) lithography is produced, a polymerization initiator that does not have an aromatic ring in a molecular structure thereof is preferably used, in order to minimize the reduction of the light transmittance of the obtained resist polymer (transmittance of a light with a wavelength of 193 nm). Moreover, taking into consideration the safety during the polymerization or the like, a polymerization initiator whose 10 hours half-life temperature is 60° C. or more is preferably used.

When the resist polymer of the present invention is produced, a chain transfer agent may be used. Using such a chain transfer agent, the amount of a polymerization initiator can be decreased when a polymer with a low molecular weight is produced. In addition, the molecular weight distribution of the obtained polymer can be reduced. Such reduction of the molecular weight distribution is caused by a decrease in generation of a polymer with a high molecular weight. Thus, when the obtained polymer is used for resists, its solubility in a resist solvent is further improved, and generation of microgels or defects is preferably decreased.

Preferred examples of a chain transfer agent may include 1-butanethiol, 2-butanethiol, 1-octanethiol, 1-decanethiol, 1-tetradecanethiol, cyclohexanethiol, 2-methyl-1-propanethiol, 2-mercaptoethanol, and 1-thioglycerol.

During a polymerization reaction, a polymer having radicals at the growth termini thereof are generated. When a chain transfer agent is used, such a radical at this growth terminus take a hydrogen atom contained in the chain transfer agent, and a polymer with inactivated growth termini is thereby generated. On the other hand, the chain transfer agent that has lost hydrogen atom becomes structure having a radical, namely, radical species. Starting from such a radical species, chain polymerization of monomers is carried out again. Accordingly, the obtained polymer has chain transfer residues at the termini thereof. When a resist polymer used in ArF excimer laser (wavelength: 193 nm) lithography is produced, in order to minimize the reduction of the light transmittance of the obtained resist polymer (transmittance of a light with a wavelength of 193 nm), a chain transfer agent that does not have an aromatic ring is preferably used:

The amount of a polymerization initiator used is not particularly limited. In order to increase the yield of copolymers, the amount is preferably 0.3% or more by mole based on the total amount of monomers used for copolymerization. In order to narrow the molecular weight distribution of copolymers, the amount is preferably 30% or less by mole based on the total amount of monomers used for copolymerization. Moreover, the amount of a polymerization initiator used is more preferably 0.1% or more by mole, and particularly preferably 1% or more by mole, based on the total amount of monomers used for copolymerization.

The amount of a chain transfer agent used is not particularly limited. In order to narrow the molecular weight distribution of copolymers, the amount is preferably 0.001% or more by mole, and more preferably 0.1% or more by mole, based on the total amount of monomers used for copolymerization. In order not to decrease resist performance such as sensitivity, resolution, or adhesiveness to the metal surface or the like, when the obtained copolymers are used as resist compositions, the above amount is preferably 30% or less by mole based on the total amount of monomers used for copolymerization. Moreover, when the resist polymer of the present invention is produced, the amount of a chain transfer agent used is more preferably 5% or less by mole, and particularly preferably 2% or less by mole, based on the total amount of monomers used for copolymerization.

A method of producing the polymer of the present invention is not particularly limited. The production of the polymer of the present invention is generally carried out by solution polymerization. A polymerization method that is called "dropping polymerization," which comprises addition of monomers dropwise to a polymerization reactor, is preferable. Among others, it is preferable that the polymer of the present invention be produced by a polymerization method that is called "dropping polymerization," which conducts polymerization while adding to a polymerization reactor monomers that will become constitutional units of a polymer of interest as a result of polymerization (which may be either monomers alone, or a solution obtained by dissolving monomers in an organic solvent), since a polymer with narrow composition distribution and/or narrow molecular weight distribution can easily be obtained by the above method.

In such a dropping polymerization method, for example, an organic solvent has previously been added to a polymerization reactor, it is then heated to a predetermined polymerization temperature. Thereafter, a monomer solution obtained by dissolving monomers, a polymerization initiator, and as necessary a chain transfer agent, in an organic solvent, is added dropwise to an organic solvent placed in the polymerization reactor. Such monomers may be added without being dissolved in an organic solvent. In such a case, a solution obtained by dissolving a polymerization initiator and as necessary a chain transfer agent in monomers is added dropwise to the organic solvent. Otherwise, it is also possible to add monomers dropwise to the polymerization reactor without previously adding an organic solvent to the reactor.

Monomers, a polymerization initiator, and a chain transfer agent may be added dropwise, singly or in any given combination.

A polymerization temperature applied in the dropping polymerization method is not particularly limited. In general, it is preferably between 50° C. and 150° C.

As an organic solvent used in the dropping polymerization method, a solvent, which is capable of dissolving all of monomers used, a polymerization initiator used, the obtained polymer, and a chain transfer agent if such a chain transfer agent is used, is preferably used. Examples of such an organic solvent may include 1,4-dioxane, isopropyl alcohol, acetone, tetrahydrofuran (hereinafter referred to as "THE" at times), methyl ethyl ketone (hereinafter referred to as "MEK" at time), methyl isobutyl ketone (hereinafter referred to as "MIBK" at times), γ-butyrolactone, propylene glycol monomethylether acetate (hereinafter referred to as "PGMEA" at times), and ethyl lactate.

The concentration of monomers contained in a monomer solution that is to be added dropwise to an organic solvent is not particularly limited, but it is preferably within a range between 5% and 50% by mass.

The amount of organic solvent that is to be added to a polymerization reactor is not particularly limited and may be determined as appropriate. Generally, it is used within a range between 30% and 700% by mass based on the total amount of monomers used for copolymerization.

A polymer solution produced by methods such as solution polymerization is diluted with a good solvent such as 1,4-dioxane, acetone, THF, MEK, MIBK, γ-butyrolactone, PGMEA, or ethyl lactate, to an appropriate viscosity, as necessary. Thereafter, the resultant is added dropwise to a large amount of poor solvent such as methanol or water, so as to precipitate a polymer. This process is generally called reprecipitation, and it is extremely effective for eliminating unreacted monomers or a polymerization initiator remaining in the polymerization solution. If these unreacted products remained as are, they would affect resist performance. Thus, it is preferable to eliminate as many unreacted products as possible. The reprecipitation process is unnecessary in some cases. Subsequently, the precipitate was collected by filtration, and it is then sufficiently dried, so as to obtain the polymer of the present invention. Otherwise, it is also possible to directly use wet powders after filtration without being dried.

Moreover, the produced copolymer solution may be used, directly, or as a resist composition after being diluted with an appropriate solvent. In this case, additives such as a preservative may be added as appropriate.

4. The Resist Composition of the Present Invention

The resist composition of the present invention is obtained by dissolving the above-described resist polymer of the present invention in a solvent. In addition, the chemically amplified resist composition of the present invention is obtained by dissolving the above-described resist polymer of the present invention and a photoacid generator in a solvent. The resist polymer of the present invention may be used alone or in combination. Moreover, it is possible to directly use this polymer solution for a resist composition, without separating polymers from the solution, or it is also possible to dilute this polymer solution with an appropriate solvent, so as to use for a resist composition.

With regard to the resist composition of the present invention, a solvent in which the resist polymer of the present invention is dissolved is arbitrarily selected depending on purpose. Such selection of a solvent, however, may be restricted by reasons other than solubility of resin, such as uniformity of a film coated, appearance, or safety.

Examples of such solvents may include: linear or branched ketones such as methyl ethyl ketone, methyl isobutyl ketone, 2-pentanone, or 2-hexanone; cyclic ketones such as cyclopentanone or cyclohexanone; propylene glycol monoalkyl acetates such as propylene glycol monomethyl ether acetate or propylene glycol monoethyl ether acetate; ethylene glycol monoalkyl ether acetates such as ethylene glycol monomethyl ether acetate or ethylene glycol monoethyl ether acetate; propylene glycol monoalkyl ethers such as propylene glycol monomethyl ether or propylene glycol monoethyl ether; ethylene glycol monoalkyl ethers such as ethylene glycol monomethyl ether, ethylene glycol monoethyl ether, or ethylene glycol monoisopropyl ether; diethylene glycol alkyl ethers such as diethylene glycol dimethyl ether, diethylene glycol monomethyl ether, or diethylene glycol diethyl ether; esters such as ethyl acetate or ethyl lactate; alcohols such as n-propyl alcohol, isopropyl alcohol, n-butyl alcohol, tert-butyl alcohol, cyclohexanol, or 1-octanol; 1,4-dioxane, ethylene carbonate, and γ-butyrolactone. These solvents may be used alone or in combination.

The content of a solvent is generally 200 parts or more by mass, and more preferably 300 parts or more by mass, based on 100 parts by mass of a resist polymer (the polymer of the present invention). In addition, the content of a solvent is generally 5,000 parts or less by mass, and more preferably 2,000 parts or less by mass, based on 100 parts by mass of a resist polymer (the polymer of the present invention).

When the resist polymer of the present invention is used for a chemically amplified resist, it is necessary to use a photoacid generator.

A photoacid generator contained in the chemically amplified resist composition of the present invention may arbitrarily be selected from those that can be used as an acid generator for chemically amplified resist compositions. Such a photoacid generator may be used alone or in combination.

Examples of such a photoacid generator may include onium salt compounds, sulfone imide compounds, sulfone compounds, sulfonate compounds, quinone diazide compounds, and diazomethane compounds. Of these, onium salt compounds such as a sulfonium salt, an iodonium salt, a phosphonium salt, a diazonium salt, and a pyridinium salt are preferable as a photoacid generator. Specific examples of the onium salt compounds may include triphenyl sulfonium triflate, triphenyl sulfonium hexafluoroantimonate, triphenyl sulfonium naphthalenesulfonate, (hydroxyphenyl)benzylmethyl sulfonium toluenesulfonate, diphenyl iodonium triflate, diphenyl iodonium pyrenesulfonate, diphenyl iodonium dodecylbenzenesulfonate, diphenyl iodonium hexafluoroantimonate, p-methyl phenyl diphenyl sulfonium nonafluorobutanesulfonate, and tri(tert-butylphenyl) sulfonium trifluoromethanesulfonate.

The content of a photoacid generator is determined as appropriate, depending on the type of a photoacid generator selected. It is generally 0.1 parts or more by mass, and more preferably 0.5 parts or more by mass, based on 100 parts by mass of a resist polymer (the polymer of the present invention). By setting the content of a photoacid generator in the above range, a chemical reaction is sufficiently promoted by the catalytic action of acid generated as a result of light exposure. In addition, the content of a photoacid generator is generally 20 parts or less by mass, and more preferably 10 parts or less by mass, based on 100 parts by mass of a resist polymer (the polymer of the present invention). By setting the content of a photoacid generator in the above range, the stability of a resist composition is improved, and unevenness generated when the composition is applied, or scum or the like generated in a developing process is significantly reduced.

Furthermore, a nitrogen-containing compound may be added to the chemically amplified resist composition of the present invention. By adding such a nitrogen-containing compound into the chemically amplified resist composition of the present invention, a resist pattern shape or film-left stability over time is further improved. That is to say, the sectional shape of the resist pattern becomes almost rectangular. Further, after a resist film is exposed to a light and then heated (PEB), it may be left for several hours before the next developing process in the mass production line of semiconductors. In such a case, deterioration of the sectional shape of the resist pattern occurred when a resist film is left (over time) is suppressed by addition of a nitrogen-containing compound.

All of known nitrogen-containing compounds can be used herein. Among others, amine is preferable, and a secondary lower aliphatic amine and a tertiary lower aliphatic amine are more preferable.

The term "lower aliphatic amine" is used herein to mean alkylamine or alkyl alcohol amine having 5 or less carbon atoms.

Examples of such a secondary lower aliphatic amine or a tertiary lower aliphatic amine may include trimethylamine, diethylamine, triethylamine, di-n-propylamine, tri-n-propylamine, tripentylamine, diethanolamine, and triethanolamine. Among others, a tertiary alkanolamine such as triethanolamine is more preferable as a nitrogen-containing compound.

A nitrogen-containing compound may be used alone or in combination.

The content of a nitrogen-containing compound is determined as appropriate, depending on the type of a nitrogen-containing compound selected. In general, it is preferably 0.01 parts or more by mass based on 100 parts by mass of a resist polymer (the polymer of the present invention). By setting the content of a nitrogen-containing compound in the above range, the form of a resist pattern becomes more rectangular. In addition, in general, the content of a nitrogen-containing compound is preferably 2 parts or less by mass based on 100 parts by mass of a resist polymer (the polymer of the present invention). By setting the content of a nitrogen-containing compound in the above range, deterioration in sensitivity can be reduced.

Furthermore, organic carboxylic acid, phosphorus oxo acid, or a derivative thereof may be added into the chemically amplified resist composition of the present invention. By adding these compounds into the chemically amplified resist composition of the present invention, deterioration in sensitivity caused by adding a nitrogen-containing compound can be prevented, and further, the shape of a resist pattern, film-left stability over time, or the like are further improved.

Examples of organic carboxylic acids may include malonic acid, citric acid, malic acid, succinic acid, benzoic acid, and salicylic acid.

Examples of phosphorus oxo acids or derivatives thereof may include: phosphoric acids and derivatives thereof (esters thereof), such as phosphoric acid, phosphoric acid di-n-butyl ester and phosphoric acid diphenyl ester; phosphonic acids and derivatives thereof (esters thereof), such as phosphonic acid, phosphonic acid dimethyl ester, phosphonic acid di-n-butyl ester, phenyl phosphonate, phosphonic acid diphenyl ester and phosphonic acid dibenzyl ester; and phosphinic acids and derivatives thereof (esters thereof), such as phosphinic acid and phenyl phosphinate. Of these, phosphonic acid is preferable.

These compounds (organic carboxylic acids, phosphorus oxo acids, or derivatives thereof) may be used alone or in combination.

The content of these compounds (organic carboxylic acids, phosphorus oxo acids, or derivatives thereof) is determined as appropriate, depending on the type of a compound selected. In general, it is preferably 0.01 parts or more by mass based on 100 parts by mass of a resist polymer (the polymer of the present invention). By setting the content of these compounds in the above range, the form of a resist pattern becomes more rectangular. In addition, in general, the content of these compounds (organic carboxylic acid, phosphorus oxo acid, or a derivative thereof) is preferably 5 parts or less by mass based on 100 parts by mass of a resist polymer (the polymer of the present invention). By setting the content of those compounds in the above range, reduction in the film of a resist pattern can be prevented.

Both a nitrogen-containing compound, and organic carboxylic acid, phosphorus oxo acid or a derivative thereof, may be contained in the chemically amplified resist composition of the present invention. Alternatively, either one may be contained therein.

In addition, the chemically amplified resist composition of the present invention can further comprise various additives such as a surfactant, other quencher, sensitizer, antihalation agent, stabilizer and antifoaming agent, if necessary. The amount of these additives is not particularly limited, but it may be determined as appropriate.

The resist polymer of the present invention may be used as a resist composition that is used for metal etching, photofabrication, plate-making, holograms, color filters, phase difference films, etc.

5. Pattern Formation Method of the Present Invention

Next, an example of the pattern formation method of the present invention will be explained.

First, the chemically amplified resist composition of the present invention is coated by spin-coating or the like on the surface of a substrate such as a silicon wafer, on which a pattern is to be formed. Then, the substrate, on which the chemically amplified resist composition is coated, is dried by baking treatment (pre-bake), so that a resist film is formed on the substrate.

Next, a light with a wavelength of 250 nm or shorter is applied to the thus obtained resist film through a photomask (exposure). The light used for the exposure is preferably a KrF excimer laser, an ArF excimer laser, or an $F_2$ excimer laser, and particularly preferably an ArF excimer laser. Moreover, exposure with electron beam is also preferable.

After exposure, heat treatment (post exposure baking, PEB) is carried out as appropriate. Thereafter, the substrate is immersed in an alkaline developing solution, so as to eliminate the exposed portion by dissolving it therein (development). Any known alkaline developing solution can be used herein. After the development, the substrate is rinsed with pure water or the like, as appropriate. Thus, a resist pattern is formed on the substrate to be processed.

In general, a substrate on which a resist pattern has been formed is appropriately subjected to heat treatment (postbaking) so that the resist is reinforced. Areas having no resists are selectively etched. After the etching, the resist is generally eliminated using a releasing agent.

EXAMPLES

The present invention will be explained more specifically in the following examples. However, the examples are not intended to limit the scope of the invention. The term "part," found in the following examples and comparative examples, is used to mean "part by mass," unless otherwise specified.

Measurement of the physical properties of the produced polymers was carried out by the following methods:

<Mass Average Molecular Weight of Resist Polymer>

Approximately 20 mg of a resist polymer was dissolved in 5 ml of tetrahydrofuran. The solution was then filtered through a 0.5-μm membrane filter, so as to prepare a sample solution. The mass average molecular weight of this sample solution was measured using gel permeation chromatography (GPC) manufactured by Tosoh Corp. For this measurement, 3 separation columns (Shodex GPC K-805L (product name) manufactured by Showa Denko K.K.) were used in series.

Tetrahydrofuran was used as a solvent, and polystyrene was used as a standard polymer under conditions of a flow rate of 1.0 ml/min, using a differential refractometer as a detector, a measurement temperature of 40° C., and an injection volume of 0.1 ml.

<Average Copolymerization Composition Ratio of Polymers Used for Resists (mol %)>

The average copolymerization composition ratio of polymers was obtained by $^1$H-NMR measurement. For this measurement, GSX-400 FT-NMR (product name) manufactured by JEOL was used. A solution containing approximately 5% by mass of a resist polymer sample in chloroform deuteride, acetone deuteride, or dimethyl sulfoxide deuteride was placed in a test tube with a diameter of 5 mmφ. Thereafter, integration was carried out 64 times under conditions of a measurement temperature of 40° C., an observation frequency of 400 MHz, and a single pulse mode.

In addition, a resist composition was prepared using the produced polymer by the following method, and the physical properties and the like thereof were measured.

<Preparation of Resist Composition>

100 parts of the produced resist polymer, 2 parts of triphenyl sulfonium triflate used as a photoacid generator, and 700 parts of PGMEA used as a solvent were mixed, so as to form a homogeneous solution. The obtained solution was then filtered through a membrane filter with a pore size of 0.1 μm, so as to prepare a resist composition solution.

<Formation of Resist Pattern>

The prepared resist composition solution was spin-coated on a silicon wafer, and pre-baking was carried out using a hot plate at 120° C. for 60 seconds, so as to form a resist film having a film thickness of 0.4 μm. Subsequently, the film was exposed using an ArF excimer laser light exposure machine (wavelength: 193 nm), and then, post exposure baking was carried out using a hot plate at 120° C. for 60 seconds. Thereafter, development was carried out at room temperature using 2.38% by mass of tetramethylammonium hydroxide aqueous solution, followed by washing with pure water and drying, so as to form a resist pattern.

<Sensitivity>

Sensitivity was defined as a light exposure (mJ/cm$^2$), at which a mask with a line-and-space pattern of 0.16 μm is transcribed into a line width of 0.16 μm. Such a light exposure was measured as sensitivity.

<Resolution>

Resolution was defined as the minimal dimension (μm) of a resist pattern, which was imaged when exposure was carried out at the above-described light exposure.

<Line Edge Roughness>

With regard to a 5-μm side portion in the longitudinal direction of a 0.20-μm resist pattern obtained by the minimum light exposure in order to reproduce 0.20-μm of a resist pattern on a mask, 50 points of distance from the standard line at which the pattern side portion should be located were measured using JSM-6340F field emission-type scanning electron microscope (product name) manufactured by JEOL. Then, a standard deviation was obtained, and 3σ was calculated. The smaller this value, the better performance that can be achieved.

<Shape of Resist Pattern>

The vertical section of the aforementioned 0.20-μm resist pattern was observed with JSM-6340F field emission-type scanning electron microscope (product name) manufactured by JEOL. When the sectional shape was rectangular, the evaluation is "O", and when the sectional shape was a convex or concave, the evaluation is "X".

<Amount of Microgels>

With regard to the prepared resist composition solution, the number of microgels in the solution immediately after preparation of the solution (microgel initial value) and the number of microgels in the solution after it had been left at 4° C. for 1 week (the number of microgels after a certain period of time) were measured using a particle counter manufactured by Rion Co., Ltd. Thereafter, the microgel initial value and the number of microgels increased, which was calculated by an equation: (the number of microgels after a certain period of time)–(the microgel initial value), were evaluated.

It is to be noted that the number of microgels with a particle size of 0.25 μm or greater existing in 1 ml of the resist composition solution was measured herein.

Example 1

In a flask equipped with a nitrogen inlet, a stirrer, a condenser and a thermometer on a water bath, 34.0 parts of propylene glycol monomethyl ethyl acetate (hereinafter referred to as PGMEA) were placed under a nitrogen atmosphere, and the temperature of the water bath was increased to 80° C. while stirring. A monomer solution obtained by mixing 14.6 parts of β-methacryloyloxy-γ-butyrolactone (hereinafter referred to as HGBMA), 22.5 parts of 2-methacryloyloxy-2-methyladamantane (hereinafter referred to as MAdMA), 3.7 parts of 2- or 3-cyano-5-norbornyl methacrylate (hereinafter referred to as CNNMA), 61.2 parts of PGMEA, and 2.08 parts of dimethyl-2,2'-azobis isobutylate (hereinafter referred to as DAIB) was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-1). In order to eliminate unreacted monomers remaining in the precipitate, the obtained precipitate was separated by filtration. The precipitate was then washed with methanol the volume of which is approximately 30 times of the monomers used in the polymerization. Thereafter, the precipitate was separated by filtration, and the washed precipitate was then dried under reduced pressure at 50° C. for approximately 40 hours to obtain copolymer A-1.

The physical properties of the obtained copolymer A-1 were measured. The results are shown in Table 1.

Example 2

In a flask equipped with a nitrogen inlet, a stirrer, a condenser and a thermometer on a water bath, 37.9 parts of tetrahydrofuran (hereinafter referred to as THF) were placed under a nitrogen atmosphere, and the temperature of the water bath was increased to 70° C. while stirring. A monomer solution obtained by mixing 20.9 parts of 8- or 9-acryloyloxy-4-oxatricyclo[5.2.1.0$^{2,6}$]-decan-3-one (hereinafter referred to as OTDA), 18.8 parts of 2-methacryloyl-oxy-2-ethyladamantane (hereinafter referred to as EAdMA), 5.7 parts of 2- or 3-cyano-5-norbornyl acrylate (hereinafter referred to as CNNA), 68.2 parts of THF, 1.80 parts of 2,2'-azobisisobutyronitrile (hereinafter referred to as AIBN), and 0.24 parts of 2-mercaptoethanol was added dropwise to the flask using a dropping device at a certain rate over 6 hours, and the mixture was then retained at 70° C. for 1 hour. Thereafter, while stirring, the obtained reaction solution was added dropwise to approximately 30 times its volume of methanol, so as to obtain a white precipitate (copolymer A-2). Thereafter, the same operations as conducted in Example 1 were carried out, so as to obtain a copolymer A-2.

The physical properties of the obtained copolymer A-2 were measured. The results are shown in Table 1.

Example 3

In a flask equipped with a nitrogen inlet, a stirrer, a condenser and a thermometer on a water bath, 22.4 parts of PGMEA and 9.7 parts of γ-butyrolactone were placed under a nitrogen atmosphere, and the temperature of the water bath was increased to 80° C. while stirring. A monomer solution obtained by mixing 21.5 parts of 2-exo-methacryloyloxy-4,8-dioxatricyclo-[4.2.1.0$^{3,7}$]nonan-5-one (hereinafter referred to as ONLMA), 23.0 parts of 4-methacryloyloxy-4-ethyl-tetracyclo[6.2.1.1$^{3,6}$.0$^{2,7}$]dodecane (hereinafter referred to as EDMA), 4.1 parts of CNNMA, 79.4 parts of PGMEA, 34.0 parts of γ-butyrolactone, 0.70 parts of DAIB, and 0.58 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-3). Thereafter, the same operations as conducted in Example 1 were carried out, so as to obtain a copolymer A-3.

The physical properties of the obtained copolymer A-3 were measured. The results are shown in Table 1.

Example 4

In a flask equipped with a nitrogen inlet, a stirrer, a condenser and a thermometer on a water bath, 30.8 parts of PGMEA and 3.4 parts of γ-butyrolactone were placed under a nitrogen atmosphere, and the temperature of the water bath was increased to 80° C. while stirring. A monomer solution obtained by mixing 12.6 parts of α-methacryloyloxy-γ-butyrolactone (hereinafter referred to as GBLMA), 21.1 parts of MAdMA, 7.0 parts of 1-cyano-2-cyclohexyl methacrylate (hereinafter referred to as CNCMA) represented by the following formula (20-12):

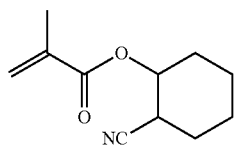

(20-12)

55.4 parts of PGMEA, 6.2 parts of γ-butyrolactone, and 1.64 parts of AIBN was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-4). Thereafter, the same operations as conducted in Example 1 were carried out, so as to obtain a copolymer A-4.

The physical properties of the obtained copolymer A-4 were measured. The results are shown in Table 1.

Example 5

In a flask equipped with a nitrogen inlet, a stirrer, a condenser and a thermometer on a water bath, 30.8 parts of PGMEA and 3.4 parts of γ-butyrolactone were placed under a nitrogen atmosphere, and the temperature of the water bath was increased to 80° C. while stirring. A monomer solution obtained by mixing 12.6 parts of GBLMA, 21.1 parts of MAdMA, 7.4 parts of CNNMA, 55.4 parts of PGMEA, 6.2 parts of γ-butyrolactone, and 1.64 parts of AIBN was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-5). Thereafter, the same operations as conducted in Example 1 were carried out, so as to obtain a copolymer A-5.

The physical properties of the obtained copolymer A-5 were measured. The results are shown in Table 1.

Example 6

In a flask equipped with a nitrogen inlet, a stirrer, a condenser and a thermometer on a water bath, 37.7 parts of PGMEA were placed under a nitrogen atmosphere, and the temperature of the water bath was increased to 80° C. while stirring. A monomer solution obtained by mixing 18.2 parts of OTDA, 15.9 parts of MAdMA, 4.4 parts of 1-acryloyloxy-3-hydroxyadamantane (hereinafter referred to as HAdA), 6.2 parts of CNNMA, 67.9 parts of PGMEA, 1.64 parts of AIBN, and 0.58 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-6). Thereafter, the same operations as conducted in Example 1 were carried out, so as to obtain a copolymer A-6.

The physical properties of the obtained copolymer A-6 were measured. The results are shown in Table 1.

Example 7

In a flask equipped with a nitrogen inlet, a stirrer, a condenser and a thermometer on a water bath, 28.2 parts of PGMEA and 7.1 parts of γ-butyrolactone were placed under a nitrogen atmosphere, and the temperature of the water bath was increased to 80° C. while stirring. A monomer solution obtained by mixing 12.2 parts of HGBMA, 22.3 parts of EAdMA, 7.8 parts of CNNMA, 50.8 parts of PGMEA, 12.7 parts of γ-butyrolactone, and 1.96 parts of AIBN was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-7). Thereafter, the same operations as conducted in Example 1 were carried out, so as to obtain a copolymer A-7.

The physical properties of the obtained copolymer A-7 were measured. The results are shown in Table 1.

Example 8

In a flask equipped with a nitrogen inlet, a stirrer, a condenser and a thermometer on a water bath, 38.2 parts of PGMEA were placed under a nitrogen atmosphere, and the temperature of the water bath was increased to 80° C. while stirring. A monomer solution obtained by mixing 17.5 parts of 8- or 9-methacryloyloxy-4-oxatricyclo[5.2.1.0$^{2,6}$]decan-3-one (hereinafter referred to as OTDMA), 20.6 parts of MAdMA, 7.8 parts of CNNMA, 68.8 parts of PGMEA, 1.80 parts of AIBN, and 0.44 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-8). Thereafter, the same operations as conducted in Example 1 were carried out, so as to obtain a copolymer A-8.

The physical properties of the obtained copolymer A-8 were measured. The results are shown in Table 1.

Example 9

In a flask equipped with a nitrogen inlet, a stirrer, a condenser and a thermometer on a water bath, 37.5 parts of PGMEA were placed under a nitrogen atmosphere, and the temperature of the water bath was increased to 80° C. while stirring. A monomer solution obtained by mixing 18.2 parts of OTDA, 18.4 parts of EAdMA, 8.4 parts of CNNA, 67.4 parts of PGMEA, 1.96 parts of AIBN, and 0.58 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-9). Thereafter, the same operations as conducted in Example 1 were carried out, so as to obtain a copolymer A-9.

The physical properties of the obtained copolymer A-9 were measured. The results are shown in Table 1.

Example 10

In a flask equipped with a nitrogen inlet, a stirrer, a condenser and a thermometer on a water bath, 37.7 parts of PGMEA were placed under a nitrogen atmosphere, and the temperature of the water bath was increased to 80° C. while stirring. A monomer solution obtained by mixing 18.2 parts of OTDA, 16.9 parts of EAdMA, 4.4 parts of 1-methacryloyloxy adamantane (hereinafter referred to as AdMA), 5.7 parts of CNNA, 67.8 parts of PGMEA, and 4.26 parts of AIBN was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-10). Thereafter, the same operations as conducted in Example 1 were carried out, so as to obtain a copolymer A-10.

The physical properties of the obtained copolymer A-10 were measured. The results are shown in Table 2.

Example 11

In a flask equipped with a nitrogen inlet, a stirrer, a condenser and a thermometer on a water bath, 35.1 parts of PGMEA were placed under a nitrogen atmosphere, and the temperature of the water bath was increased to 80° C. while stirring. A monomer solution obtained by mixing 14.6 parts of GBLMA, 22.5 parts of MAdMA, 5.0 parts of 2,2,3,3-tetracyano-5-norbornyl methacrylate (hereinafter referred to as TCNMA), 63.2 parts of PGMEA, and 2.30 parts of DAIB was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-11). Thereafter, the same operations as conducted in Example 1 were carried out, so as to obtain a copolymer A-11.

The physical properties of the obtained copolymer A-11 were measured. The results are shown in Table 2.

Example 12

In a flask equipped with a nitrogen inlet, a stirrer, a condenser and a thermometer on a water bath, 38.5 parts of PGMEA were placed under a nitrogen atmosphere, and the temperature of the water bath was increased to 80° C. while stirring. A monomer solution obtained by mixing 18.2 parts of OTDA, 18.4 parts of EAdMA, 9.6 parts of 2- or 3-cyano-5-methyl-5-norbornyl methacrylate (hereinafter referred to as CMNMA), 69.3 parts of PGMEA, 1.96 parts of AIBN, and 0.58 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-12). Thereafter, the same operations as conducted in Example 1 were carried out, so as to obtain a copolymer A-12.

The physical properties of the obtained copolymer A-12 were measured. The results are shown in Table 2.

Example 13

In a flask equipped with a nitrogen inlet, a stirrer, a condenser and a thermometer on a water bath, 41.7 parts of PGMEA were placed under a nitrogen atmosphere, and the temperature of the water bath was increased to 80° C. while stirring. A monomer solution obtained by mixing 21.6 parts of a mixture (hereinafter referred to as DOLMA) consisting of a monomer represented by formula (20-1) indicated below and a monomer represented by formula (20-2) indicated below:

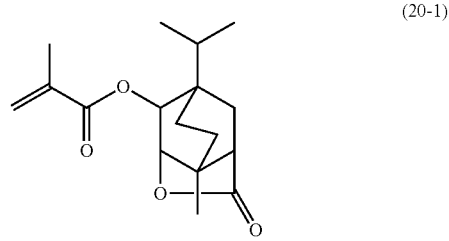

(20-1)

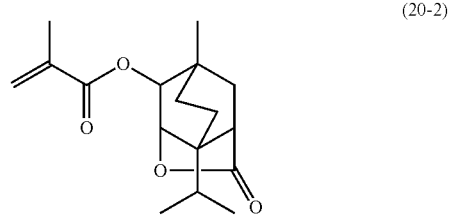

(20-2)

20.6 parts of MAdMA, 7.8 parts of CNNMA, 75.0 parts of PGMEA, 1.32 parts of AIBN, and 0.44 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-13). Thereafter, the same operations as conducted in Example 1 were carried out, so as to obtain a copolymer A-13.

The physical properties of the obtained copolymer A-13 were measured. The results are shown in Table 2.

Example 14

In a flask equipped with a nitrogen inlet, a stirrer, a condenser and a thermometer on a water bath, 31.6 parts of PGMEA were placed under a nitrogen atmosphere, and the temperature of the water bath was increased to 80° C. while stirring. A monomer solution obtained by mixing 9.1 parts of 2-methylene-4,4-dimethyl-4-butanolide (hereinafter referred to as DMMB) represented by the following formula (20-3):

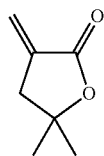

(20-3)

21.1 parts of MAdMA, 7.8 parts of CNNMA, 56.9 parts of PGMEA, 1.84 parts of DAIB, and 0.30 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-14). Thereafter, the same operations as conducted in Example 1 were carried out, so as to obtain a copolymer A-14.

The physical properties of the obtained copolymer A-14 were measured. The results are shown in Table 2.

Example 15

In a flask equipped with a nitrogen inlet, a stirrer, a condenser and a thermometer on a water bath, 28.6 parts of PGMEA and 7.2 parts of γ-butyrolactone were placed under a nitrogen atmosphere, and the temperature of the water bath was increased to 80° C. while stirring. A monomer solution obtained by mixing 15.0 parts of a monomer represented by the following formula (20-4) (hereinafter referred to as BLEMA):

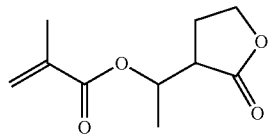

(20-4)

20.1 parts of MAdMA, 7.8 parts of CNNMA, 51.6 parts of PGMEA, 12.9 parts of γ-butyrolactone, 1.32 parts of AIBN, and 0.38 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-15). Thereafter, the same operations as conducted in Example 1 were carried out, so as to obtain a copolymer A-15.

The physical properties of the obtained copolymer A-15 were measured. The results are shown in Table 2.

Example 16

In a flask equipped with a nitrogen inlet, a stirrer, a condenser and a thermometer on a water bath, 27.1 parts of PGMEA were placed under a nitrogen atmosphere, and the temperature of the water bath was increased to 80° C. while stirring. A monomer solution obtained by mixing 13.9 parts of GBLMA, 12.8 parts of tert-butyl methacrylate (hereinafter referred to as TBMA), 5.7 parts of CNNMA, 48.7 parts of PGMEA, 1.32 parts of AIBN, and 0.18 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-16). Thereafter, the same operations as conducted in Example 1 were carried out, so as to obtain a copolymer A-16.

The physical properties of the obtained copolymer A-16 were measured. The results are shown in Table 2.

Example 17

In a flask equipped with a nitrogen inlet, a stirrer, a condenser and a thermometer on a water bath, 29.0 parts of PGMEA were placed under a nitrogen atmosphere, and the temperature of the water bath was increased to 80° C. while stirring. A monomer solution obtained by mixing 16.2 parts of BLEMA, 12.8 parts of TBMA, 5.7 parts of CNNMA, 52.1 parts of PGMEA, 1.32 parts of AIBN, and 0.14 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-4). Thereafter, the same operations as conducted in Example 1 were carried out, so as to obtain a copolymer A-17.

The physical properties of the obtained copolymer A-17 were measured. The results are shown in Table 2.

Example 18

In a flask equipped with a nitrogen inlet, a stirrer, a condenser and a thermometer on a water bath, 40.0 parts of PGMEA were placed under a nitrogen atmosphere, and the temperature of the water bath was increased to 80° C. while stirring. A monomer solution obtained by mixing 19.2 parts of a monomer represented by the following formula (20-5) (hereinafter referred to as MOTDMA):

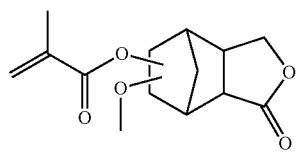

(20-5)

20.6 parts of MAdMA, 8.2 parts of CNNMA, 71.9 parts of PGMEA, 1.32 parts of AIBN, and 0.26 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-18). Thereafter, the same operations as conducted in Example 1 were carried out, so as to obtain a copolymer A-18.

The physical properties of the obtained copolymer A-18 were measured. The results are shown in Table 2.

Example 19

In a flask equipped with a nitrogen inlet, a stirrer, a condenser and a thermometer on a water bath, 27.1 parts of PGMEA and 11.6 parts of γ-butyrolactone were placed under a nitrogen atmosphere, and the temperature of the water bath was increased to 80° C. while stirring. A monomer solution obtained by mixing 18.4 parts of OTDMA, 19.2 parts of MAdMA, 4.1 parts of CNNMA, 4.7 parts of HAdMA, 48.7 parts of PGMEA, 20.9 parts of γ-butyrolactone, 0.98 parts of AIBN, and 0.62 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-19). Thereafter, the same operations as conducted in Example 1 were carried out, so as to obtain a copolymer A-19.

The physical properties of the obtained copolymer A-19 were measured. The results are shown in Table 3.

Example 20

In a flask equipped with a nitrogen inlet, a stirrer, a condenser and a thermometer on a water bath, 32.8 parts of PGMEA were placed under a nitrogen atmosphere, and the temperature of the water bath was increased to 80° C. while stirring. A monomer solution obtained by mixing 18.3 parts of a monomer represented by the following formula (20-6) (hereinafter referred to as MCLMA):

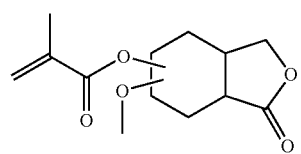

(20-6)

11.6 parts of TBMA, 9.4 parts of CNNMA, 59.0 parts of PGMEA, 1.14 parts of AIBN, and 0.26 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-20). Thereafter, the same operations as conducted in Example 1 were carried out, so as to obtain a copolymer A-20.

The physical properties of the obtained copolymer A-20 were measured. The results are shown in Table 3.

Example 21

In a flask equipped with a nitrogen inlet, a stirrer, a condenser and a thermometer on a water bath, 39.1 parts of PGMEA were placed under a nitrogen atmosphere, and the temperature of the water bath was increased to 80° C. while stirring. A monomer solution obtained by mixing 14.6 parts of OTDMA, 23.4 parts of MAdMA, 8.9 parts of a monomer represented by the following formula (20-7) (hereinafter referred to as MCCMA):

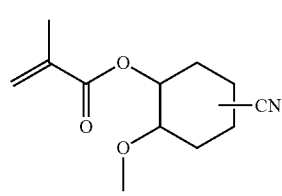

(20-7)

70.4 parts of PGMEA, 1.32 parts of AIBN, and 0.36 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-21). Thereafter, the same operations as conducted in Example 1 were carried out, so as to obtain a copolymer A-21.

The physical properties of the obtained copolymer A-21 were measured. The results are shown in Table 3.

Example 22

In a flask equipped with a nitrogen inlet, a stirrer, a condenser and a thermometer on a water bath, 35.2 parts of PGMEA and 8.8 parts of γ-butyrolactone were placed under a nitrogen atmosphere, and the temperature of the water bath was increased to 80° C. while stirring. A monomer solution obtained by mixing 23.5 parts of a mixture consisting of a monomer represented by formula (20-8) indicated below and a monomer represented by formula (20-9) indicated below (hereinafter referred to as DOLAMA):

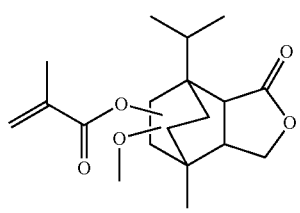

(20-8)

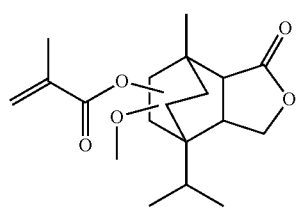

(20-9)

21.5 parts of MAdMA, 7.8 parts of CNNMA, 63.4 parts of PGMEA, 15.9 parts of γ-butyrolactone, 1.32 parts of AIBN, and 0.50 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-22). Thereafter, the same operations as conducted in Example 1 were carried out, so as to obtain a copolymer A-22.

The physical properties of the obtained copolymer A-22 were measured. The results are shown in Table 3.

Example 23

In a flask equipped with a nitrogen inlet, a stirrer, a condenser and a thermometer on a water bath, 26.1 parts of PGMEA and 11.2 parts of γ-butyrolactone were placed under a nitrogen atmosphere, and the temperature of the water bath was increased to 80° C. while stirring. A monomer solution obtained by mixing 17.3 parts of 2-exo-methacryloyloxy-4-oxatricyclo-[4.2.1.0$^{3,7}$]nonan-5-one (hereinafter referred to as OTNMA), 19.2 parts of MAdMA, 8.2 parts of CNNMA, 46.9 parts of PGMEA, 20.1 parts of γ-butyrolactone, 1.48 parts of AIBN, and 0.58 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-23). Thereafter, the same operations as conducted in Example 1 were carried out, so as to obtain a copolymer A-23.

The physical properties of the obtained copolymer A-23 were measured. The results are shown in Table 3.

Example 24

In a flask equipped with a nitrogen inlet, a stirrer, a condenser and a thermometer on a water bath, 27.0 parts of PGMEA and 6.8 parts of γ-butyrolactone were placed under a nitrogen atmosphere, and the temperature of the water bath was increased to 80° C. while stirring. A monomer solution obtained by mixing 13.6 parts of GBLMA, 18.7 parts of MAdMA, 8.2 parts of CNNMA, 48.6 parts of PGMEA, 12.2 parts of γ-butyrolactone, 1.32 parts of AIBN, and 1.02 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-24). Thereafter, the same operations as conducted in Example 1 were carried out, so as to obtain a copolymer A-24.

The physical properties of the obtained copolymer A-24 were measured. The results are shown in Table 3.

Example 25

A copolymer A-25 was obtained in the same manner as in Example 24 with the exception that the amount of n-octylmercaptan in the monomer solution was set at 0.58 parts.

The physical properties of the obtained copolymer A-25 were measured. The results are shown in Table 3.

Example 26

A copolymer A-26 was obtained in the same manner as in Example 24 with the exception that the amount of n-octylmercaptan in the monomer solution was set at 0.38 parts.

The physical properties of the obtained copolymer A-26 were measured. The results are shown in Table 3.

Example 27

In a flask equipped with a nitrogen inlet, a stirrer, a condenser and a thermometer on a water bath, 39.1 parts of PGMEA were placed under a nitrogen atmosphere, and the temperature of the water bath was increased to 80° C. while stirring. A monomer solution obtained by mixing 14.6 parts of OTDMA, 23.4 parts of MAdMA, 9.4 parts of a monomer represented by the following formula (20-13) (hereinafter referred to as CNNAMA):

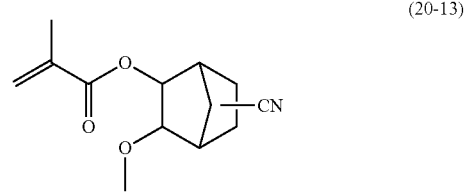

(20-13)

70.4 parts of PGMEA, 1.32 parts of AIBN, and 0.36 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer A-27). Thereafter, the same operations as conducted in Example 1 were carried out, so as to obtain a copolymer A-27.

The physical properties of the obtained copolymer A-27 were measured. The results are shown in Table 3.

Comparative Example 1

In a flask equipped with a nitrogen inlet, a stirrer, a condenser and a thermometer on a water bath, 34.0 parts of PGMEA were placed under a nitrogen atmosphere, and the temperature of the water bath was increased to 80° C. while stirring. A monomer solution obtained by mixing 16.0 parts of HGBMA, 24.8 parts of MAdMA, 61.2 parts of PGMEA, and 2.08 parts of DAIB was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer B-1). Thereafter, the same operations as conducted in Example 1 were carried out, so as to obtain a copolymer B-1.

The physical properties of the obtained copolymer B-1 were measured. The results are shown in Table 4.

Comparative Example 2

In a flask equipped with a nitrogen inlet, a stirrer, a condenser and a thermometer on a water bath, 22.8 parts of PGMEA and 9.8 parts of γ-butyrolactone were placed under a nitrogen atmosphere, and the temperature of the water bath was increased to 80° C. while stirring. A monomer solution obtained by mixing 20.2 parts of ONLMA, 19.7 parts of EDMA, 9.0 parts of 1-methacryloyloxy-3-hydroxyadamantane (hereinafter referred to as HAdMA), 79.8 parts of PGMEA, 34.2 parts of γ-butyrolactone, 0.70 parts of DAIB, and 0.58 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer B-2). Thereafter, the same operations as conducted in Example 1 were carried out, so as to obtain a copolymer B-2.

The physical properties of the obtained copolymer B-2 were measured. The results are shown in Table 4.

Comparative Example 3

In a flask equipped with a nitrogen inlet, a stirrer, a condenser and a thermometer on a water bath, 35.0 parts of PGMEA and 10.9 parts of γ-butyrolactone were placed under a nitrogen atmosphere, and the temperature of the water bath was increased to 80° C. while stirring. A monomer solution obtained by mixing 24.9 parts of OTNMA, 21.8 parts of EAdMA, 63.0 parts of PGMEA, 7.0 parts of γ-butyrolactone, and 3.94 parts of AIBN was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer B-3). Thereafter, the same operations as conducted in Example 1 were carried out, so as to obtain a copolymer B-3.

The physical properties of the obtained copolymer B-3 were measured. The results are shown in Table 4.

Comparative Example 4

A total amount of a monomer solution obtained by mixing 8.9 parts of 2'-acetoxyethyl methacrylate (hereinafter referred to as AEMA), 9.0 parts of 1-butyl methacrylate (hereinafter referred to as BMA), 14.0 parts of CNNMA, 4.45 parts of methacrylic acid (hereinafter referred to as MAA), 109.2 parts of isopropanol, 1.96 parts of AIBN, and 0.58 parts of n-octylmercaptan, were placed in a flask equipped with a nitrogen inlet, a stirrer, a condenser and a thermometer on a water bath, under a nitrogen atmosphere. Thereafter, while stirring, the temperature of the water bath was increased to 60° C. Thereafter, the mixture was retained at 60° C. for 5.5 hours for polymerization. Subsequently, while stirring, the obtained reaction solution was added dropwise to 6 L of hexane, so as to obtain a white precipitate (copolymer B-4). In order to eliminate a monomer portion remaining in the precipitate, the obtained precipitate was filtered off, and the obtained filtrate was then washed with 300 ml of hexane 5 times. Thereafter, the precipitate was filtered off, and the obtained filtrate was dried at approximately 40° C. under a reduced pressure for approximately 40 hours.

The physical properties of the obtained copolymer B-4 were measured. The results are shown in Table 4.

Comparative Example 5

In a flask equipped with a nitrogen inlet, a stirrer, a condenser and a thermometer on a water bath, 36.6 parts of PGMEA were placed under a nitrogen atmosphere, and the temperature of the water bath was increased to 80° C. while stirring. A monomer solution obtained by mixing 15.5 parts of a monomer represented by the following formula (20-10) (hereinafter referred to as CLMA):

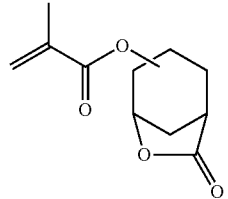

(20-10)

20.6 parts of MAdMA, 7.8 parts of CNNMA, 65.9 parts of PGMEA, 1.80 parts of AIBN, and 0.44 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer B-5). Thereafter, the same operations as conducted in Example 1 were carried out, so as to obtain a copolymer B-5.

The physical properties of the obtained copolymer B-5 were measured. The results are shown in Table 4.

Reference Example 1

In a flask equipped with a nitrogen inlet, a stirrer, a condenser and a thermometer on a water bath, 26.4 parts of PGMEA and 11.3 parts of γ-butyrolactone were placed under a nitrogen atmosphere, and the temperature of the water bath was increased to 80° C. while stirring. A monomer solution obtained by mixing 17.3 parts of OTNMA, 19.2 parts of MAdMA, 4.1 parts of CNNMA, 4.7 parts of HAdMA, 47.6 parts of PGMEA, 20.4 parts of γ-butyrolactone, 0.98 parts of AIBN, and 0.62 parts of n-octylmercaptan was added dropwise to the flask using a dropping device at a certain rate over 6 hours, and the mixture was then retained at 80° C. for 1 hour. Thereafter, while stirring, the obtained reaction solution was added dropwise to approximately 30 times its volume of methanol, so as to obtain a white precipitate (copolymer 8-6). Thereafter, the same operations as conducted in Example 1 were carried out, so as to obtain a copolymer B-6.

The physical properties of the obtained copolymer B-6 were measured. The results are shown in Table 4.

Reference Example 2

A copolymer B-7 was obtained in the same manner as in Example 23 with the exception that the amount of n-octylmercaptan in the monomer solution was set at 0.14 parts.

The physical properties of the obtained copolymer B-7 were measured. The results are shown in Table 4.

TABLE 1

| | | Example | | | | | | | | |
|---|---|---|---|---|---|---|---|---|---|---|
| | | 1 | 2 | 3 | 4 | 5 | 6 | 7 | 8 | 9 |
| Copolymer | | A-1 | A-2 | A-3 | A-4 | A-5 | A-6 | A-7 | A-8 | A-9 |
| Mass average molecular weight (Mw) | | 12,500 | 10,500 | 11,000 | 10,000 | 12,000 | 10,000 | 9,500 | 9,500 | 8,500 |
| Molecular weight distribution (Mw/Mn) | | 1.75 | 1.60 | 1.62 | 1.75 | 1.68 | 1.59 | 1.69 | 1.66 | 1.62 |

TABLE 1-continued

|  |  | Example | | | | | | | | |
|---|---|---|---|---|---|---|---|---|---|---|
|  |  | 1 | 2 | 3 | 4 | 5 | 6 | 7 | 8 | 9 |
| Copolymer | | A-1 | A-2 | A-3 | A-4 | A-5 | A-6 | A-7 | A-8 | A-9 |
| Composition ratio of monomer units in polymer (mol %) | CNNMA | 10 |  | 10 |  | 20 | 15 | 20 | 20 |  |
| | CNNA |  | 15 |  |  |  |  |  |  | 20 |
| | TCNMA |  |  |  |  |  |  |  |  |  |
| | CMNMA |  |  |  |  |  |  |  |  |  |
| | MCCMA |  |  |  |  |  |  |  |  |  |
| | CNCMA |  |  |  | 20 |  |  |  |  |  |
| | MAdMA | 45 |  |  | 40 | 40 | 35 |  | 40 |  |
| | EAdMA |  | 40 |  |  |  |  | 40 |  | 40 |
| | EDMA |  |  | 40 |  |  |  |  |  |  |
| | TBMA |  |  |  |  |  |  |  |  |  |
| | AEMA |  |  |  |  |  |  |  |  |  |
| | HAdMA |  |  |  |  |  |  |  |  |  |
| | HAdA |  |  |  |  |  |  | 10 |  |  |
| | AdMA |  |  |  |  |  |  |  |  |  |
| | HGBMA | 45 |  |  |  |  |  |  | 40 |  |
| | GBLMA |  |  |  | 40 | 40 |  |  |  |  |
| | BLEMA |  |  |  |  |  |  |  |  |  |
| | OTNMA |  |  |  |  |  |  |  |  |  |
| | CLMA |  |  |  |  |  |  |  |  |  |
| | OTDMA |  |  |  |  |  |  |  | 40 |  |
| | OTDA |  | 45 |  |  |  | 40 |  |  | 40 |
| | ONLMA |  |  | 50 |  |  |  |  |  |  |
| | DOLMA |  |  |  |  |  |  |  |  |  |
| | DOLAMA |  |  |  |  |  |  |  |  |  |
| | MOTDMA |  |  |  |  |  |  |  |  |  |
| | MCLMA |  |  |  |  |  |  |  |  |  |
| | DMMB |  |  |  |  |  |  |  |  |  |
| | BMA |  |  |  |  |  |  |  |  |  |
| | MAA |  |  |  |  |  |  |  |  |  |
| Sensitivity (mJ/cm$^2$) | | 6.4 | 7.4 | 8.1 | 7.1 | 7.6 | 6.8 | 5.8 | 7.3 | 7.0 |
| Resolution (μm) | | 0.13 | 0.13 | 0.13 | 0.13 | 0.13 | 0.13 | 0.13 | 0.13 | 0.13 |
| Line edge roughness (nm) | | 9 | 5 | 10 | 8 | 9 | 8 | 4 | 5 | 5 |
| Resist pattern shape | | ○ | ○ | ○ | ○ | ○ | ○ | ○ | ○ | ○ |
| Number of Microgels (the number) | Initial | 5 | 8 | 6 | <5 | <5 | 6 | <5 | <5 | <5 |
| | Increased | <5 | <5 | <5 | <5 | <5 | <5 | <5 | <5 | <5 |

TABLE 2

|  |  | Example | | | | | | | | |
|---|---|---|---|---|---|---|---|---|---|---|
|  |  | 10 | 11 | 12 | 13 | 14 | 15 | 16 | 17 | 18 |
| Copolymer | | A-10 | A-11 | A-12 | A-13 | A-14 | A-15 | A-16 | A-17 | A-18 |
| Mass average molecular weight (Mw) | | 9,000 | 10,500 | 9,500 | 10,000 | 9,500 | 8,000 | 11,500 | 12,000 | 9,000 |
| Molecular weight distribution (Mw/Mn) | | 1.79 | 1.60 | 1.69 | 1.65 | 1.62 | 1.42 | 1.49 | 1.52 | 1.60 |
| Composition ratio of monomer units in polymer (mol %) | CNNMA |  |  |  | 20 | 20 | 20 | 15 | 15 | 20 |
| | CNNA | 15 |  |  |  |  |  |  |  |  |
| | TCNMA |  | 10 |  |  |  |  |  |  |  |
| | CMNMA |  |  | 20 |  |  |  |  |  |  |
| | MCCMA |  |  |  |  |  |  |  |  |  |
| | CNCMA |  |  |  |  |  |  |  |  |  |
| | MAdMA |  | 45 |  | 40 | 40 | 40 |  |  | 40 |
| | EAdMA | 35 |  | 40 |  |  |  |  |  |  |
| | EDMA |  |  |  |  |  |  |  |  |  |
| | TBMA |  |  |  |  |  |  | 40 | 40 |  |
| | AEMA |  |  |  |  |  |  |  |  |  |
| | HAdMA |  |  |  |  |  |  |  |  |  |
| | HAdA |  |  |  |  |  |  |  |  |  |
| | AdMA | 10 |  |  |  |  |  |  |  |  |
| | HGBMA |  |  |  |  |  |  |  |  |  |
| | GBLMA |  | 45 |  |  |  |  | 45 |  |  |
| | BLEMA |  |  |  |  | 40 |  |  | 45 |  |
| | OTNMA |  |  |  |  |  |  |  |  |  |
| | CLMA |  |  |  |  |  |  |  |  |  |
| | OTDMA |  |  |  |  |  |  |  |  |  |
| | OTDA | 40 |  | 40 |  |  |  |  |  |  |
| | ONLMA |  |  |  |  |  |  |  |  |  |
| | DOLMA |  |  |  | 40 |  |  |  |  |  |

TABLE 2-continued

| Copolymer | | Example | | | | | | | | |
|---|---|---|---|---|---|---|---|---|---|---|
| | | 10 A-10 | 11 A-11 | 12 A-12 | 13 A-13 | 14 A-14 | 15 A-15 | 16 A-16 | 17 A-17 | 18 A-18 |
| | DOLAMA | | | | | | | | | |
| | MOTDMA | | | | | | | | | 40 |
| | MCLMA | | | | | | | | | |
| | DMMB | | | | | 40 | | | | |
| | BMA | | | | | | | | | |
| | MAA | | | | | | | | | |
| Sensitivity (mJ/cm$^2$) | | 7.1 | 6.9 | 7.2 | 6.9 | 7.2 | 6.7 | 7.0 | 6.8 | 7.3 |
| Resolution (μm) | | 0.13 | 0.13 | 0.13 | 0.13 | 0.14 | 0.13 | 0.15 | 0.15 | 0.13 |
| Line edge roughness (nm) | | 6 | 6 | 7 | 6 | 7 | 8 | 9 | 7 | 6 |
| Resist pattern shape | | ○ | ○ | ○ | ○ | ○ | ○ | ○ | ○ | ○ |
| Number of Microgels (the number) | Initial | <5 | <5 | <5 | <5 | <5 | <5 | <5 | <5 | <5 |
| | Increased | <5 | <5 | <5 | <5 | <5 | <5 | <5 | <5 | <5 |

TABLE 3

| Copolymer | | Example | | | | | | | | |
|---|---|---|---|---|---|---|---|---|---|---|
| | | 19 A-19 | 20 A-20 | 21 A-21 | 22 A-22 | 23 A-23 | 24 A-24 | 25 A-25 | 26 A-26 | 27 A-27 |
| Mass average molecular weight (Mw) | | 10,000 | 11,000 | 8,000 | 9,500 | 7,500 | 5,200 | 6,700 | 7,800 | 8,400 |
| Molecular weight distribution (Mw/Mn) | | 1.69 | 1.55 | 1.52 | 1.66 | 1.67 | 1.42 | 1.52 | 1.58 | 1.56 |
| Composition ratio of monomer units in polymer (mol %) | CNNMA | 10 | 25 | | 20 | 20 | 22 | 22 | 22 | |
| | CNNA | | | | | | | | | |
| | TCNMA | | | | | | | | | |
| | CMNMA | | | | | | | | | |
| | MCCMA | | | 20 | | | | | | |
| | CNCMA | | | | | | | | | |
| | CNNAMA | | | | | | | | | 20 |
| | MAdMA | 40 | | 45 | 45 | 40 | 39 | 39 | 39 | 40 |
| | EAdMA | | | | | | | | | |
| | EDMA | | | | | | | | | |
| | TBMA | | 35 | | | | | | | |
| | AEMA | | | | | | | | | |
| | HAdMA | 10 | | | | | | | | |
| | HAdA | | | | | | | | | |
| | AdMA | | | | | | | | | |
| | HGBMA | | | | | | | | | |
| | GBLMA | | | | | | 39 | 39 | 39 | 40 |
| | BLEMA | | | | | | | | | |
| | OTNMA | | | | | 40 | | | | |
| | CLMA | | | | | | | | | |
| | OTDMA | 40 | | 35 | | | | | | |
| | OTDA | | | | | | | | | |
| | ONLMA | | | | | | | | | |
| | DOLMA | | | | | | | | | |
| | DOLAMA | | | | 35 | | | | | |
| | MOTDMA | | | | | | | | | |
| | MCLMA | | 40 | | | | | | | |
| | DMMB | | | | | | | | | |
| | BMA | | | | | | | | | |
| | MAA | | | | | | | | | |
| Sensitivity (mJ/cm$^2$) | | 7.5 | 7.4 | 6.9 | 7.2 | 6.9 | 6.9 | 7.0 | 7.3 | 7.1 |
| Resolution (μm) | | 0.13 | 0.15 | 0.13 | 0.13 | 0.13 | 0.12 | 0.12 | 0.12 | 0.13 |
| Line edge roughness (nm) | | 6 | 6 | 4 | 6 | 7 | 7 | 8 | 8 | 8 |
| Resist pattern shape | | ○ | ○ | ○ | ○ | ○ | ○ | ○ | ○ | ○ |
| Number of Microgels (the number) | Initial | <5 | <5 | <5 | <5 | 6 | <5 | <5 | <5 | <5 |
| | Increased | <5 | <5 | <5 | <5 | <5 | <5 | <5 | <5 | <5 |

TABLE 4

| | | Comparative Example | | | | | Reference Example | |
|---|---|---|---|---|---|---|---|---|
| | | 1 | 2 | 3 | 4 | 5 | 1 | 2 |
| Copolymer | | B-1 | B-2 | B-3 | B-4 | B-5 | B-6 | B-7 |
| Mass average molecular weight (Mw) | | 11,500 | 10,500 | 8,500 | 17,500 | 10,000 | 10,000 | 12,000 |
| Molecular weight distribution (Mw/Mn) | | 1.86 | 1.64 | 1.78 | 1.89 | 1.63 | 1.72 | 1.78 |
| Composition ratio of monomer units in polymer (mol %) | CNNMA | | | | 29 | 20 | 10 | 20 |
| | CNNA | | | | | | | |
| | TCNMA | | | | | | | |
| | CMNMA | | | | | | | |
| | MCCMA | | | | | | | |
| | CNCMA | | | | | | | |
| | MAdMA | 50 | | | | 40 | 40 | 40 |
| | EAdMA | | | 40 | | | | |
| | EDMA | | 40 | | | | | |
| | TBMA | | | | | | | |
| | AEMA | | | | 22 | | | |
| | HAdMA | | 15 | | | | 10 | |
| | HAdA | | | | | | | |
| | AdMA | | | | | | | |
| | HGBMA | 50 | | | | | | |
| | GBLMA | | | | | | | |
| | BLEMA | | | | | | | |
| | OTNMA | | | 60 | | | 40 | 40 |
| | CLMA | | | | | 40 | | |
| | OTDMA | | | | | | | |
| | OTDA | | | | | | | |
| | ONLMA | | 45 | | | | | |
| | DOLMA | | | | | | | |
| | DOLAMA | | | | | | | |
| | MOTDMA | | | | | | | |
| | MCLMA | | | | | | | |
| | DMMB | | | | | | | |
| | BMA | | | | 27 | | | |
| | MAA | | | | 22 | | | |
| Sensitivity (mJ/cm$^2$) | | 5.9 | 8.4 | 6.8 | 6.5 | 7.3 | 7.5 | 8.4 |
| Resolution (μm) | | 0.13 | 0.14 | 0.14 | 0.16 | 0.13 | 0.15 | 0.15 |
| Line edge roughness (nm) | | 29 | 10 | 34 | 42 | 5 | 10 | 12 |
| Resist pattern shape | | ○ | X | X | X | X | X | ○ |
| Number of Microgels (the number) | Initial | 14 | 9 | 12 | 10 | <5 | 9 | 8 |
| | Increased | 20 | 8 | 340 | 11 | 6 | 260 | 94 |

The resist compositions, for which the polymers used for resists of the present invention (Examples 1 to 27) were used, had sufficient sensitivity and resolution, as well as excellent resist pattern. These resist compositions are also excellent in terms of line edge roughness, having a small degree of generation of microgels in a resist solution.

In contrast, the resist composition, for which the polymer of Comparative Example 1 containing no constitutional units having a cyano group was used, was inferior in terms of line edge roughness. In addition, a large degree of generation of microgels in the resist solution was observed.

The resist composition, for which the polymer of Comparative Example 2 containing no constitutional units having a cyano group was used, was inferior in terms of resist pattern shape.

The resist composition, for which the polymer of Comparative Example 3 containing no constitutional units having a cyano group was used, was inferior in terms of resist pattern shape and line edge roughness. In addition, a large degree of generation of microgels in the resist solution was observed.

The resist composition, for which the polymer of Comparative Example 4 containing no constitutional units having a lactone skeleton was used, was inferior in terms of resist pattern shape and line edge roughness.

The resist composition, for which the polymer of Comparative Example 5 containing a constitutional unit having a lactone skeleton that was different from the constitutional unit of the resist polymer of the present invention was used, was inferior in terms of resist pattern shape.

When Example 19 was compared with Reference Example 1 including a different constitutional unit having a lactone skeleton, the resist composition, for which the polymer obtained in Example 19 was used, was superior in terms of resist pattern shape. In addition, a small degree of generation of microgels was confirmed in the resist solution.

Moreover, when Example 23 was compared with Reference Example 2 of which the mass average molecular weight is different, in the case of the resist composition, for which the polymer obtained in Example 23 was used, a small degree of generation of microgels was confirmed in the resist solution.

Example 28

100 parts of the resist polymer obtained in Example 24 (copolymer A-24), 2 parts of p-methylphenyldiphenylsulfonium nonafluorobutanesulfonate used as a photoacid generator, 0.8 parts of tri(tert-butylphenyl)sulfonium trifluoromethanesulfonate, and 0.25 parts of triethanolamine used as a nitrogen-containing compound, were dissolved in 25 parts of γ-butyrolactone and 900 parts of a mixture consisting of propylene glycol monomethyl ether acetate and ethyl lactate (mass ratio: 8:2), so as to prepare a positive type resist composition solution.

Subsequently, an organic antireflection coating composition (manufactured by Brewer Science; product name: "ARC-29A") was applied onto a silicon wafer (diameter: 200 mm) using a spinner. It was then burned on a hot plate at 215° C. for 60 seconds and dried, so as to form an organic antireflection coating film having a film thickness of 77 nm.

The prepared solution of the positive resist composition was applied on the organic antireflection coating film using a spinner. It was then prebaked on a hot plate at 125° C. for 90 seconds and dried, so as to form a resist film having a film thickness of 250 nm. Subsequently, using an ArF exposure device (manufactured by Nikon Corp.; NSR-S302; NA (numerical aperture)=0.60, 2/3 annular), an ArF excimer laser (wavelength: 193 nm) was applied to the resist film via a mask pattern (binary). Thereafter, post exposure baking (PEB) was carried out at 125° C. for 90 seconds using a hot plate. Thereafter, puddle development was carried out at 23° C. for 30 seconds using 2.38% by mass of a tetramethylammonium hydroxide aqueous solution, and the resultant was then washed with pure water for 20 seconds. It was then dried, so as to form a resist pattern.

When the obtained 130-nm mask was exposed to a light with a light exposure (30 mJ/cm$^2$) necessary for transcription of the above mask into 130 nm, the resolving power of the line-and-space pattern and that of the trench pattern were 121 nm and 127 nm, respectively. Thus, both patterns have good shapes.

Moreover, the maximum and minimum sizes of the trench pattern formed on a wafer were measured. As a result, the sizes were found to be 128 nm and 125 nm, respectively. Thus, a difference between the values was extremely small.

A resist pattern (trench pattern) was formed in the same above manner with the exception that the PEB temperature was changed from 125° C. to 120° C. or to 130° C. The average size of the resist patterns formed at each PEB temperature was measured, and the amount of resist pattern size changed per unit temperature was then calculated from the above average size. As a result, it was found to be extremely small (1.0 nm/° C.).

Example 29

A resist pattern was formed in the same manner as in Example 28 with the exception that the resist polymer obtained in Example 25 (copolymer A-25) was used instead of the resist polymer obtained in Example 24 (copolymer A-24).

When the obtained 130-nm mask was exposed to a light with a light exposure (30 mJ/cm$^2$) necessary for transcription of the above mask into 130 nm, the resolving power of the line-and-space pattern and that of the trench pattern were 119 nm and 130 nm, respectively. Thus, both patterns have good forms.

Moreover, the maximum and minimum sizes of the trench pattern formed on a wafer were measured. As a result, the sizes were found to be 128 nm and 131 nm, respectively. Thus, a difference between the values was extremely small.

A resist pattern (trench pattern) was formed in the same above manner with the exception that the PEB temperature was changed from 125° C. to 120° C. or to 130° C. The average size of the resist patterns formed at each PEB temperature was measured, and the amount of resist pattern size changed per unit temperature was then calculated from the above average size. As a result, it was found to be extremely small (1.5 nm/° C.).

Example 30

A resist pattern was formed in the same manner as in Example 28 with the exception that the resist polymer obtained in Example 26 (copolymer A-26) was used instead of the resist polymer obtained in Example 24 (copolymer A-24).

When the obtained 130-nm mask was exposed to a light with a light exposure (30 mJ/cm$^2$) necessary for transcription of the above mask into 130 nm, the resolving power of the line-and-space pattern and that of the trench pattern were 123 nm and 130 nm, respectively. Thus, both patterns have good forms.

Moreover, the maximum and minimum sizes of the trench pattern formed on a wafer were measured. As a result, the sizes were found to be 131 nm and 128 nm, respectively. Thus, a difference between the values was extremely small.

A resist pattern (trench pattern) was formed in the same above manner with the exception that the PEB temperature was changed from 125° C. to 120° C. or to 130° C. The average size of the resist patterns formed at each PEB temperature was measured, and the amount of resist pattern size changed per unit temperature was then calculated from the above average size. As a result, it was found to be extremely small (1.8 nm/° C.).

The resist compositions (Examples 28 to 30), for which the resist polymers of the present invention were used, had sufficient sensitivity and resolution, and was excellent in terms of the shape of the formed resist pattern and the uniformity of the formed resist pattern in the wafer surface, having a small degree of PEB temperature dependence. The aforementioned excellent results were obtained on a substrate with a diameter of 200 mm. Accordingly, the resist compositions (Examples 28 to 30), for which the resist polymers of the present invention were used, can achieve a sufficiently uniform resist pattern size in plane even on a larger substrate with a diameter of 300 mm or greater, for example:

Comparative Example 6

A resist pattern was formed in the same manner as in Example 28 with the exceptions that a copolymer (mass average molecular weight (Mw): 8,800; and molecular weight distribution (Mw/Mn): 1.79) represented by formula (20-11) indicated below was used instead of the resist polymer obtained in Example 24 (copolymer A-24), and that the PEB temperature was changed from 125° C. to 130° C.

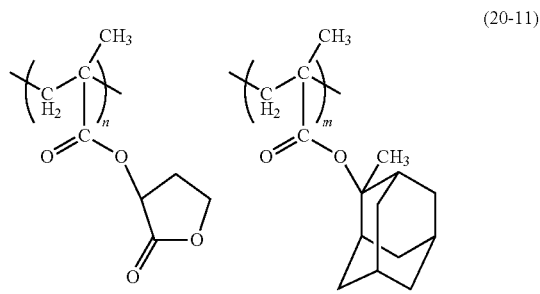

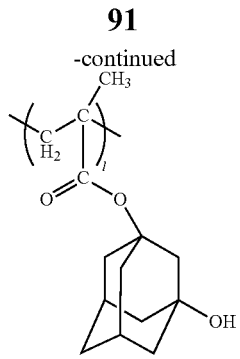

(wherein, in formula (20-11), n:m:l=40 mol %:40 mol %:20 mol %).

When the obtained 130-nm mask was exposed to a light with a light exposure (22 mJ/cm$^2$) necessary for transcription of the above mask into 130 nm, the resolving power of the line-and-space pattern and that of the trench pattern were 126 nm and 130 nm, respectively. Thus, both patterns have good forms. However, the sizes of resist patterns formed on a wafer varied more widely than those in Examples 28 to 30. Thus, the uniformity in the wafer surface was deteriorated.

A resist pattern (trench pattern) was formed in the same above manner with the exception that the PEB temperature was changed from 130° C. to 135° C. The average size of the resist patterns formed at the above PEB temperatures was obtained, and the amount of resist pattern size changed per unit temperature was then obtained from the above average size. As a result, it was found to be larger (5.2 nm/° C.) than those in Examples 28 to 30.

INDUSTRIAL APPLICABILITY

A resist composition, for which the resist polymer of the present invention is used, has high sensitivity and high resolution, and provides a good resist pattern shape, having a small degree of occurrence of line edge roughness and a small degree of generation of microgels. Thus, a high-precision fine resist pattern can stably be formed with the polymer of the present invention. Accordingly, a resist composition, for which the resist polymer of the present invention is used, can preferably be used in DUV excimer laser lithography or electron beam lithography, and particularly preferably in lithography using an ArF excimer laser (wavelength: 193 nm).

Moreover, a resist composition, for which the resist polymer of the present invention is used, can achieve a uniform resist pattern size in plane on a large substrate having a diameter of 300 mm or greater, for example, and the thus formed resist pattern has a small degree of PEB temperature dependence.

The invention claimed is:
1. A resist polymer, consisting essentially of constitutional units derived from (meth)acrylate monomers, wherein the constitutional units comprise:
   a constitutional unit of formula (1);
   a constitutional unit having an acid-dissociable group; and
   a constitutional unit having a lactone skeleton of at least one selected from the group consisting of formulas (4-1), (4-2), (4-3), (4-5), and (4-6):

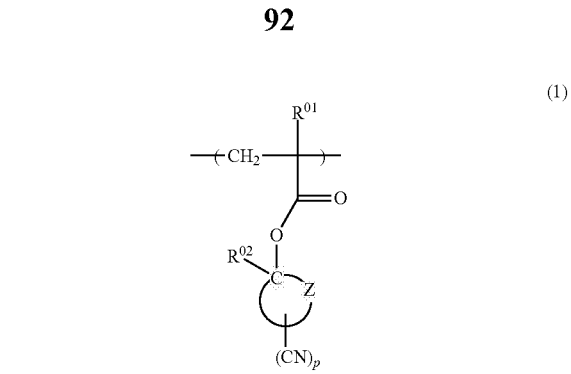

wherein, $R^{01}$ represents a hydrogen atom or a methyl group; $R^{02}$ represents a hydrogen atom; Z represents an atomic group that constitutes a bridged cyclic hydrocarbon group together with carbon atoms constituting an ester bond and a carbon atom to which cyano group binds; and p is 1,

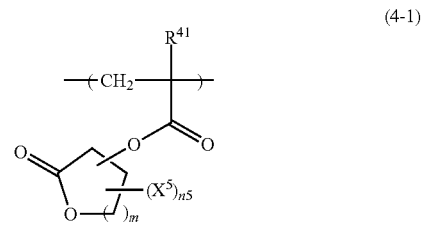

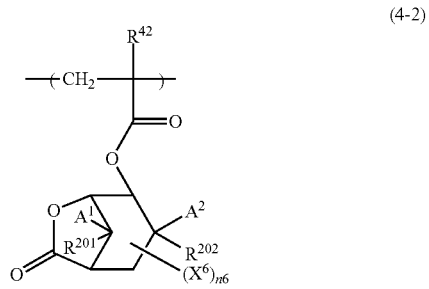

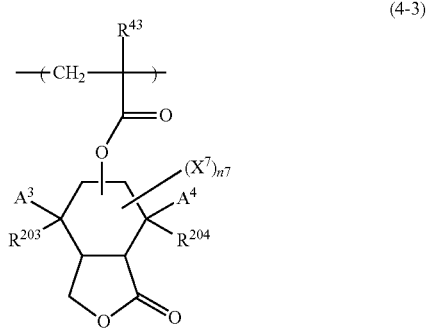

(4-5)

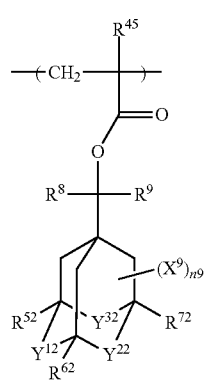

(4-6)

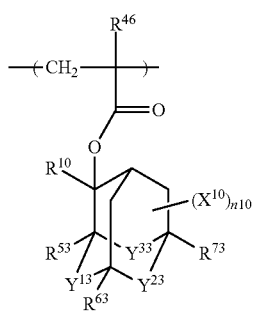

wherein, in formula (4-1),

R$^{41}$ represents a hydrogen atom or a methyl group; i is 0; X$^5$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n5 represents an integer between 0 and 4, and m represents 1 or 2, provided that when n5 is 2 or greater, X$^5$ may be a plurality of different groups, wherein, in formula (4-2), R$^{42}$ represents a hydrogen atom or a methyl group; each of R$^{201}$ and R$^{202}$ independently represents a hydrogen atom; each of A$^1$ and A$^2$ independently represents a hydrogen atom, a linear or branched alkyl group having 1 to 6 carbon atoms, a hydroxy group, a carboxy group, or a carboxy group esterified with alcohol having 1 to 6 carbon atoms, or A$^1$ and A$^2$ together represent —O—, —S—, —NH—, or a methylene chain having 1 to 6 carbon atoms {—(CH$_2$)$_k$— (wherein k represents an integer between 1 and 6)}; X$^6$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n6 represents an integer between 0 and 4, provided that when n6 is 2 or greater, X$^6$ may be a plurality of different groups, wherein, in formula (4-3), R$^{43}$ represents a hydrogen atom or a methyl group; each of R$^{203}$ and R$^{204}$ independently represents a hydrogen atom; each of A$^3$ and A$^4$ independently represents a hydrogen atom, a linear or branched alkyl group having 1 to 6 carbon atoms, a hydroxy group, a carboxy group, or a carboxy group that is esterified with alcohol having 1 to 6 carbon atoms, or A$^3$ and A$^4$ together represent —O—, —S—, —NH—, or a methylene chain having 1 to 6 carbon atoms {—(CH$_2$)$_l$— (wherein l represents an integer between 1 and 6)}; X$^7$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n7 represents an integer between 0 and 4, provided that when n7 is 2 or greater, X$^7$ may be a plurality of different groups, wherein, in formula (4-5), R$^{45}$ represents a hydrogen atom or a methyl group; each of R$^8$ and R$^9$ independently represents a hydrogen atom or a linear or branched alkyl group having 1 to 8 carbon atoms; each of R$^{52}$, R$^{62}$, and R$^{72}$ independently represents a hydrogen atom or a methyl group; each of Y$^{12}$ Y$^{22}$ and Y$^{32}$ independently represents —CH$_2$—or —CO—O—, and at least one of them represents —CO—O—; X$^9$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n9 represents an integer between 0 and 4, provided that when n9 is 2 or greater, X$^9$ may be a plurality of different groups, wherein, in formula (4-6), R$^{46}$ represents a hydrogen atom or a methyl group; R$^{10}$ represents a hydrogen atom or a linear or branched alkyl group having 1 to 8 carbon atoms; each of R$^{53}$, R$^{63}$, and R$^{73}$ independently represents a hydrogen atom or a methyl group; each of Y$^{13}$, Y$^{23}$, and Y$^{33}$ independently represents —CH$_2$—or —CO—O—, and at least one of them represents —CO—O—; X$^{10}$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n10 represents an integer between 0 and 4, provided that when n10 is 2 or greater, $X^{10}$ may be a plurality of different groups.

2. The resist polymer according to claim 1, wherein said bridged cyclic hydrocarbon group has a skeleton selected from the group consisting of a cyclic terpene hydrocarbon, an adamantane ring, a tetracyclododecane ring, a dicylclopentane ring, and a tricyclodecane ring.

3. The resist polymer according to claim 1, wherein the constitutional unit of formula (1) is a constitutional unit of formula (2):

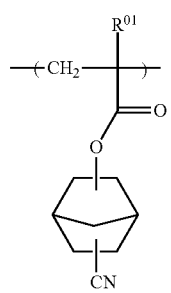

(2)

wherein, in formula (2), $R^{01}$ represents a hydrogen atom or a methyl group.

4. The resist polymer according to claim 1, wherein, in said formula (1),
a cyano group is bonded to a carbon atom that is adjacent to the ester carbon atom.

5. The resist polymer according to claim 1, wherein said constitutional unit having a lactone skeleton is at least one selected from the group consisting of formulas (4-1), (4-2), and (4-3).

6. The resist polymer according to claim 1, wherein a total ratio of the constitutional unit represented by said formula (1) is between 5% and 30% by mole,
a total ratio of the constitutional unit having an acid-dissociable group is between 30% and 60% by mole, and
a total ratio of the constitutional unit having a lactone skeleton is between 30% and 60% by mole.

7. The resist polymer according to claim 1, wherein said constitutional unit having an acid-dissociable group has an alicyclic skeleton.

8. The resist polymer according to claim 7, wherein said constitutional unit having an acid-dissociable group is at least one selected from the group consisting of formulas (3-1-1), (3-2-1), and (3-3-1):

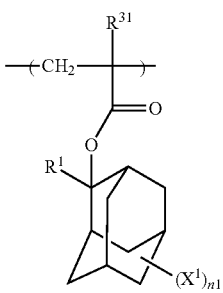

(3-1-1)

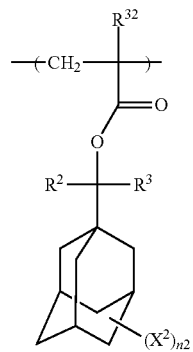

(3-2-1)

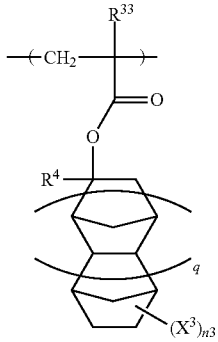

(3-3-1)

wherein, in formula (3-1-1),
$R^{31}$ represents a hydrogen atom or a methyl group; $R^1$ represents an alkyl group having 1 to 3 carbon atoms; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, wherein, in formula (3-2-1),
$R^{32}$ represents a hydrogen atom or a methyl group; each of $R^2$ and $R^3$ independently represents an alkyl group having 1 to 3 carbon atoms; $X^2$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n2 represents an integer between 0 and 4, and when n2 is 2 or greater, $X^2$ may be a plurality of different groups, and wherein, in formula (3-3-1), R$^{33}$ represents a hydrogen atom or a methyl group; R$^4$ represents an alkyl group having 1 to 3 carbon atoms; X$^3$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n3 represents an integer between 0 and 4, and q represents 0 or 1, provided that when n3 is 2 or greater, X$^3$ may be a plurality of different groups.

9. The resist polymer according to claim 1, wherein said constitutional unit having an acid-dissociable group is a constitutional unit of formula (3-5):

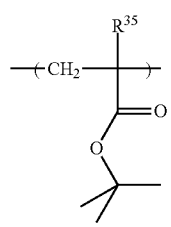

(3-5)

wherein, in formula (3-5), R$^{35}$ represents a hydrogen atom or a methyl group.

10. The resist polymer according to claim 1, wherein the constitutional units comprise:

at least one constitutional unit of formula (1);

at least one constitutional unit selected from the group consisting of formulas (3-1-1), (3-2-1), (3-3-1), and (3-5); and at least one constitutional unit selected from the group consisting of formulas (4-1), (4-2), (4-3), (4-5), and (4-6):

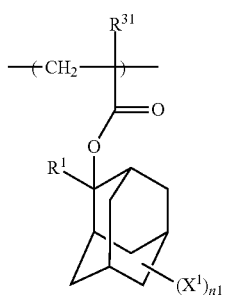

(3-1-1)

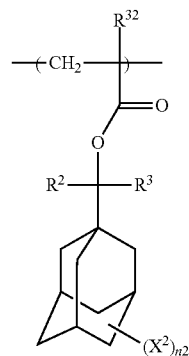

(3-2-1)

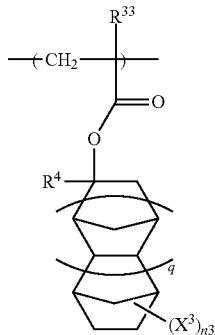

(3-3-1)

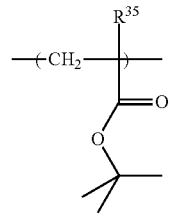

(3-5)

wherein, in formula (3-1-1),

R$^{31}$ represents a hydrogen atom or a methyl group; R$^1$ represents an alkyl group having 1 to 3 carbon atoms; X$^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, X$^1$ may be a plurality of different groups, wherein, in formula (3-2-1), R$^{32}$ represents a hydrogen atom or a methyl group; each of R$^2$ and R$^3$ independently represents an alkyl group having 1 to 3 carbon atoms; X$^2$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n2 represents an integer between 0 and 4, and when n2 is 2 or greater, $X^2$ may be a plurality of different groups, and wherein, in formula (3-3-1), $R^{33}$ represents a hydrogen atom or a methyl group; $R^4$ represents an alkyl group having 1 to 3 carbon atoms; $X^3$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n3 represents an integer between 0 and 4, and q represents 0 or 1, provided that when n3 is 2 or greater, $X^3$ may be a plurality of different groups, and wherein, in formula (3-5), $R^{35}$ represents a hydrogen atom or a methyl group.

11. The resist polymer according to claim 10, wherein the constitutional units comprise:

at least one constitutional unit of formula (1);

at least one constitutional unit selected from the group consisting of formulas (3-1-1), (3-2-1), (3-3-1), and (3-5); and at least one constitutional unit selected from the group consisting of formulas (4-1), (4-2), and (4-3).

12. The resist polymer according to claim 1, wherein the constitutional units comprise:

at least one constitutional unit of formula (2);

at least one constitutional unit selected from the group consisting of formulas (3-1-1), (3-3-1), and (3-5); and at least one constitutional unit of formula (4-7):

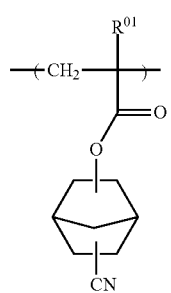

(2)

wherein in formula (2), $R^{01}$ represents a hydrogen atom or a methyl group;

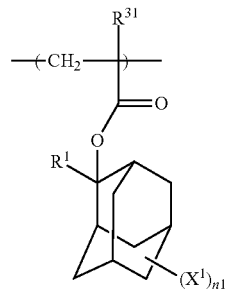

(3-1-1)

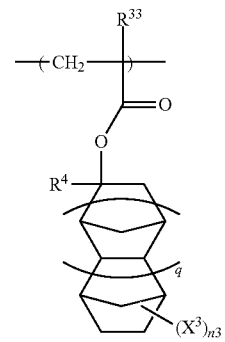

(3-3-1)

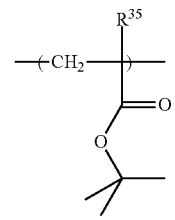

(3-5)

wherein, in formula (3-1-1), $R^{31}$ represents a hydrogen atom or a methyl group; $R^1$ represents an alkyl group having 1 to 3 carbon atoms; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, wherein, in formula (3-3-1), $R^{33}$ represents a hydrogen atom or a methyl group; $R^4$ represents an alkyl group having 1 to 3 carbon atoms; $X^3$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n3 represents an integer between 0 and 4, and q represents 0 or 1, provided that when n3 is 2 or greater, $X^3$ may be a plurality of different groups, wherein in formula (3-5), $R^{35}$ represents a hydrogen atom or a methyl group, and (4-7)

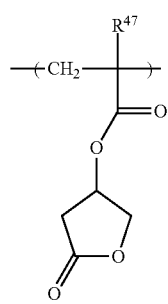

wherein, in formula (4-7), $R^{47}$ represents a hydrogen atom or a methyl group.

13. The resist polymer according to claim 12, wherein a total ratio of the at least one constitutional unit of formula (2) is between 5% and 30% by mole, a total ratio of the at least one constitutional unit selected from the group consisting of formulas (3-1-1), (3-3-1), and (3-5) is between 30% and 60% by mole, and a total ratio of the constitutional unit of formula (4-7) is between 30% and 60% by mole.

14. The resist polymer according to claim 1, wherein the constitutional units comprise:

at least one constitutional unit of formula (2);

at least one constitutional unit selected from the group consisting of formulas (3-1-1), (3-3-1), and (3-5), and at least one constitutional unit of formula (4-8):

(2)

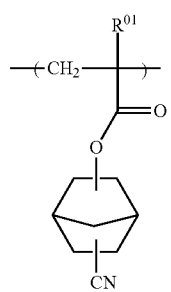

wherein in formula (2), $R^{01}$ represents a hydrogen atom or a methyl group;

(3-1-1)

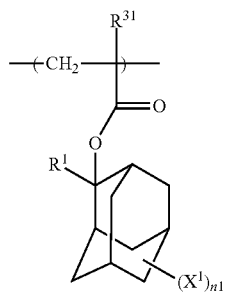

(3-3-1)

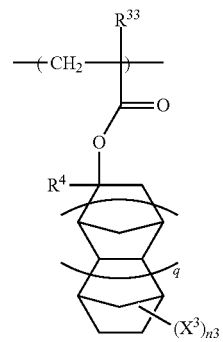

(3-5)

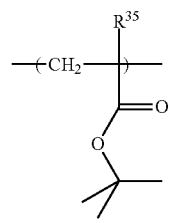

wherein, in formula (3-1-1), $R^{31}$ represents a hydrogen atom or a methyl group; $R^1$ represents an alkyl group having 1 to 3 carbon atoms; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, wherein, in formula (3-3-1), $R^{33}$ represents a hydrogen atom or a methyl group; $R^4$ represents an alkyl group having 1 to 3 carbon atoms; $X^3$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n3 represents an integer between 0 and 4, and q represents 0 or 1, provided that when n3 is 2 or greater, $X^3$ may be a plurality of different groups, wherein in formula (3-5), $R^{35}$ represents a hydrogen atom or a methyl group, and

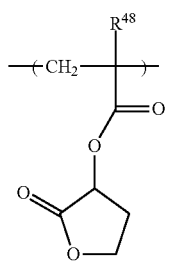
(4-8)

wherein, in formula (4-8), $R^{48}$ represents a hydrogen atom or a methyl group.

15. The resist polymer according to claim 14, wherein a total ratio of the at least one constitutional unit of formula (2) is between 5% and 30% by mole,
  a total ratio of at least one constitutional unit selected from the group consisting of formulas (3-1-1), (3-3-1), and (3-5) is between 30% and 60% by mole, and
  a total ratio of the constitutional unit of formula (4-8) is between 30% and 60% by mole.

16. The resist polymer according to claim 14, wherein the constitutional units comprise:
  at least one constitutional unit of formula (2);
  at least one constitutional unit of formula (3-1-1); and
  at least one constitutional unit of formula (4-8).

17. The resist polymer according to claim 16, wherein
  a total ratio of the constitutional unit of formula (2) is between 5% and 30% by mole,
  a total ratio of the constitutional unit of formula (3-1-1) is between 30% and 60% by mole, and
  a total ratio of the constitutional unit of formula (4-8) is between 30% and 60% by mole.

18. The resist polymer according to claim 1, wherein the constitutional units comprise:
  at least one constitutional unit of formula (2);
  at least one constitutional unit selected from the group consisting of formulas (3-1-1), (3-3-1), and (3-5); and
  at least one constitutional unit represented by formula (4-9):

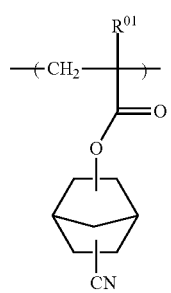
(2)

wherein in formula (2), $R^{01}$ represents a hydrogen atom or a methyl group;

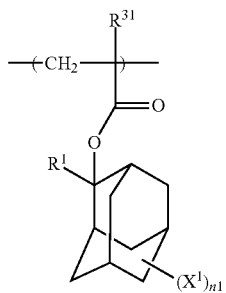
(3-1-1)

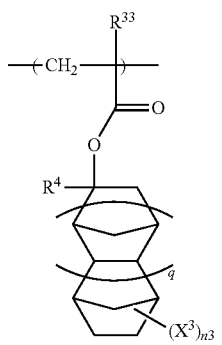
(3-3-1)

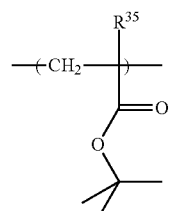
(3-5)

wherein, in formula (3-1-1), $R^{31}$ represents a hydrogen atom or a methyl group; $R^1$ represents an alkyl group having 1 to 3 carbon atoms; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, wherein, in formula (3-3-1), $R^{33}$ represents a hydrogen atom or a methyl group; $R^4$ represents an alkyl group having 1 to 3 carbon atoms; $X^3$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n3 represents an integer between 0 and 4, and q represents 0 or 1, provided that when n3 is 2 or greater, $X^3$ may be a plurality of different groups, wherein in formula (3-5), $R^{35}$ represents a hydrogen atom or a methyl group, and

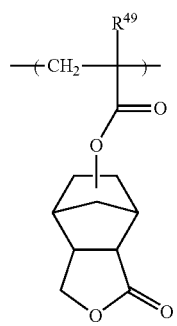
(4-9)

wherein, in formula (4-9), $R^{49}$ represents a hydrogen atom or a methyl group.

19. The resist polymer according to claim 18, wherein a total ratio of the at least one constitutional unit of formula (2) is between 5% and 30% by mole, a total ratio of the at least one constitutional unit selected from the group consisting of formulas (3-1-1), (3-3-1), and (3-5) is between 30% and 60% by mole, and a total ratio of the constitutional unit of formula (4-9) is between 30% and 60% by mole.

20. The resist polymer according to claim 1, wherein the constitutional units comprise:

at least one constitutional unit selected from the group consisting of formulas (2) and (1-1);

at least one constitutional unit selected from the group consisting of formulas (3-1-1), (3-3-1), and (3-5); and at least one constitutional unit selected from the group consisting of formulas (4-2) and (4-3):

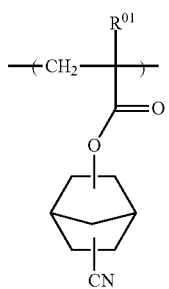
(2)

wherein in formula (2), $R^{01}$ represents a hydrogen atom or a methyl group;

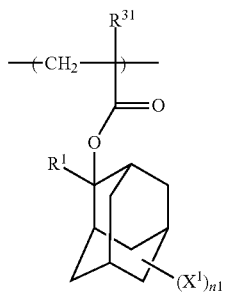
(3-1-1)

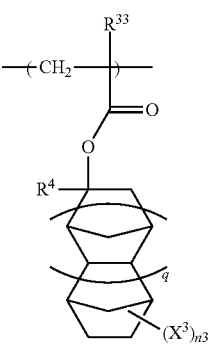
(3-3-1)

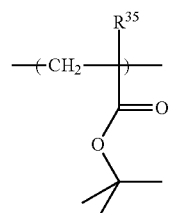
(3-5)

wherein, in formula (3-1-1), $R^{31}$ represents a hydrogen atom or a methyl group; $R^1$ represents an alkyl group having 1 to 3 carbon atoms; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, wherein, in formula (3-3-1), $R^{33}$ represents a hydrogen atom or a methyl group; $R^4$ represents an alkyl group having 1 to 3 carbon atoms; $X^3$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n3 represents an integer between 0 and 4, and q represents 0 or 1, provided that when n3 is 2 or greater, $X^3$ may be a plurality of different groups, wherein in formula (3-5), $R^{35}$ represents a hydrogen atom or a methyl group.

21. The resist polymer according to claim 20, wherein
a total ratio of the at least one constitutional unit of formula (2) is between 5% and 30% by mole,
a total ratio of the at least one constitutional unit selected from the group consisting of formulas (3-1-1), (3-3-1), and (3-5) is between 30% and 60% by mole, and
a total ratio of the at least one constitutional unit selected from the group consisting of formulas (4-2) and (4-3) is between 30% and 60% by mole.

22. The resist polymer according to claim 1, wherein the constitutional units comprise:
at least one constitutional unit of formula (1);
at least one constitutional unit selected from the group consisting of formulas (3-1-1), (3-2-1), and (3-3-1); and
at least one constitutional unit selected from the group consisting of formulas (4-7) and (4-8)

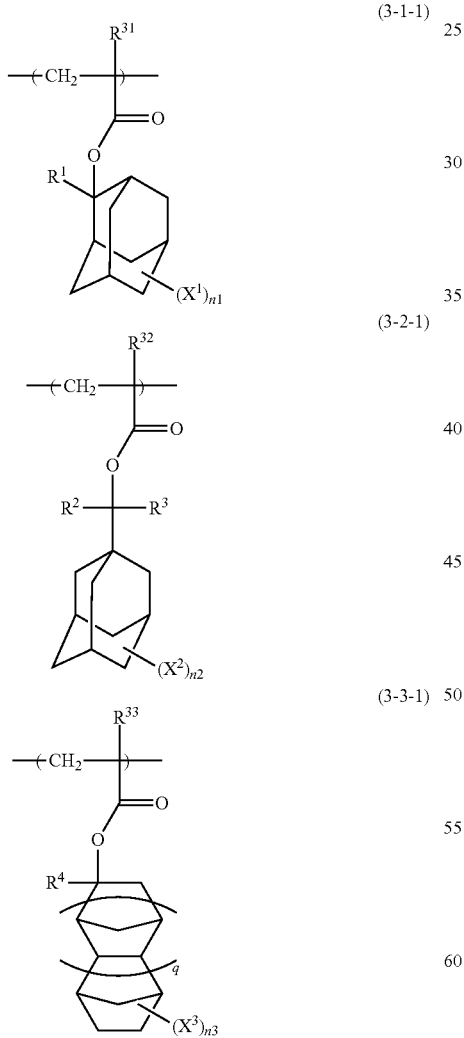

wherein, in formula (3-1-1),
$R^{31}$ represents a hydrogen atom or a methyl group; $R^1$ represents an alkyl group having 1 to 3 carbon atoms; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, wherein, in formula (3-2-1),
$R^{32}$ represents a hydrogen atom or a methyl group; each of $R^2$ and $R^3$ independently represents an alkyl group having 1 to 3 carbon atoms; $X^2$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n2 represents an integer between 0 and 4, and when n2 is 2 or greater, $X^2$ may be a plurality of different groups, wherein, in formula (3-3-1),
$R^{33}$ represents a hydrogen atom or a methyl group; $R^4$ represents an alkyl group having 1 to 3 carbon atoms; $X^3$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n3 represents an integer between 0 and 4, and q represents 0 or 1, provided that when n3 is 2 or greater, $X^3$ may be a plurality of different groups, and

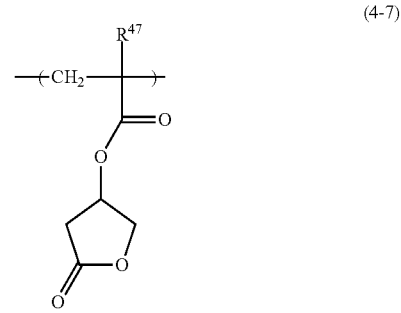

wherein, in formula (4-7), $R^{47}$ represents a hydrogen atom or a methyl group, and

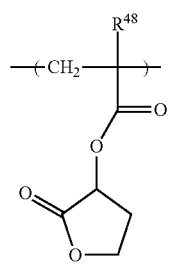

(4-8)

wherein, in formula (4-8), $R^{48}$ represents a hydrogen atom or a methyl group.

23. The resist polymer according to claim 22, wherein
a total ratio of the constitutional unit of formula (1) is between 5% and 30% by mole,
a total ratio of the at least one constitutional unit selected from the group consisting of formulas (3-1-1), (3-2-1), and (3-3-1) is between 30% and 60% by mole, and
a total ratio of the at least one constitutional unit selected from the group consisting of formulas (4-7) and (4-8) is between 30% and 60% by mole.

24. The resist polymer according to claim 1, wherein the constitutional units further comprise at least one constitutional unit selected from the group consisting of formulas (3-1-2) and (3-4):

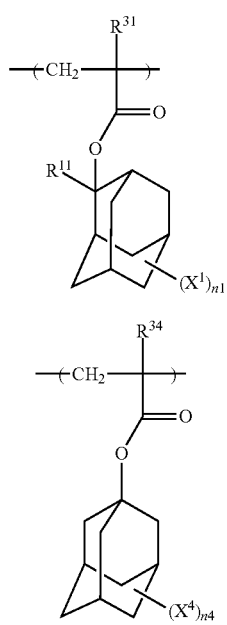

wherein, in formula (3-1-2),
$R^{31}$ represents a hydrogen atom or a methyl group; $R^{11}$ represents a hydrogen atom; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, a cyano group, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, and
wherein, in formula (3-4),
$R^{34}$ represents a hydrogen atom or a methyl group; $X^4$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n4 represents an integer between 0 and 4, and when n4 is 2 or greater, $X^4$ may be a plurality of different groups.

25. The resist polymer according to claim 1, which has a mass average molecular weight between 1,000 and 100,000.

26. The resist polymer according to claim 1, which is produced by carrying out polymerization, while adding dropwise to a polymerization reactor a solution containing monomers that become constitutional units of a polymer of interest as a result of the polymerization.

27. A resist composition, which comprises the resist polymer according to claim 1.

28. A method of producing a pattern, which comprises:
applying the resist composition according to claim 27 onto a substrate to be processed;
exposing the substrate to a light with a wavelength of 250 nm or shorter; and
developing the exposed resist composition with a developing solution.

29. The method of producing a pattern according to claim 28, wherein the light used for exposure is an ArF excimer laser.

30. A method of producing a pattern, which comprises:
applying the resist composition according to claim 27 onto a substrate to be processed,
exposing the substrate to an electron beam, and
developing the exposed resist composition with a developing solution.

31. A chemically amplified resist composition, which comprises the resist polymer according to claim 1 and a photoacid generator.

32. The chemically amplified resist composition according to claim 31, which further comprises a nitrogen-containing compound.

33. The resist polymer according to claim 1, which has a mass average molecular weight between 5,000 and 8,000.

34. A resist composition, which comprises the resist polymer according to claim 33.

35. A method of producing a pattern, which comprises:
applying the resist composition according to claim 34 onto a substrate to be processed;
exposing the substrate to a light with a wavelength of 250 nm or shorter; and
developing the exposed resist composition with a developing solution.

36. The method of producing a pattern according to claim 35, wherein the light used for exposure is an ArF excimer laser.

37. A method of producing a pattern, which comprises:
applying the resist composition according to claim 34 onto a substrate to be processed;
exposing the substrate to an electron beam; and
developing the exposed resist composition with a developing solution.

38. A chemically amplified resist composition, which comprises the resist polymer according to claim 33 and a photoacid generator.

39. The chemically amplified resist composition according to claim 38, which further comprises a nitrogen-containing compound.

40. A resist polymer consisting essentially of constitutional units derived from (meth)acrylate monomers, wherein the constitutional units comprise:
at least one constitutional unit of formula (2);
at least one constitutional unit selected from the group consisting of formulas (3-1-1), (3-3-1), and (3-5) ; and
at least one constitutional unit of formula (4- 11):

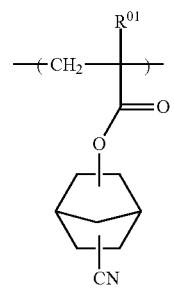

(2)

wherein in formula (2), $R^{01}$ represents a hydrogen atom or a methyl group;

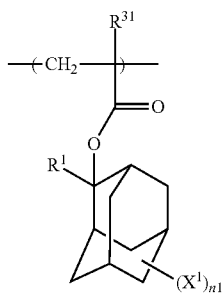

(3-1-1)

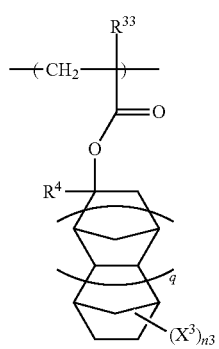

(3-3-1)

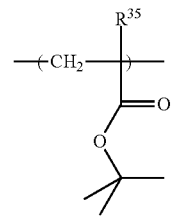

(3-5)

wherein, in formula (3-1-1),
$R^{31}$ represents a hydrogen atom or a methyl group; $R^1$ represents an alkyl group having 1 to 3 carbon atoms; $X^1$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n1 represents an integer between 0 and 4, and when n1 is 2 or greater, $X^1$ may be a plurality of different groups, wherein, in formula (3-3-1),
$R^{33}$ represents a hydrogen atom or a methyl group; $R^4$ represents an alkyl group having 1 to 3 carbon atoms; $X^3$ represents a linear or branched alkyl group having 1 to 6 carbon atoms that may have, as a substituent, at least one selected from the group consisting of a hydroxy group, a carboxy group, an acyl group having 1 to 6 carbon atoms, an alkoxy group having 1 to 6 carbon atoms, a carboxy group that is esterified with alcohol having 1 to 6 carbon atoms, and an amino group, a hydroxy group, a carboxy group, an acyl group having 1 to 6 carbon atoms, an alkoxy group having 1 to 6 carbon atoms, a carboxy group that is esterified with alcohol having 1 to 6 carbon atoms, or an amino group; and n3 represents an integer between 0 and 4, and q represents 0 or 1, provided that when n3 is 2 or greater, $X^3$ may be a plurality of different groups, wherein in formula (3-5),
$R^{35}$ represents a hydrogen atom or a methyl group, and

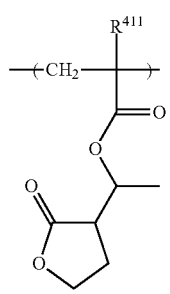

(4-11)

wherein, in formula (4-11), $R^{411}$ represents a hydrogen atom or a methyl group.

41. The resist polymer according to claim 40, wherein a total ratio of the at least one constitutional unit of formula (2) is between 5% and 30% by mole, a total ratio of the at least one constitutional unit selected from the group consisting of formulas (3-1-1), (3-3-1), and (3-5) is between 30% and 60% by mole, and a total ratio of the constitutional unit of formula (4-11) is between 30% and 60% by mole.

42. A resist composition, which comprises the resist polymer according to claim 40.

43. A chemically amplified resist composition, which comprises the resist polymer according to claim 40 and a photoacid generator.

44. The chemically amplified resist composition according to claim 43, which further comprises a nitrogen-containing compound.

45. A method of producing a pattern, which comprises:
applying the chemically amplified resist composition according to claim 43 onto a substrate to be processed;
exposing the substrate to a light with a wavelength of 250 nm or shorter; and
developing it with a developing solution.

46. The method of producing a pattern according to claim 45, wherein the light used for exposure is an ArF excimer laser.

47. A method of producing a pattern, which comprises:
applying the chemically amplified resist composition according to claim 43 onto a substrate to be processed;
exposing the substrate to an electron beam; and
developing it with a developing solution.

\* \* \* \* \*